US011102430B2

(12) United States Patent
Chen et al.

(10) Patent No.: US 11,102,430 B2
(45) Date of Patent: Aug. 24, 2021

(54) PIXEL SENSOR HAVING MULTIPLE PHOTODIODES

(71) Applicant: Facebook Technologies, LLC, Menlo Park, CA (US)

(72) Inventors: Song Chen, Redmond, WA (US); Xinqiao Liu, Medina, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/707,988

(22) Filed: Dec. 9, 2019

(65) Prior Publication Data
US 2020/0186731 A1 Jun. 11, 2020

Related U.S. Application Data

(60) Provisional application No. 62/777,692, filed on Dec. 10, 2018.

(51) Int. Cl.
*H04N 5/355* (2011.01)
*H04N 9/04* (2006.01)
(Continued)

(52) U.S. Cl.
CPC ....... *H04N 5/3559* (2013.01); *G02B 27/0176* (2013.01); *H01L 27/14645* (2013.01);
(Continued)

(58) Field of Classification Search
CPC .. H04N 5/347; H04N 5/3559; H04N 5/37455; H04N 5/37457; H04N 5/37452;
(Continued)

(56) References Cited

U.S. PATENT DOCUMENTS 4,596,977 A   6/1986 Bauman et al.
5,053,771 A   10/1991 McDermott
(Continued)

FOREIGN PATENT DOCUMENTS

DE   202016105510   10/2016
EP   0675345 A2    10/1995
(Continued)

OTHER PUBLICATIONS

International Application No. PCT/US2018/039350, International Preliminary Report on Patentability dated Jan. 9, 2020, 10 pages.
(Continued)

*Primary Examiner* — Antoinette T Spinks
(74) *Attorney, Agent, or Firm* — Kilpatrick Townsend & Stockton

(57) ABSTRACT

In one example, a pixel cell comprises a first photodiode to generate a first charge and a second photodiode to generate a second charge. The pixel cell may include a charge sensing unit shared between the first photodiode and the second photodiode. The charge sensing unit may include a charge storage device to temporarily store a charge and convert the charge to a voltage. The pixel cell may include a quantizer to quantize the voltage output by the charge sensing unit, and a memory to store the quantization output. Depending on an operation mode, the first charge and the second charge can be controlled to flow simultaneously to the charge sensing unit for read out, or can be controlled to flow separately to the charge sensing unit for read out. The pixel cell further includes a memory to store a quantization result of the first charge and the second charge.

20 Claims, 32 Drawing Sheets

(51) Int. Cl.
  *G02B 27/01* (2006.01)
  *H04N 5/3745* (2011.01)
  *H01L 27/146* (2006.01)
(52) U.S. Cl.
  CPC ......... *H04N 5/37455* (2013.01); *H04N 9/045* (2013.01); *G02B 2027/0178* (2013.01)
(58) Field of Classification Search
  CPC ............... H04N 5/3592; H04N 5/3591; H04N 9/04553; H04N 9/04563; H01L 27/14636
  See application file for complete search history.

(56) References Cited

U.S. PATENT DOCUMENTS

| | | |
|---|---|---|
| 6,522,395 B1 | 2/2003 | Bamji et al. |
| 6,529,241 B1 | 3/2003 | Clark |
| 7,659,772 B2 | 2/2010 | Nomura et al. |
| 7,719,589 B2 | 5/2010 | Turchetta et al. |
| 8,134,623 B2 | 3/2012 | Purcell et al. |
| 8,144,227 B2 | 3/2012 | Kobayashi |
| 8,369,458 B2 | 2/2013 | Wong et al. |
| 8,426,793 B1 | 4/2013 | Barrows |
| 8,754,798 B2 | 6/2014 | Lin |
| 8,773,562 B1 | 7/2014 | Fan |
| 8,779,346 B2 | 7/2014 | Fowler et al. |
| 8,946,610 B2 | 2/2015 | Iwabuchi et al. |
| 9,094,629 B2 | 7/2015 | Ishibashi |
| 9,185,273 B2 | 11/2015 | Beck et al. |
| 9,274,151 B2 | 3/2016 | Lee et al. |
| 9,332,200 B1 | 5/2016 | Hseih et al. |
| 9,343,497 B2 | 5/2016 | Cho |
| 9,363,454 B2 | 6/2016 | Ito et al. |
| 9,478,579 B2 | 10/2016 | Dai et al. |
| 9,497,396 B2 | 11/2016 | Choi |
| 9,531,990 B1 | 12/2016 | Wilkins et al. |
| 9,800,260 B1 | 10/2017 | Banerjee |
| 9,819,885 B2 | 11/2017 | Furukawa et al. |
| 9,909,922 B2 | 3/2018 | Schweickert et al. |
| 9,948,316 B1 | 4/2018 | Yun et al. |
| 9,967,496 B2 | 5/2018 | Ayers et al. |
| 10,003,759 B2 | 6/2018 | Fan |
| 10,015,416 B2 | 7/2018 | Borthakur et al. |
| 10,419,701 B2 | 9/2019 | Liu |
| 10,574,925 B2 | 2/2020 | Otaka |
| 10,598,546 B2 | 3/2020 | Liu |
| 10,608,101 B2 | 3/2020 | Liu |
| 10,686,996 B2 | 6/2020 | Liu |
| 10,812,742 B2 | 10/2020 | Chen et al. |
| 10,834,344 B2 | 11/2020 | Chen et al. |
| 10,897,586 B2 | 1/2021 | Liu et al. |
| 10,951,849 B2 | 3/2021 | Liu |
| 2002/0067303 A1 | 6/2002 | Lee et al. |
| 2003/0020100 A1 | 1/2003 | Guidash |
| 2003/0049925 A1 | 3/2003 | Layman et al. |
| 2004/0095495 A1 | 5/2004 | Inokuma et al. |
| 2004/0118994 A1 | 6/2004 | Mizuno |
| 2004/0251483 A1 | 12/2004 | Ko et al. |
| 2005/0057389 A1 | 3/2005 | Krymski |
| 2005/0104983 A1 | 5/2005 | Raynor |
| 2005/0280727 A1 | 12/2005 | Sato et al. |
| 2006/0023109 A1 | 2/2006 | Mabuchi et al. |
| 2006/0158541 A1 | 7/2006 | Ichikawa |
| 2007/0013983 A1 | 1/2007 | Kitamura et al. |
| 2007/0076481 A1 | 4/2007 | Tennant |
| 2007/0092244 A1 | 4/2007 | Pertsel et al. |
| 2007/0102740 A1 | 5/2007 | Ellis-Monaghan et al. |
| 2007/0131991 A1 | 6/2007 | Sugawa |
| 2007/0208526 A1 | 9/2007 | Staudt et al. |
| 2007/0222881 A1 | 9/2007 | Mentzer |
| 2008/0001065 A1 | 1/2008 | Ackland |
| 2008/0068478 A1 | 3/2008 | Watanabe |
| 2008/0088014 A1 | 4/2008 | Adkisson et al. |
| 2008/0191791 A1 | 8/2008 | Nomura et al. |
| 2008/0226183 A1 | 9/2008 | Lei et al. |
| 2009/0002528 A1 | 1/2009 | Manabe et al. |
| 2009/0091645 A1 | 4/2009 | Trimeche et al. |
| 2009/0128640 A1 | 5/2009 | Yumiki |
| 2009/0224139 A1 | 9/2009 | Buettgen et al. |
| 2009/0261235 A1 | 10/2009 | Lahav et al. |
| 2010/0013969 A1 | 1/2010 | Ui |
| 2010/0140732 A1 | 6/2010 | Eminoglu et al. |
| 2010/0232227 A1 | 9/2010 | Lee |
| 2010/0276572 A1 | 11/2010 | Iwabuchi et al. |
| 2011/0049589 A1 | 3/2011 | Chuang et al. |
| 2011/0122304 A1 | 5/2011 | Sedelnikov |
| 2011/0149116 A1 | 6/2011 | Kim |
| 2011/0254986 A1 | 10/2011 | Nishimura et al. |
| 2012/0039548 A1 | 2/2012 | Wang et al. |
| 2012/0068051 A1 | 3/2012 | Ahn et al. |
| 2012/0092677 A1 | 4/2012 | Suehira et al. |
| 2012/0127284 A1 | 5/2012 | Bar-Zeev et al. |
| 2012/0133807 A1 | 5/2012 | Wu et al. |
| 2012/0138775 A1 | 6/2012 | Cheon et al. |
| 2012/0153123 A1 | 6/2012 | Mao et al. |
| 2012/0188420 A1 | 7/2012 | Black et al. |
| 2012/0241591 A1 | 9/2012 | Wan et al. |
| 2012/0262616 A1 | 10/2012 | Sa et al. |
| 2012/0267511 A1 | 10/2012 | Kozlowski |
| 2012/0273654 A1 | 11/2012 | Hynecek et al. |
| 2013/0020466 A1 | 1/2013 | Ayers et al. |
| 2013/0056809 A1 | 3/2013 | Mao et al. |
| 2013/0057742 A1 | 3/2013 | Nakamura et al. |
| 2013/0082313 A1 | 4/2013 | Manabe |
| 2013/0113969 A1 | 5/2013 | Manabe et al. |
| 2013/0126710 A1 | 5/2013 | Kondo |
| 2013/0141619 A1 | 6/2013 | Lim et al. |
| 2013/0207219 A1 | 8/2013 | Ahn |
| 2013/0214371 A1 | 8/2013 | Asatsuma et al. |
| 2013/0229543 A1 | 9/2013 | Hashimoto et al. |
| 2013/0229560 A1 | 9/2013 | Kondo |
| 2013/0234029 A1 | 9/2013 | Bikumandla |
| 2013/0293752 A1 | 11/2013 | Peng et al. |
| 2013/0299674 A1 | 11/2013 | Fowler et al. |
| 2014/0021574 A1 | 1/2014 | Egawa |
| 2014/0042299 A1 | 2/2014 | Wan et al. |
| 2014/0042582 A1 | 2/2014 | Kondo |
| 2014/0085523 A1 | 3/2014 | Hynecek |
| 2014/0176770 A1 | 6/2014 | Kondo |
| 2014/0211052 A1 | 7/2014 | Choi |
| 2014/0232890 A1 | 8/2014 | Yoo et al. |
| 2014/0306276 A1 | 10/2014 | Yamaguchi |
| 2015/0083895 A1 | 3/2015 | Hashimoto et al. |
| 2015/0090863 A1 | 4/2015 | Mansoorian et al. |
| 2015/0172574 A1 | 6/2015 | Honda et al. |
| 2015/0189209 A1 | 7/2015 | Yang et al. |
| 2015/0208009 A1 | 7/2015 | Oh et al. |
| 2015/0229859 A1 | 8/2015 | Guidash et al. |
| 2015/0237274 A1 | 8/2015 | Yang et al. |
| 2015/0279884 A1 | 10/2015 | Kusumoto |
| 2015/0287766 A1 | 10/2015 | Kim et al. |
| 2015/0312502 A1 | 10/2015 | Borremans |
| 2015/0350582 A1 | 12/2015 | Korobov et al. |
| 2015/0358569 A1 | 12/2015 | Egawa |
| 2015/0358593 A1 | 12/2015 | Sato |
| 2015/0381907 A1 | 12/2015 | Boettiger et al. |
| 2016/0028974 A1 | 1/2016 | Guidash et al. |
| 2016/0028980 A1 | 1/2016 | Kameyama et al. |
| 2016/0037111 A1 | 2/2016 | Dai et al. |
| 2016/0088253 A1 | 3/2016 | Tezuka |
| 2016/0100115 A1 | 4/2016 | Kusano |
| 2016/0111457 A1 | 4/2016 | Sekine |
| 2016/0112626 A1 | 4/2016 | Shimada |
| 2016/0118992 A1 | 4/2016 | Milkov |
| 2016/0165160 A1 | 6/2016 | Hseih et al. |
| 2016/0204150 A1 | 7/2016 | Oh et al. |
| 2016/0240570 A1 | 8/2016 | Barna et al. |
| 2016/0249004 A1 | 8/2016 | Saeki et al. |
| 2016/0307945 A1 | 10/2016 | Madurawe |
| 2016/0337605 A1 | 11/2016 | Ito |
| 2016/0353045 A1 | 12/2016 | Kawahito et al. |
| 2016/0360127 A1 | 12/2016 | Dierickx et al. |
| 2017/0013215 A1 | 1/2017 | McCarten |
| 2017/0053962 A1 | 2/2017 | Oh et al. |

(56) References Cited

U.S. PATENT DOCUMENTS

| | | | |
|---|---|---|---|
| 2017/0062501 | A1 | 3/2017 | Velichko et al. |
| 2017/0069363 | A1 | 3/2017 | Baker |
| 2017/0099422 | A1 | 4/2017 | Goma et al. |
| 2017/0099446 | A1 | 4/2017 | Cremers et al. |
| 2017/0104021 | A1 | 4/2017 | Park et al. |
| 2017/0104946 | A1 | 4/2017 | Hong |
| 2017/0111600 | A1 | 4/2017 | Wang et al. |
| 2017/0141147 | A1 | 5/2017 | Raynor |
| 2017/0170223 | A1 | 6/2017 | Hynecek et al. |
| 2017/0207268 | A1 | 7/2017 | Kurokawa |
| 2017/0346579 | A1 | 11/2017 | Barghi |
| 2017/0359497 | A1 | 12/2017 | Mandelli et al. |
| 2017/0366766 | A1 | 12/2017 | Geurts et al. |
| 2018/0019269 | A1 | 1/2018 | Klipstein |
| 2018/0077368 | A1 | 3/2018 | Suzuki |
| 2018/0152650 | A1 | 5/2018 | Sakakibara et al. |
| 2018/0220093 | A1 | 8/2018 | Murao et al. |
| 2018/0376046 | A1 | 12/2018 | Liu |
| 2019/0052788 | A1 | 2/2019 | Liu |
| 2019/0056264 | A1 | 2/2019 | Liu |
| 2019/0057995 | A1 | 2/2019 | Liu |
| 2019/0058058 | A1 | 2/2019 | Liu |
| 2019/0104263 | A1 | 4/2019 | Ochiai et al. |
| 2019/0104265 | A1 | 4/2019 | Totsuka et al. |
| 2019/0141270 | A1 | 5/2019 | Otaka et al. |
| 2019/0157330 | A1 | 5/2019 | Sato et al. |
| 2019/0172868 | A1 | 6/2019 | Chen et al. |
| 2019/0335151 | A1 | 10/2019 | Rivard et al. |
| 2019/0348460 | A1 | 11/2019 | Chen et al. |
| 2019/0355782 | A1 | 11/2019 | Do et al. |
| 2019/0379827 | A1 | 12/2019 | Berkovich et al. |
| 2020/0007800 | A1 | 1/2020 | Berkovich et al. |
| 2020/0068189 | A1 | 2/2020 | Chen et al. |
| 2020/0374475 | A1 | 11/2020 | Fukuoka et al. |
| 2021/0099659 | A1* | 4/2021 | Miyauchi ........... H04N 5/37455 |

FOREIGN PATENT DOCUMENTS

| | | | |
|---|---|---|---|
| EP | 1681856 | | 7/2006 |
| EP | 1732134 | | 12/2006 |
| EP | 1746820 | A1 | 1/2007 |
| EP | 2063630 | | 5/2009 |
| EP | 2538664 | | 12/2012 |
| EP | 2833619 | | 2/2015 |
| EP | 3032822 | | 6/2016 |
| EP | 3258683 | | 12/2017 |
| EP | 3425352 | | 1/2019 |
| KR | 100574959 | | 4/2006 |
| KR | 20110050351 | | 5/2011 |
| KR | 20150095841 | | 8/2015 |
| KR | 20160008287 | | 1/2016 |
| WO | 2017058488 | | 4/2017 |
| WO | 2017069706 | | 4/2017 |
| WO | 2017169882 | | 10/2017 |
| WO | 2019168929 | | 9/2019 |

OTHER PUBLICATIONS

International Application No. PCT/US2019/025170, International Search Report and Written Opinion dated Jul. 9, 2019, 11 pages.
International Application No. PCT/US2019/047156, International Search Report and Written Opinion dated Oct. 23, 2019, 9 pages.
International Application No. PCT/US2019/048241, International Search Report and Written Opinion dated Jan. 28, 2020, 16 pages.
International Application No. PCT/US2019/065430, International Search Report and Written Opinion dated Mar. 6, 2020, 15 pages.
Tanner et al., Low-power Digital Image Sensor for Still Picture Image Acquisition, Visual Communications and Image Processing, vol. 4306, XP008014232, Jan. 22, 2001, pp. 358-365.
U.S. Appl. No. 15/668,241 , Advisory Action, dated Oct. 23, 2019, 5 pages.
U.S. Appl. No. 15/668,241 , Final Office Action, dated Jun. 17, 2019, 19 pages.
U.S. Appl. No. 15/668,241 , Non-Final Office Action, dated Dec. 21, 2018, 3 pages.
U.S. Appl. No. 15/668,241 , Notice of Allowance, dated Jun. 29, 2020, 8 pages.
U.S. Appl. No. 15/668,241 , Notice of Allowance, dated Mar. 5, 2020, 8 pages.
U.S. Appl. No. 15/668,241 , "Supplemental Notice of Allowability", dated Apr. 29, 2020, 5 pages.
U.S. Appl. No. 15/719,345 , Final Office Action, dated Apr. 29, 2020, 14 pages.
U.S. Appl. No. 15/719,345 , Non-Final Office Action, dated Nov. 25, 2019, 14 pages.
U.S. Appl. No. 15/719,345 , Notice of Allowance, dated Aug. 12, 2020, 11 pages.
U.S. Appl. No. 15/719,345 , Notice of Allowance, dated Sep. 3, 2020, 12 pages.
U.S. Appl. No. 15/801,216 , Advisory Action, dated Apr. 7, 2020, 3 pages.
U.S. Appl. No. 15/801,216 , Final Office Action, dated Dec. 26, 2019, 5 pages.
U.S. Appl. No. 15/801,216 , Non-Final Office Action, dated Jun. 27, 2019, 13 pages.
U.S. Appl. No. 15/801,216 , Notice of Allowance, dated Jun. 23, 2020, 5 pages.
U.S. Appl. No. 15/861,588 , Non-Final Office Action, dated Jul. 10, 2019, 11 pages.
U.S. Appl. No. 15/861,588 , Notice of Allowance, dated Nov. 26, 2019, 9 pages.
U.S. Appl. No. 15/876,061 , "Corrected Notice of Allowability", dated Apr. 28, 2020, 3 pages.
U.S. Appl. No. 15/876,061 , Non-Final Office Action, dated Sep. 18, 2019, 23 pages.
U.S. Appl. No. 15/876,061 , "Notice of Allowability", dated May 6, 2020, 2 pages.
U.S. Appl. No. 15/876,061 , Notice of Allowance, dated Feb. 4, 2020, 13 pages.
U.S. Appl. No. 15/983,379 , Notice of Allowance, dated Oct. 18, 2019, 9 pages.
U.S. Appl. No. 15/983,391 , Non-Final Office Action, dated Aug. 29, 2019, 12 pages.
U.S. Appl. No. 15/983,391 , Notice of Allowance, dated Apr. 8, 2020, 8 pages.
U.S. Appl. No. 16/177,971 , Final Office Action, dated Feb. 27, 2020, 9 pages.
U.S. Appl. No. 16/177,971 , Non-Final Office Action, dated Sep. 25, 2019, 9 pages.
U.S. Appl. No. 16/177,971 , Notice of Allowance, dated Apr. 24, 2020, 6 pages.
U.S. Appl. No. 16/210,748 , Final Office Action, dated Jul. 7, 2020, 11 pages.
U.S. Appl. No. 16/210,748 , Non-Final Office Action, dated Jan. 31, 2020, 11 pages.
U.S. Appl. No. 16/249,420 , Non-Final Office Action, dated Jul. 22, 2020, 9 pages.
U.S. Appl. No. 16/286,355 , Non-Final Office Action, dated Oct. 1, 2019, 6 pages.
U.S. Appl. No. 16/286,355 , Notice of Allowance, dated Feb. 12, 2020, 7 pages.
U.S. Appl. No. 16/286,355 , Notice of Allowance, dated Jun. 4, 2020, 7 pages.
U.S. Appl. No. 16/369,763 , Non-Final Office Action, dated Jul. 22, 2020, 15 pages.
U.S. Appl. No. 16/382,015 , Notice of Allowance, dated Jun. 11, 2020, 11 pages.
U.S. Appl. No. 16/384,720 , Non-Final Office Action, dated May 1, 2020, 6 pages.
U.S. Appl. No. 16/431,693 , Non-Final Office Action, dated Jan. 30, 2020, 6 pages.
U.S. Appl. No. 16/431,693 , Notice of Allowance, dated Jun. 24, 2020, 7 pages.
U.S. Appl. No. 16/435,449 , Notice of Allowance, dated Jul. 27, 2020, 8 pages.

(56) References Cited

OTHER PUBLICATIONS

U.S. Appl. No. 16/436,049, Non-Final Office Action, dated Jun. 30, 2020, 11 pages.
U.S. Appl. No. 16/436,049, Non-Final Office Action, dated Mar. 4, 2020, 9 pages.
U.S. Appl. No. 16/454,787, Notice of Allowance, dated Apr. 22, 2020, 10 pages.
U.S. Appl. No. 16/454,787, Notice of Allowance, dated Jul. 9, 2020, 9 pages.
U.S. Appl. No. 16/566,583, Final Office Action, dated Apr. 15, 2020, 24 pages.
U.S. Appl. No. 16/566,583, Non-Final Office Action, dated Oct. 1, 2019, 10 pages.
U.S. Appl. No. 16/566,583, Non-Final Office Action, dated Jul. 27, 2020, 11 pages.
Application No. EP18188684.7, Extended European Search Report, dated Jan. 16, 2019, 10 pages.
Application No. EP18188684.7, Office Action, dated Nov. 26, 2019, 9 pages.
Application No. EP18188962.7, Extended European Search Report, dated Oct. 23, 2018, 8 pages.
Application No. EP18188962.7, Office Action, dated Aug. 28, 2019, 6 pages.
Application No. EP18188968.4, Extended European Search Report, dated Oct. 23, 2018, 8 pages.
Application No. EP18188968.4, Office Action, dated Aug. 14, 2019, 5 pages.
Application No. EP18189100.3, Extended European Search Report, dated Oct. 9, 2018, 8 pages.
Application No. PCT/US2018/045661, International Search Report and Written Opinion, dated Nov. 30, 2018, 11 Pages.
Application No. PCT/US2018/045666, International Preliminary Report on Patentability, dated Feb. 27, 2020, 11 pages.
Application No. PCT/US2018/045666, International Search Report and Written Opinion, dated Dec. 3, 2018, 13 pages.
Application No. PCT/US2018/045673, International Search Report and Written Opinion, dated Dec. 4, 2018, 13 pages.
Application No. PCT/US2018/046131, International Search Report and Written Opinion, dated Dec. 3, 2018, 10 pages.
Application No. PCT/US2018/064181, International Preliminary Report on Patentability, dated Jun. 18, 2020, 9 pages.
Application No. PCT/US2019/019756, International Search Report and Written Opinion, dated Jun. 13, 2019, 11 pages.
Application No. PCT/US2019/027727, International Search Report and Written Opinion, dated Jun. 27, 2019, 11 pages.
Application No. PCT/US2019/027729, International Search Report and Written Opinion, dated Jun. 27, 2019, 10 pages.
Application No. PCT/US2019/031521, International Search Report and Written Opinion, dated Jul. 11, 2019, 11 pages.
Application No. PCT/US2019/035724, International Search Report and Written Opinion, dated Sep. 10, 2019, 12 pages.
Application No. PCT/US2019/036484, International Search Report and Written Opinion, dated Sep. 19, 2019, 10 pages.
Application No. PCT/US2019/036492, International Search Report and Written Opinion, dated Sep. 25, 2019, 9 pages.
Application No. PCT/US2019/036536, International Search Report and Written Opinion, dated Sep. 26, 2019, 14 pages.
Application No. PCT/US2019/036575, International Search Report and Written Opinion, dated Sep. 30, 2019, 16 pages.
Application No. PCT/US2019/039410, International Search Report and Written Opinion, dated Sep. 30, 2019, 11 pages.
Application No. PCT/US2019/039758, International Search Report and Written Opinion, dated Oct. 11, 2019, 13 pages.
Application No. PCT/US2019/049756, International Search Report and Written Opinion, dated Dec. 16, 2019, 8 pages.
Application No. PCT/US2019/059754, International Search Report and Written Opinion, dated Mar. 24, 2020, 15 pages.
Snoeij, "A Low Power Column-Parallel 12-Bit ADC for CMOS Imagers", Institute of Electrical and Electronics Engineers Workshop on Charge-Coupled Devices and Advanced Image Sensors, Jun. 2005, pp. 169-172.
Xu et al., "A New Digital-Pixel Architecture for CMOS Image Sensor with Pixel-Level ADC and Pulse Width Modulation using a 0.18 Mu M CMOS Technology", Institute of Electrical and Electronics Engineers Conference on Electron Devices and Solid-State Circuits, Dec. 16-18, 2003, pp. 265-268.
U.S. Appl. No. 15/847,517, "Non-Final Office Action", dated Nov. 23, 2018, 21 pages.
U.S. Appl. No. 15/847,517, "Notice of Allowance", dated May 1, 2019, 11 pages.
U.S. Appl. No. 15/927,896, "Non-Final Office Action", dated May 1, 2019, 10 pages.
Cho, et al., "A Low Power Dual CDS for a Column-Parallel CMOS Image Sensor", Journal of Semiconductor Technology and Science, vol. 12, No. 4, Dec. 30, 2012, pp. 388-396.
EP18179838.0, "Extended European Search Report", dated May 24, 2019, 17 pages.
EP18179838.0, "Partial European Search Report", dated Dec. 5, 2018, 14 pages.
EP18179846.3, "Extended European Search Report", dated Dec. 7, 2018, 10 pages.
EP18179851.3, "Extended European Search Report", dated Dec. 7, 2018, 8 pages.
Kavusi, et al., "Quantitative Study of High-Dynamic-Range Image Sensor Architectures", Proceedings of SPIE, The International Society for Optical Engineering, vol. 5301, XP055186908, Jun. 7, 2004, pp. 264-275.
PCT/US2018/039350, "International Search Report and Written Opinion", dated Nov. 15, 2018, 13 pages.
PCT/US2018/039352, "International Search Report and Written Opinion", dated Oct. 26, 2018, 10 pages.
PCT/US2018/039431, "International Search Report and Written Opinion", dated Nov. 7, 2018, 14 pages.
PCT/US2018/064181, "International Search Report and Written Opinion", dated Mar. 29, 2019, 12 pages.
PCT/US2019/014044, "International Search Report and Written Opinion", dated May 8, 2019, 11 pages.
U.S. Appl. No. 16/435,451, "Non-Final Office Action", dated Feb. 1, 2021, 14 pages.
U.S. Appl. No. 16/566,583, "Corrected Notice of Allowability", dated Feb. 3, 2021, 2 pages.
U.S. Appl. No. 16/896,130, "Non-Final Office Action", dated Mar. 15, 2021, 16 pages.
U.S. Appl. No. 16/436,137, "Non-Final Office Action", dated Dec. 4, 2020, 12 pages.
U.S. Appl. No. 16/566,583, "Corrected Notice of Allowability", dated Dec. 11, 2020, 2 pages.
Non-Final Office Action for U.S. Appl. No. 17/072,840, dated Jun. 8, 2021, 7 pages.
Non-Final Office Action for U.S. Appl. No. 16/820,594, dated Jul. 2, 2021, 8 pages.
Notice of Allowance for U.S. Appl. No. 17/150,925, dated Jul. 8, 2021, 10 pages.

* cited by examiner

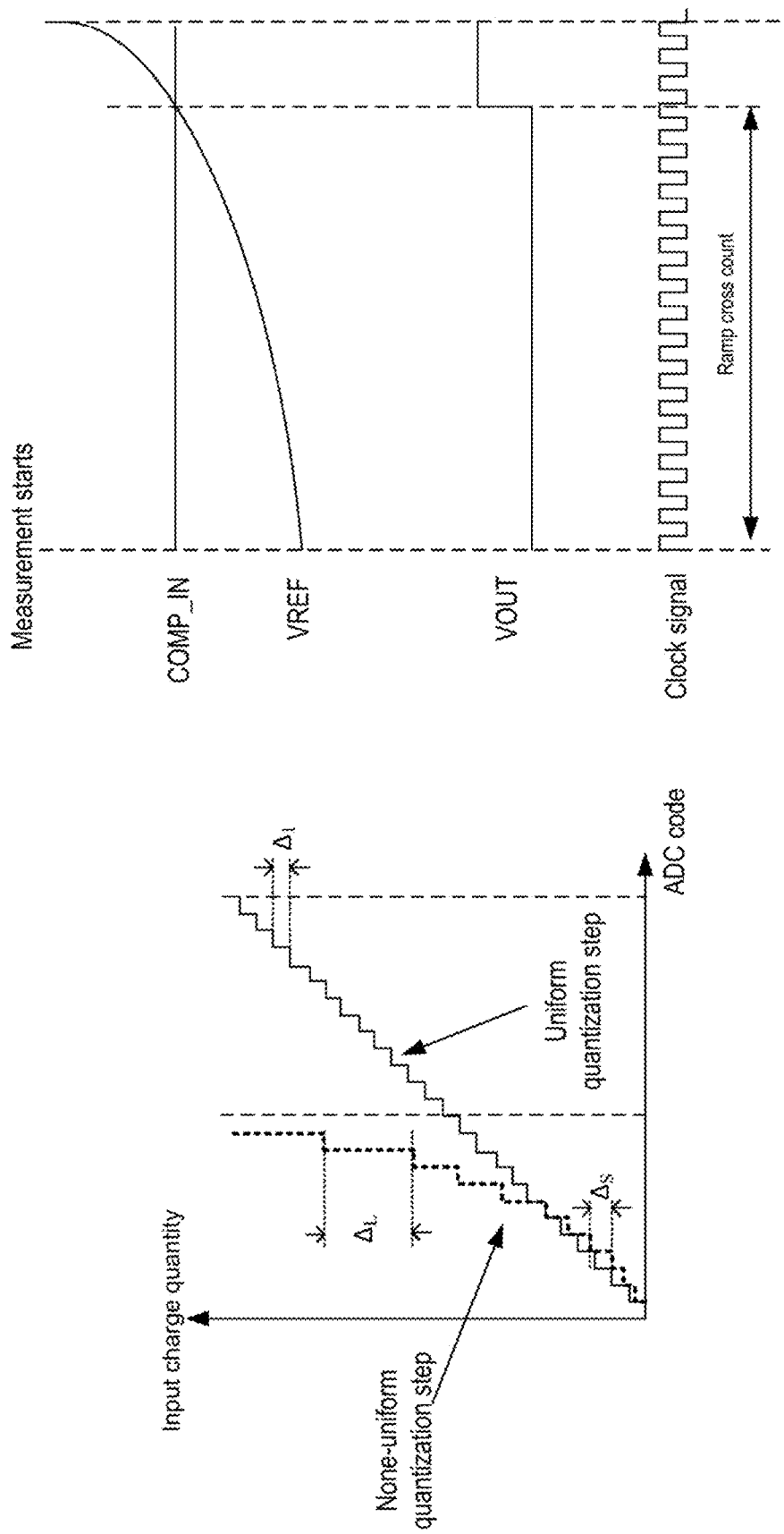

| | T0 | T1 | T2 | T3 | T4 | T5 |
|---|---|---|---|---|---|---|
| 1350 → | | TTS PD1 | FD ADC/PD ADC PD1 | PD ADC/FD ADC PD1 | PD1 reset | |
| | | PD2 accumulates residual charge | | PD ADC PD2 | PD2 reset | |
| | | PD3 accumulates residual charge, charge sensing unit 1302b stores overflow charge from PD3 | | | FD ADC/PD ADC PD3 | PD ADC/FD ADC PD3 | PD3 reset |

Determine, based on whether a first charge from a first photodiode and a second charge from a second photodiode are to flow simultaneously to a charge sensing unit within an exposure period or are to flow to the charge sensing unit at different times, first bias signals for a first charge transfer transistor and a first charge draining transistor, and second bias signals for the second charge transfer transistor and the second charge draining transistor ~1502

Supply the first bias signals to the first charge transfer transistor and the first charge draining transistor, and the second bias signals to the second charge transfer transistor and the second charge draining transistor, to control directions of flow of the first charge and the second charge with respect to the charge sensing unit within the exposure period ~1504

FIG. 15

PIXEL SENSOR HAVING MULTIPLE PHOTODIODES

RELATED APPLICATION

This patent application claims priority to U.S. Provisional Patent Application Ser. No. 62/777,692, filed Dec. 10, 2018, entitled "Digital Pixel Sensor with Multiple Photodiodes," and which is assigned to the assignee hereof and is incorporated herein by reference in its entirety for all purposes.

BACKGROUND

The disclosure relates generally to image sensors, and more specifically to pixel cell structure including interfacing circuitries for determining light intensity for image generation.

A typical pixel in an image sensor includes a photodiode to sense incident light by converting photons into charge (e.g., electrons or holes). The incident light can include components of different wavelength ranges for different applications, such as 2D and 3D sensing. Moreover, to reduce image distortion, a global shutter operation can be performed in which each photodiode of the array of photodiodes senses the incident light simultaneously in a global exposure period to generate the charge. The charge can be converted by a charge sensing unit (e.g., a floating diffusion) to convert to a voltage. The array of pixel cells can measure different components of the incident light based on the voltages converted by the charge sensing unit and provide the measurement results for generation of 2D and 3D images of a scene.

SUMMARY

The present disclosure relates to image sensors. More specifically, and without limitation, this disclosure relates to a pixel cell. This disclosure also relates to operating the circuitries of pixel cells to generate a digital representation of the intensity of incident light.

In one example, an apparatus comprises: a first photodiode, a second photodiode, a charge sensing unit, a first charge draining transistor coupled between the first photodiode and a first charge sink, a second charge draining transistor coupled between the second photodiode and a second charge sink, a first charge transfer transistor coupled between the first photodiode and the charge sensing unit, a second charge transfer transistor coupled between the second photodiode and the charge sensing unit, and a controller. The controller is configured to: determine, based on whether a first charge from the first photodiode and a second charge from the second photodiode are to flow simultaneously to the charge sensing unit within an exposure period or are to flow to the charge sensing unit at different times, first bias signals for the first charge transfer transistor and the first charge draining transistor, and second bias signals for the second charge transfer transistor and the second charge draining transistor; and supply the first bias signals to the first charge transfer transistor and the first charge draining transistor, and the second bias signals to the second charge transfer transistor and the second charge draining transistor, to control directions of flow of the first charge and the second charge with respect to the charge sensing unit within the exposure period.

In some aspects, the first charge comprises a first overflow charge output by the first photodiode in response to light within the exposure period after the first photodiode is saturated by a first residual charge. The second charge comprises a second overflow charge output by the second photodiode in response to light within the exposure period after the second photodiode is saturated by a second residual charge.

In some aspects, the first overflow charge is not to be combined with the second overflow charge. The controller is configured to, within the exposure period, supply the first bias signals to the first charge draining transistor and the first charge transfer transistor, and supply the second bias signals to the second charge draining transistor and the second charge transfer transistor, to enable the first overflow charge to flow to the charge sensing unit and to enable the second overflow charge to flow to the second charge sink.

In some aspects, the charge sensing unit comprises a charge storage device to convert a charge to a voltage. The apparatus further comprises a quantizer. The controller is configured to, after the exposure period: obtain, from the charge sensing unit, a first voltage related to a quantity of the first overflow charge; control the quantizer to quantize a magnitude of the first voltage to generate a first quantization output; supply third bias signals to the first charge draining transistor and the first charge transfer transistor to transfer the first residual charge to the charge sensing unit; obtain, from the charge sensing unit, a second voltage related to a quantity of the first residual charge; control the quantizer to quantize a magnitude of the second voltage to generate a second quantization output; supply fourth bias signals to the second charge draining transistor and the second transistor to transfer the second residual charge to the charge sensing unit; obtain, from the charge sensing unit, a third voltage related to a quantity of the second residual charge; and control the quantizer to quantize a magnitude of the third voltage to generate third quantization output. One of the first quantization output or the second quantization output is selected to represent an intensity of incident light sensed by the first photodiode. The third quantization output is output to represent an intensity of the incident light sensed by the second photodiode.

In some aspects, the controller is configured to control the quantizer to, within the exposure period, measure a time when the first voltage reaches a saturation threshold of the charge storage device of the charge sensing unit to generate a fourth quantization output. One of the first quantization output, the second quantization output, or the fourth quantization output is selected to represent an intensity of the incident light sensed by the first photodiode.

In some aspects, the first overflow charge is to be combined with the second overflow charge. the controller is configured to, within the exposure period, supply the first bias signals to the first charge draining transistor and the first charge transfer transistor, and supply the second bias signals to the second charge draining transistor and the second charge transfer transistor, to enable both the first overflow charge and the second charge to flow to the charge sensing unit.

In some aspects, the charge sensing unit comprises a charge storage unit to convert a charge to a voltage. The apparatus further comprises a quantizer. The controller is configured to, after the exposure period: obtain, from the charge sensing unit, a first voltage related to a combined quantity the first overflow charge and the second overflow charge; control the quantizer to quantize a magnitude of the first voltage to generate a first quantization output; supply third bias signals to the first charge draining transistor and the first charge transfer transistor, and to the second charge draining transistor and the second charge transfer transistor, to transfer the first residual charge and the second residual charge to the charge sensing unit; obtain, from the charge sensing unit, a second voltage related to a combined quantity of the first residual charge and the second residual charge; and control the quantizer to quantize a magnitude of the second voltage to generate a second quantization output. One of the first quantization output or the second quantization output is output to represent an intensity of incident light received by both the first photodiode and the second photodiode.

In some aspects, the first photodiode is configured to sense a visible component and an infra-red component of the incident light. The second photodiode is configured to sense the infra-red component of the incident light.

In some aspects, the first bias signals are configured to set a first potential difference between a channel region of the first charge draining transistor and a channel region of the first charge transfer transistor to control a direction of flow of the first charge. The second bias signals are configured to set a second potential difference between a channel region of the second charge draining transistor and a channel region of the second charge transfer transistor to control a direction of flow of the second charge.

In some aspects, the channel region of the first charge draining transistor includes a different doping profile from the channel region of the first charge transfer transistor to create the first potential difference. The channel region of the second charge draining transistor includes a different doping profile from the channel region of the second charge transfer transistor to create the second potential difference.

In some aspects, the first bias signals include a first bias voltage for the first charge draining transistor and a second bias voltage different from the first bias voltage for the first charge transfer transistor. The second bias signals include a third bias voltage for the second charge draining transistor and a fourth bias voltage different from the third bias voltage for the second charge transfer transistor.

In some aspects, the charge sensing unit is a first charge sensing unit. The apparatus further comprises: a second charge sensing unit, a third photodiode, a third charge draining transistor coupled between the third photodiode and a third charge sink, and a third charge transfer transistor coupled between the third photodiode and the second charge sensing unit. The first charge sensing unit includes one or more first charge storage devices having a first capacitance. The second charge sensing unit includes one or more second charge storage devices having a second capacitance.

In some aspects, the first charge sensing unit includes a first floating drain, a capacitor, and a capacitor switch controllable to connect the floating drain in parallel with the capacitor or to disconnect the capacitor from the floating drain to set the first capacitance. The second charge sensing unit includes a second floating drain having the second capacitance.

In some aspects, the charge sensing unit is a first charge sensing unit. The apparatus further comprises: a second charge sensing unit, a third photodiode, a quantizer coupled with the first charge sensing unit and the second charge sensing unit, and a memory. The controller is configured to: control the quantizer to quantize an output of the first charge sensing unit to generate a first quantization output; store the first quantization output at the memory; after the first quantization output is read from the memory by a host device, control the quantizer to quantize an output of the second charge sensing unit to generate a second quantization output; and store the second quantization output at the memory in place of the first quantization output.

In some aspects, the apparatus further comprises a sampling switch and a sampling capacitor. The controller is configured to: enable the sampling switch to enable the sampling capacitor to track the output of the first charge sensing unit; control the quantizer to quantize an output of the sampling capacitor to generate the first quantization output; reset the sampling capacitor; enable the sampling switch to enable the sampling capacitor to sample the output of the second charge sensing unit; disable the sampling switch to enable the sample capacitor to hold the sampled output of the second charge sensing unit; and control the quantizer to quantize the sampled output of the second charge sensing unit at the sampling capacitor to generate the second quantization output.

In some aspects, the first photodiode and the second photodiode form a stack along a first axis perpendicular to a light incident surface of the apparatus via which the first photodiode and the second photodiode receives the incident light.

In some aspects, the first photodiode and the second photodiode are arranged sideway along a second axis parallel with a light incident surface of the apparatus via which the first photodiode and the second photodiode receives the incident light. The apparatus further includes: a first optical element over the first photodiode to set a first frequency range of the incident light to be sensed by the first photodiode; and a second optical element over the second photodiode to set a second frequency range of the incident light to be sensed by the second photodiode.

In some examples, a method is provided. The method comprises: determining, based on whether a first charge from a first photodiode and a second charge from a second photodiode are to flow simultaneously to a charge sensing unit within an exposure period or are to flow to the charge sensing unit at different times, first bias signals for a first charge transfer transistor and a first charge draining transistor, and second bias signals for a second charge transfer transistor and a second charge draining transistor; and supplying the first bias signals to the first charge transfer transistor and the first charge draining transistor, and the second bias signals to the second charge transfer transistor and the second charge draining transistor, to control directions of flow of the first charge and the second charge with respect to the charge sensing unit within the exposure period.

In some aspects, the first photodiode senses a visible component and an infra-red component of incident light. The second photodiode senses the infra-red component of the incident light. The method further comprises supplying the first bias signals to the first charge transfer transistor and the first charge draining transistor, and the second bias signals to the second charge transfer transistor and the second charge draining transistor, to enable the first charge and the second charge to flow to the charge sensing unit simultaneously within the exposure period.

In some aspects, the charge sensing unit is a first charge sensing unit. The method further comprises: controlling a quantizer to quantize an output of the first charge sensing unit to generate a first quantization output; storing the first quantization output at a memory; controlling a sampling capacitor to sample and hold an output of a second charge sensing unit; after the first quantization output is read from the memory by a host device, controlling the quantizer to quantize the sampled output of the second charge sensing unit at the sampling capacitor to generate a second quantization output; and storing the second quantization output at the memory in place of the first quantization output.

BRIEF DESCRIPTION OF THE DRAWINGS

Illustrative examples are described with reference to the following figures.

FIGS. 11A, 11B, 11C, and 11D illustrate techniques for performing quantization.

FIGS. 13A, 13B, 13C, 13D, 13E, 13F, and 13G illustrate examples of a pixel cell and their operations.

FIG. 15 illustrates a flowchart of an example process for measuring light intensity.

Figure 1A:
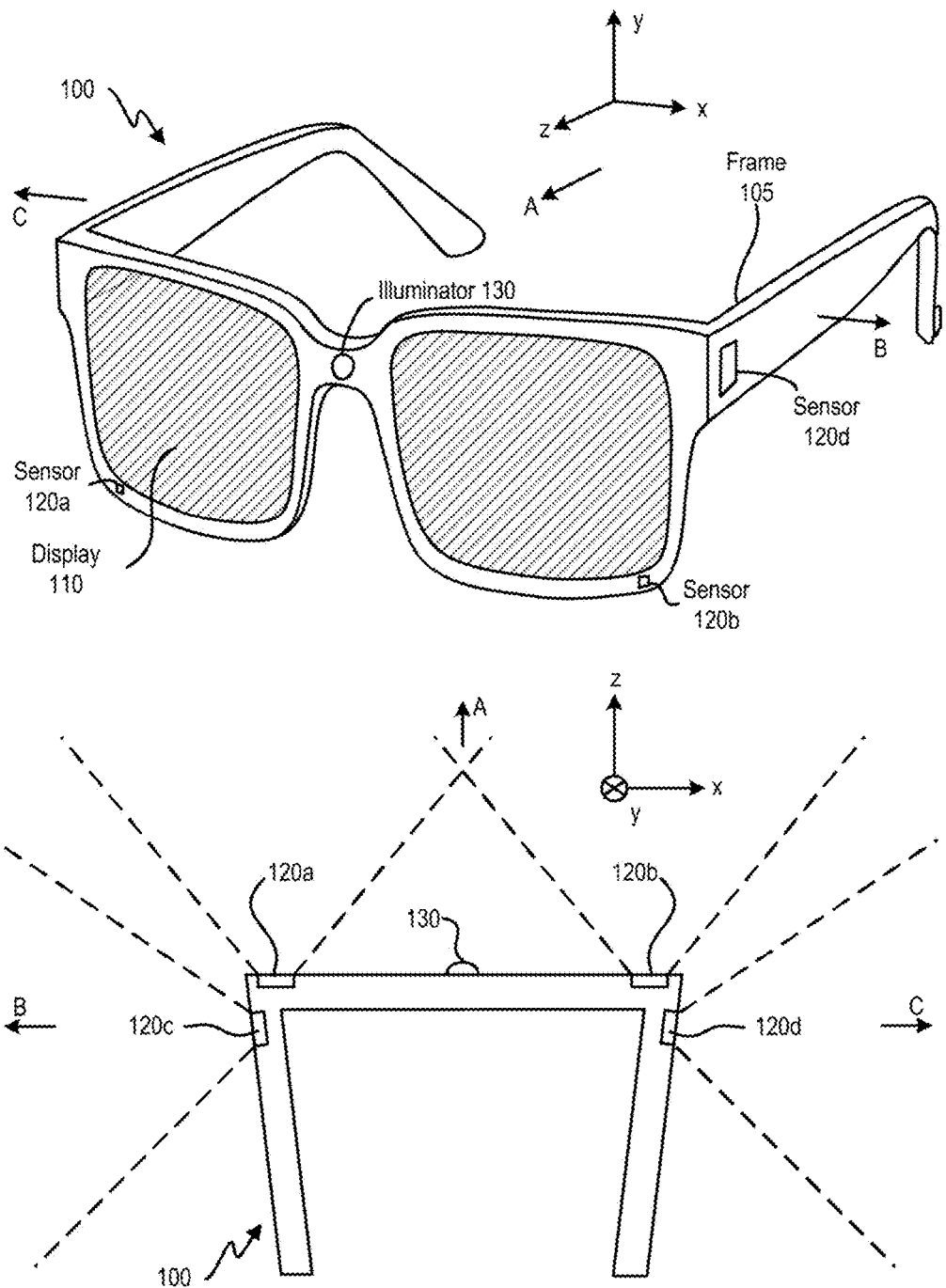
FIGS. 1A and 1B are diagrams of an example of a near-eye display.

The figures depict examples of the present disclosure for purposes of illustration only. One skilled in the art will readily recognize from the following description that alternative examples of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive examples. However, it will be apparent that various examples may be practiced without these specific details. The figures and description are not intended to be restrictive.

A typical image sensor includes an array of pixel cells. Each pixel cell includes a photodiode to measure the intensity incident light by converting photons into charge (e.g., electrons or holes). The charge generated by the photodiode can be converted to a voltage by a charge sensing unit, which can include a floating drain node. The voltage can be quantized by an analog-to-digital converter (ADC) into a digital value. The digital value can represent an intensity of light received by the pixel cell and can form a pixel, which can correspond to light received from a spot of a scene. An image comprising an array of pixels can be derived from the digital outputs of the array of pixel cells.

An image sensor can be used to perform different modes of imaging, such as 2D and 3D sensing. The 2D and 3D sensing can be performed based on light of different wavelength ranges. For example, visible light can be used for 2D sensing, whereas invisible light (e.g., infra-red light) can be used for 3D sensing. An image sensor may include an optical filter array to allow visible light of different optical wavelength ranges and colors (e.g., red, green, blue, monochrome, etc.) to a first set of pixel cells assigned for 2D sensing, and invisible light to a second set of pixel cells assigned for 3D sensing.

To perform 2D sensing, a photodiode at a pixel cell can generate charge at a rate that is proportional to an intensity of visible light component (e.g., red, green, blue, monochrome, etc.) incident upon the pixel cell, and the quantity of charge accumulated in an exposure period can be used to represent the intensity of visible light (or a certain color component of the visible light). The charge can be stored temporarily at the photodiode and then transferred to a capacitor (e.g., a floating diffusion) to develop a voltage. The voltage can be sampled and quantized by an analog-to-digital converter (ADC) to generate an output corresponding to the intensity of visible light. An image pixel value can be generated based on the outputs from multiple pixel cells configured to sense different color components of the visible light (e.g., red, green, and blue colors).

Moreover, to perform 3D sensing, light of a different wavelength range (e.g., infra-red light) can be projected onto an object, and the reflected light can be detected by the pixel cells. The light can include structured light, light pulses, etc. The pixel cells outputs can be used to perform depth sensing operations based on, for example, detecting patterns of the reflected structured light, measuring a time-of-flight of the light pulse, etc. To detect patterns of the reflected structured light, a distribution of quantities of charge generated by the pixel cells during the exposure time can be determined, and pixel values can be generated based on the voltages corresponding to the quantities of charge. For time-of-flight measurement, the timing of generation of the charge at the photodiodes of the pixel cells can be determined to represent the times when the reflected light pulses are received at the pixel cells. Time differences between when the light pulses are projected to the object and when the reflected light pulses are received at the pixel cells can be used to provide the time-of-flight measurement.

A pixel cell array can be used to generate information of a scene. In some examples, each pixel cell (or at least some of the pixel cells) of the pixel cell array can be used to perform collocated 2D and 3D sensing at the same time. For example, a pixel cell may include multiple photodiodes each configured to convert a different spectral component of light to charge. For 2D sensing, a photodiode can be configured to convert visible light (e.g., monochrome, or for a color of a particular frequency range) to charge, whereas another photodiode can be configured to convert infra-red light to charge for 3D sensing. Having the same set of pixel cells to perform sensing of different spectral components of light can facilitate the correspondence between 2D and 3D images of different spectral components of light generated by the pixel cells. Moreover, given that every pixel cell of a pixel cell array can be used to generate the image, the full spatial resolution of the pixel cell array can be utilized for the imaging.

The 2D and 3D imaging data can be fused for various applications that provide virtual-reality (VR), augmented-reality (AR) and/or mixed reality (MR) experiences. For example, a wearable VR/AR/MR system may perform a scene reconstruction of an environment in which the user of the system is located. Based on the reconstructed scene, the VR/AR/MR can generate display effects to provide an interactive experience. To reconstruct a scene, the 3D image data can be used to determine the distances between physical objects in the scene and the user. Moreover, 2D image data can capture visual attributes including textures, colors, and reflectivity of these physical objects. The 2D and 3D image data of the scene can then be merged to create, for example, a 3D model of the scene including the visual attributes of the objects. As another example, a wearable VR/AR/MR system can also perform a head tracking operation based on a fusion of 2D and 3D image data. For example, based on the 2D image data, the VR/AR/AR system can extract certain image features to identify an object. Based on the 3D image data, the VR/AR/AR system can track a location of the identified object relative to the wearable device worn by the user. The VR/AR/AR system can track the head movement based on, for example, tracking the change in the location of the identified object relative to the wearable device as the user's head moves.

One major challenge of including multiple photodiodes in a pixel cell is how to reduce the size and power consumption of the pixel cell, which can impact a number of pixel cells that can be fit into a pixel cell array. The number of pixel cells in a pixel cell array can dominate the available resolution of the imaging. Specifically, in addition to the photodiodes, a pixel cell may include processing circuits to support measurement of the charge generated by each photodiode and to support the generation of a pixel value based on the measurements. Each of these components typically has considerable footprints and consumes a considerable amount of power. For example, a pixel cell may include a charge sensing unit, which includes one or more charge storage devices (e.g., a floating drain node, a capacitor, etc.) to store the charge generated by a photodiode and to convert the charge to a voltage, and a buffer to buffer the voltage. A pixel cell may also include a quantizer to quantize the voltage to a digital value, and a memory to store the digital value. All these components, especially the capacitor, the quantizer, and the buffer, typically have large footprints which can dominate the size of the pixel cell. In addition, circuit components such as quantizer (which typically includes an analog comparator), buffer, and memory also consume a lot of power. In a case where a photodiode includes multiple photodiodes, if a separate set of processing circuits including a charge sensing unit, a quantizer, and a memory is provided for each photodiode, both the footprint and the power consumption of the pixel cell can be substantially increased, which may render the pixel cells unsuitable for applications where space and power are at a premium, such as applications at mobile devices and wearable devices.

The present disclosure relates to an image sensor that can address at least some of the issues above. The image sensor may include an array of pixel cells. Each pixel cell may include a plurality of photodiodes including a first photodiode to generate a first charge and a second photodiode to generate a second charge. The pixel cell may include a charge sensing unit shared between the first photodiode and the second photodiode. The charge sensing unit may include a charge storage device (e.g., a floating drain node, a capacitor, etc.) to temporarily store a charge and convert the charge to a voltage. The pixel cell may include a quantizer to quantize the voltage output by the charge sensing unit, and a memory to store the quantization output. Depending on an operation mode, the first charge and the second charge can be controlled to flow simultaneously to the charge sensing unit for read out, or can be controlled to flow separately to the charge sensing unit for read out. The memory can store a quantization result of the combined first charge and the second charge, or quantization results of the first charge and of the second charge at different times.

Specifically, to control the direction of flow of the first charge and the second charge, the pixel cell may include a first charge transfer transistor coupled between the first photodiode and the charge sensing unit, a second charge transfer transistor coupled between the second photodiode and the charge sensing unit, a first charge draining transistor coupled between the first photodiode and a first charge sink, and a second charge draining transistor coupled between the second photodiode and a second charge sink. The pixel cell may further include a controller to generate first bias signals for the first charge transfer transistor and the first Charge draining transistor, and second bias signals for the second charge transfer transistor and the second charge draining transistor. The bias signals can control a potential difference between the channel regions of each pair of charge draining transistor and charge transfer transistor to control a direction of flow of charge between the charge draining transistor and the charge transfer transistor.

Each photodiode of a pixel cell can be configured to sense a frequency component of incident light within an exposure period and can generate a quantity of charge within the exposure period, with the quantity of charge representing the an intensity of the frequency component of the incident light being sensed. Each photodiode also has a quantum well to store at least some of the charge as residual charge. For a low light intensity range, the photodiode can store the entirety of the charge as residual charge in the quantum well. For a medium light intensity range, the quantum well can be saturated by the residual charge, and the photodiode can output the remaining charge as overflow charge. For a high light intensity range, the charge storage device in charge sensing unit can be saturated by the overflow charge. The quantizer can perform multi-stage quantization operations for each of the low, medium, and high intensity ranges to generate pixel values each representing an intensity of a frequency component of the incident light.

Depending on the operation mode with respect to the first photodiode and the second photodiode, the controller can control the read out of the first charge and the second charge generated by the first photodiode and the second photodiode, via the first bias signals and the second bias signals, and control the quantizer to perform one or more quantization operations on the first charge and the second charge. Specifically, in a first operation mode, the controller can generate the first bias signals and the second bias signals to separately read out the first charge and the second charge. In the first operation mode, the first bias signals and the second bias signals can enable the first photodiode and the second photodiode to accumulate residual charge. The first and second bias signals also set potential differences of different directions between the pair of first charge draining transistor and first charge transfer transistor and the pair of second charge draining transistor and second charge transfer transistor, to ensure that overflow charge generated by the two photodiodes do not mix. For example, the first bias signals can create a first potential difference between the first charge draining transistor and the first charge transfer transistor to move a first overflow charge from the first photodiode to the charge sensing unit for storage, whereas the second bias signals can create a second potential difference between the second charge draining transistor and the second transistor to move a second overflow charge from the second photodiode to the second charge sink.

In the first operation mode, the controller can perform different quantization operations on the first charge and the second charge. For example, within the exposure period for the first photodiode, the quantizer can perform a time-to-saturation (TTS) measurement operation to determine whether the first overflow charge saturates the charge sensing unit and if does, the time-of-saturation, which can be inversely proportional to the intensity of the frequency component sensed by the first photodiode. The TTS operation can be targeted at the high light intensity. After the exposure period ends for the first photodiode, the controller can perform a FD ADC measurement in which the quantizer measures a quantity of the first overflow charge stored in the charge sensing unit. The FD ADC operation can be targeted at the medium light intensity. The controller can also apply third bias signals to transfer a first residual charge from the first photodiode to the charge sensing unit, and then perform a PD ADC measurement in which the quantizer measures a quantity of the first residual charge. The PD ADC operation can be targeted at the low light intensity. The memory can store an output of one of the TTS, PD ADC, or FD ADC measurements.

During the quantization operations of the first charge, the exposure time for the second photodiode can continue in which the second photodiode continue to accumulate residual charge. If the second photodiode saturates and generates a second overflow charge, the second overflow charge can flow to the second charge sink under the second bias signals and do not mix with the first overflow charge (if any) stored in the charge sensing unit. After the measurement output of the first photodiode has been read out from the memory, the controller can supply the third bias signals to the second charge draining transistor and the second charge transfer transistor to move the second residual charge to the charge sensing unit for read out, perform the PD ADC operation on the second residual charge, and store the PD ADC output of the second residual charge at the memory.

On the other hand, in a second operation mode, the controller can generate the first bias signals and the second bias signals to combine the first charge and the second charge and to read out the combined charge. The second operation mode can provide a charge binning operation. In a case where the first photodiode senses monochrome and infra-red (IR) light, whereas the second photodiode senses only infra-red (IR) light, the second operation mode can support an IR-assisted stereo. In the second operation mode, the first bias signals and the second bias signals can be identical to allow both the first photodiode and the second photodiode to accumulate residual charge, and to allow the overflow charge from both photodiodes to flow to the charge sensing unit for read out. Within the same exposure period, the controller can perform TTS operation on the combined overflow charge in the charge sensing unit. After the exposure period ends, the controller can perform FD ADC operation on the combined overflow charge. The controller can also supply third bias signals to both pairs of charge draining transistor and charge transfer transistor to transfer the residual charge from each photodiode to the charge sensing unit, and perform PD ADC operation on the combined residual charge.

Various techniques are proposed to create a potential difference between the channel regions of a pair of charge draining transistor and charge transfer transistor. In one example, different gate voltages can be applied to the charge draining transistor and to the charge transfer transistor to create different channel potentials at the transistors, which can result in the potential difference. The different gate voltages can be supplied directly by the controller, or generated through other techniques (e.g., based on different routing distances of the gate voltages). In another example, the charge draining transistor and the charge transfer transistor can have different doping profiles, different substrate bias voltages, etc., which can create different built-in potentials between the transistors such that even a same gate voltage applied to the charge draining transistor and the charge transfer transistor can create different channel potentials at the transistors.

In some examples, the pixel cell may include a third photodiode and a second charge sensing unit coupled between the third photodiode and the quantizer, in addition to the charge sensing unit ("first charge sensing unit") coupled with the first photodiode and the second photodiode. The third photodiode can be detect a different frequency component of incident light (e.g., one of red, green, or blue visible light) than the frequency components detected by the first photodiode (e.g., monochrome and IR) and by the second photodiode (e.g., IR). The second charge sensing unit can store a third overflow charge from the third photodiode which allows the controller to perform a FD ADC operation on the third overflow charge for a medium intensity range, in addition to a PD ADC operation on the third residual charge of the third photodiode for a low intensity range. The controller can control the quantizer to perform the FD ADC and PD ADC operations for the third photodiode and store the quantization output of the third photodiode at the memory, after the quantization outputs of the first photodiode and the second photodiode have been read out from the memory.

Before the quantization operations of the third photodiode starts, the third overflow charge may need to be stored in the floating drain of the second charge sensing unit for an extended period of time, which includes the time for the quantization operations of the first photodiode and the second photodiode, as well as the read and write operations for the quantization outputs of the first photodiode and the second photodiode at the memory. The read operation at the memory is typically performed by a host device external to the pixel cell array and typically takes a long period of time compared with the quantization operations. As the third overflow charge is stored in the floating drain for an extended period of time before the quantization operations, the floating drain may receive dark current and accumulate substantial dark charge, which can contaminate the third overflow charge accumulated at the floating drain.

In some examples, to reduce the effect of dark charge, the pixel cell may include a sampling switch and a sampling capacitor coupled between the charge sensing units and the quantizer. During the quantization operations of the first photodiode and the second photodiode, the sampling switch can be enabled to sample the output of the first sensing unit using the sampling capacitor. After the quantization operations of the first photodiode and the second photodiode completes, the sampling switch can be enabled to sample the output of the second sensing unit which can represent the third overflow charge and/or the third residual charge. The sampling switch can then be disabled to disconnect the sampling capacitor from the floating drain during the read operation of the memory prior to the quantization of the third overflow charge, to prevent the dark current at the floating drain from flowing into the sampling capacitor during the read operation. After the read operation completes, the controller can perform FD ADC operation and the PD ADC operation to measure the third residual charge and the third overflow charge.

The plurality of photodiodes can be arranged to perform collocated sensing of different frequency components of incident light from the same spot. In one example, the photodiodes can be arranged to form a stack along a first axis perpendicular to a light receiving surface of the image sensor through which the photodiodes receive incident light, such that each photodiode is separated from the light receiving surface by a different distance. The different propagation distance of incident light allows different frequency components of the light to be absorbed as the light propagates through the stack, which allows each photodiode to sense different components of the incident light. In another example, the photodiodes can be arranged sideway along a second axis parallel to the light receiving surface. Optical elements, such as optical filters, can be superimposed on the light receiving surface to select the frequency component of the incident light to be sensed by each photodiode.

With examples of the present disclosure, a pixel cell can perform collocated imaging for different components of incident light, which can facilitate correspondence between images of different components generated by the pixel cells and can improve fusion of 2D and 3D imaging data. Moreover, as each pixel cell is used to perform imaging, the spatial resolutions of the images can also be improved. Meanwhile, by having two photodiodes (or more) sharing a charge sensing unit, a quantizer, and a memory, the size and power consumption of a pixel cell can be reduced. Moreover, for photodiodes that share a charge sensing unit, a pair of charge draining transistor and charge transfer transistor can be provided for each photodiode to control a flow direction of charge from the photodiode. The flow directions can be adapted for different operation modes, such as charge binning between the photodiodes, and separate read out of charge from each photodiode. Further, a sampling switch and a sampling capacitor can be provided to sample and hold the output of a charge sensing unit while the output awaits to be quantized, to reduce the effect of dark charge. All these can improve flexibility of operation of the pixel cell as well as the accuracy of measurement of different frequency components of light by the pixel cell.

The disclosed techniques may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some examples, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1A is a diagram of an example of a near-eye display 100. Near-eye display 100 presents media to a user. Examples of media presented by near-eye display 100 include one or more images, video, and/or audio. In some examples, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some examples, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some examples, display 110 comprises a waveguide display assembly for directing light from one or more images to an eye of the user.

Near-eye display 100 further includes image sensors 120a, 120b, 120c, and 120d. Each of image sensors 120a, 120b, 120c, and 120d may include a pixel array configured to generate image data representing different fields of views along different directions. For example, sensors 120a and 120b may be configured to provide image data representing two fields of view towards a direction A along the Z axis, whereas sensor 120c may be configured to provide image data representing a field of view towards a direction B along the X axis, and sensor 120d may be configured to provide image data representing a field of view towards a direction C along the X axis.

In some examples, sensors 120a-120d can be configured as input devices to control or influence the display content of the near-eye display 100, to provide an interactive VR/AR/MR experience to a user who wears near-eye display 100. For example, sensors 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some examples, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120a-120d can provide the location tracking system a more holistic view of the physical environment, which can lead to more objects to be included in the construction and updating of the map. With such an arrangement, the accuracy and robustness of tracking a location of the user within the physical environment can be improved.

In some examples, near-eye display 100 may further include one or more active illuminators 130 to project light into the physical environment. The light projected can be associated with different frequency spectrums (e.g., visible light, infra-red light, ultra-violet light, etc.), and can serve various purposes. For example, illuminator 130 may project light in a dark environment (or in an environment with low intensity of infra-red light, ultra-violet light, etc.) to assist sensors 120a-120d in capturing images of different objects within the dark environment to, for example, enable location tracking of the user. Illuminator 130 may project certain markers onto the objects within the environment, to assist the location tracking system in identifying the objects for map construction/updating.

In some examples, illuminator 130 may also enable stereoscopic imaging. For example, one or more of sensors 120a or 120b can include both a first pixel array for visible light sensing and a second pixel array for infra-red (IR) light sensing. The first pixel array can be overlaid with a color filter (e.g., a Bayer filter), with each pixel of the first pixel array being configured to measure intensity of light associated with a particular color (e.g., one of red, green or blue colors). The second pixel array (for IR light sensing) can also be overlaid with a filter that allows only IR light through, with each pixel of the second pixel array being configured to measure intensity of IR lights. The pixel arrays can generate an RGB image and an IR image of an object, with each pixel of the IR image being mapped to each pixel of the RGB image. Illuminator 130 may project a set of IR markers on the object, the images of which can be captured by the IR pixel array. Based on a distribution of the IR markers of the object as shown in the image, the system can estimate a distance of different parts of the object from the IR pixel array, and generate a stereoscopic image of the object based on the distances. Based on the stereoscopic image of the object, the system can determine, for example, a relative position of the object with respect to the user, and can update the image data provided to display 100 based on the relative position information to provide the interactive experience.

As discussed above, near-eye display 100 may be operated in environments associated with a very wide range of light intensities. For example, near-eye display 100 may be operated in an indoor environment or in an outdoor environment, and/or at different times of the day. Near-eye display 100 may also operate with or without active illuminator 130 being turned on. As a result, image sensors 120a-120d may need to have a wide dynamic range to be able to operate properly (e.g., to generate an output that correlates with the intensity of incident light) across a very wide range of light intensities associated with different operating environments for near-eye display 100.

Figure 1B:
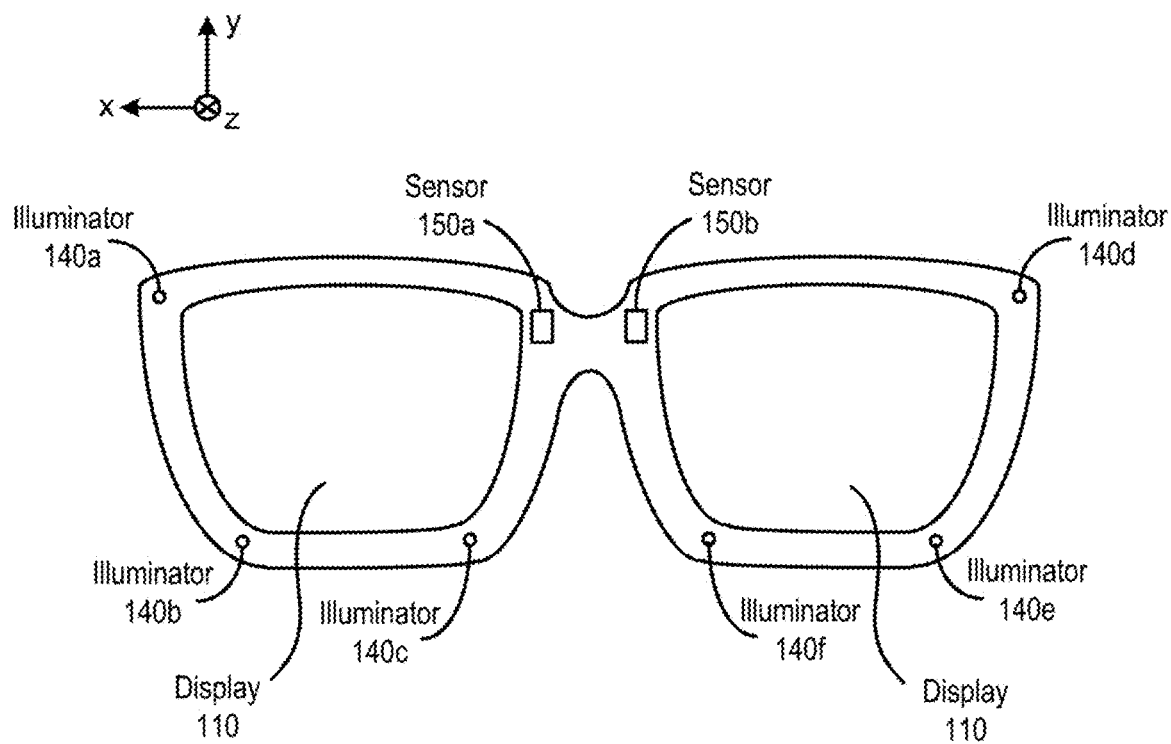

FIG. 1B is a diagram of another example of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140a, 140b, 140c, 140d, 140e, and 140f. Near-eye display 100 further includes a plurality of image sensors 150a and 150b. Illuminators 140a, 140b, and 140c may emit lights of certain frequency range (e.g., NIR) towards direction D (which is opposite to direction A of FIG. 1A). The emitted light may be associated with a certain pattern, and can be reflected by the left eyeball of the user. Sensor 150a may include a pixel array to receive the reflected light and generate an image of the reflected pattern. Similarly, illuminators 140d, 140e, and 140f may emit NIR lights carrying the pattern. The NIR lights can be reflected by the right eyeball of the user, and may be received by sensor 150b. Sensor 150b may also include a pixel array to generate an image of the reflected pattern. Based on the images of the reflected pattern from sensors 150a and 150b, the system can determine a gaze point of the user, and update the image data provided to display 100 based on the determined gaze point to provide an interactive experience to the user.

As discussed above, to avoid damaging the eyeballs of the user, illuminators 140a, 140b, 140c, 140d, 140e, and 140f are typically configured to output lights of very low intensities. In a case where image sensors 150a and 150b comprise the same sensor devices as image sensors 120a-120d of FIG. 1A, the image sensors 120a-120d may need to be able to generate an output that correlates with the intensity of incident light when the intensity of the incident light is very low, which may further increase the dynamic range requirement of the image sensors.

Moreover, the image sensors 120a-120d may need to be able to generate an output at a high speed to track the movements of the eyeballs. For example, a user's eyeball can perform a very rapid movement (e.g., a saccade movement) in which there can be a quick jump from one eyeball position to another. To track the rapid movement of the user's eyeball, image sensors 120a-120d need to generate images of the eyeball at high speed. For example, the rate at which the image sensors generate an image frame (the frame rate) needs to at least match the speed of movement of the eyeball. The high frame rate requires short total exposure time for all of the pixel cells involved in generating the image frame, as well as high speed for converting the sensor outputs into digital values for image generation. Moreover, as discussed above, the image sensors also need to be able to operate at an environment with low light intensity.

Figure 1B:
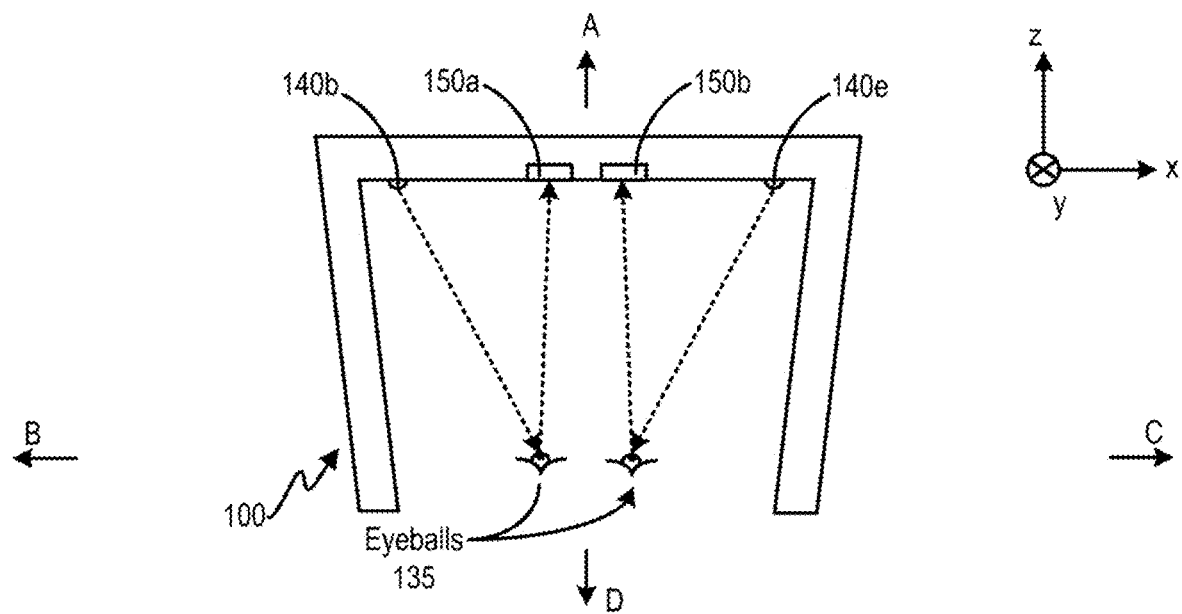
Figure 2:
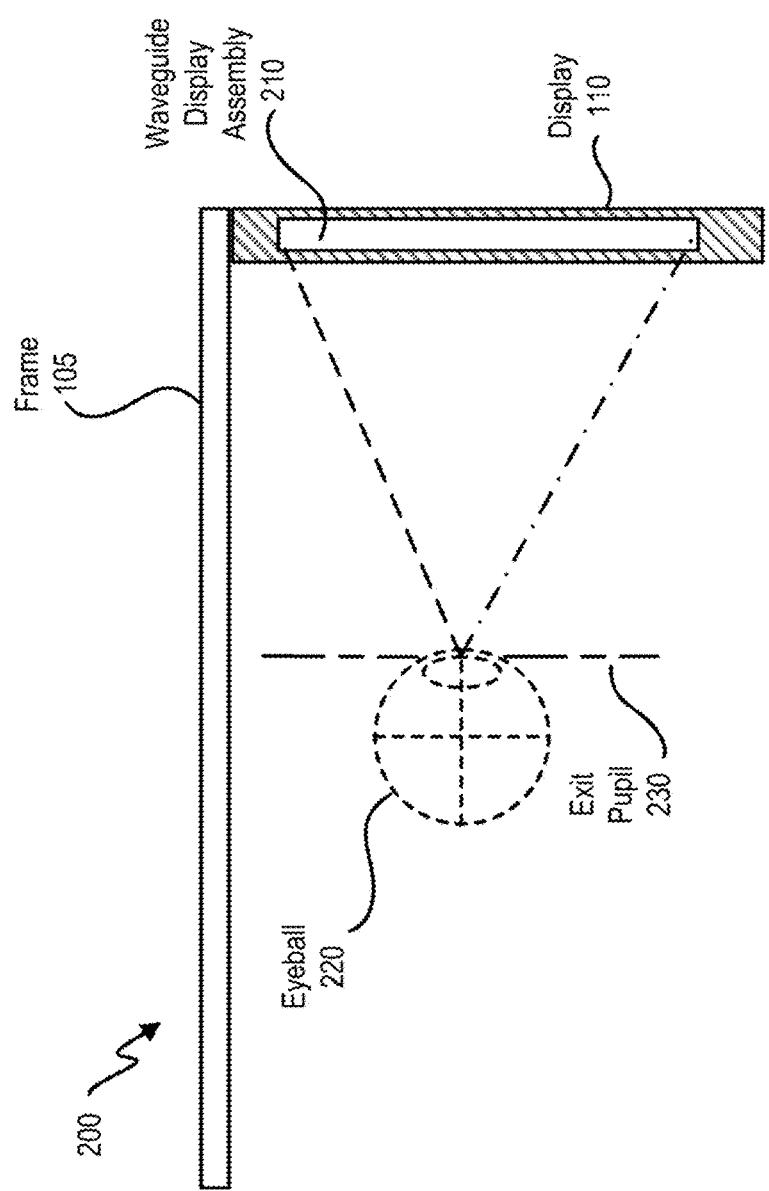
FIG. 2 is an example of a cross section of the near-eye display.

FIG. 2 is an example of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some examples, near-eye display 100 includes one or more optical elements between waveguide display assembly 210 and eyeball 220.

In some examples, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate examples, waveguide display assembly 210 may include the stacked waveguide display and the varifocal waveguide display.

Figure 3:
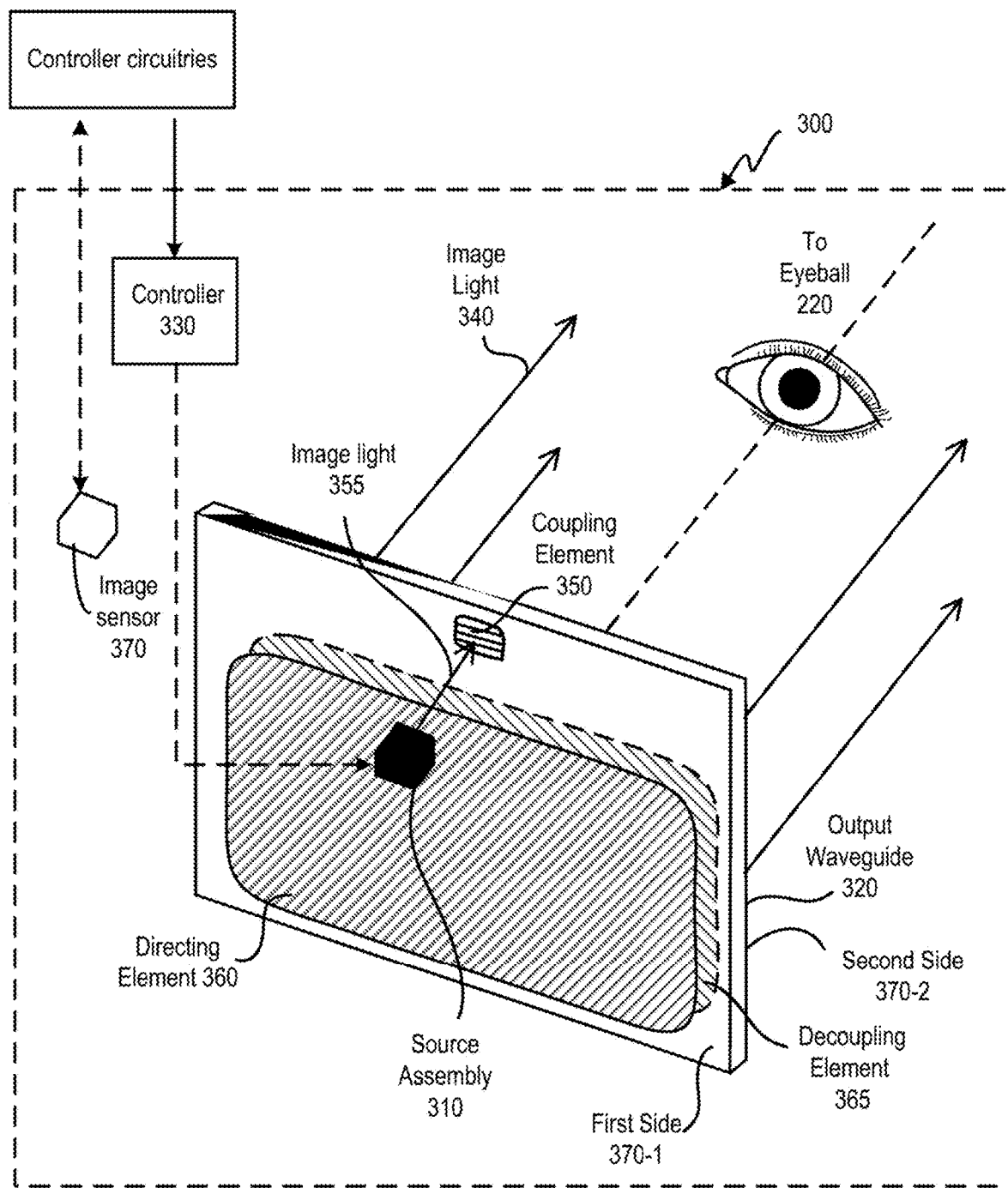
FIG. 3 illustrates an isometric view of an example of a waveguide display with a single source assembly.

FIG. 3 illustrates an isometric view of an example of a waveguide display 300. In some examples, waveguide display 300 is a component (e.g., waveguide display assembly 210) of near-eye display 100. In some examples, waveguide display 300 is part of some other near-eye display or other system that directs image light to a particular location.

Waveguide display 300 includes a source assembly 310, an output waveguide 320, and a controller 330. For purposes of illustration, FIG. 3 shows the waveguide display 300 associated with a single eyeball 220, but in some examples, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some examples, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some examples, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A to generate image data of a physical environment in front of the user (e.g., for location determination). Image sensor 370 may also be located on second side 370-2 and may include image sensors 150a and 150b of FIG. 1B to generate image data of eyeball 220 (e.g., for gaze point determination) of the user. Image sensor 370 may interface with a remote console that is not located within waveguide display 300. Image sensor 370 may provide image data to the remote console, which may determine, for example, a location of the user, a gaze point of the user, etc., and determine the content of the images to be displayed to the user. The remote console can transmit instructions to controller 330 related to the determined content. Based on the instructions, controller 330 can control the generation and outputting of image light 355 by source assembly 310.

Figure 4:
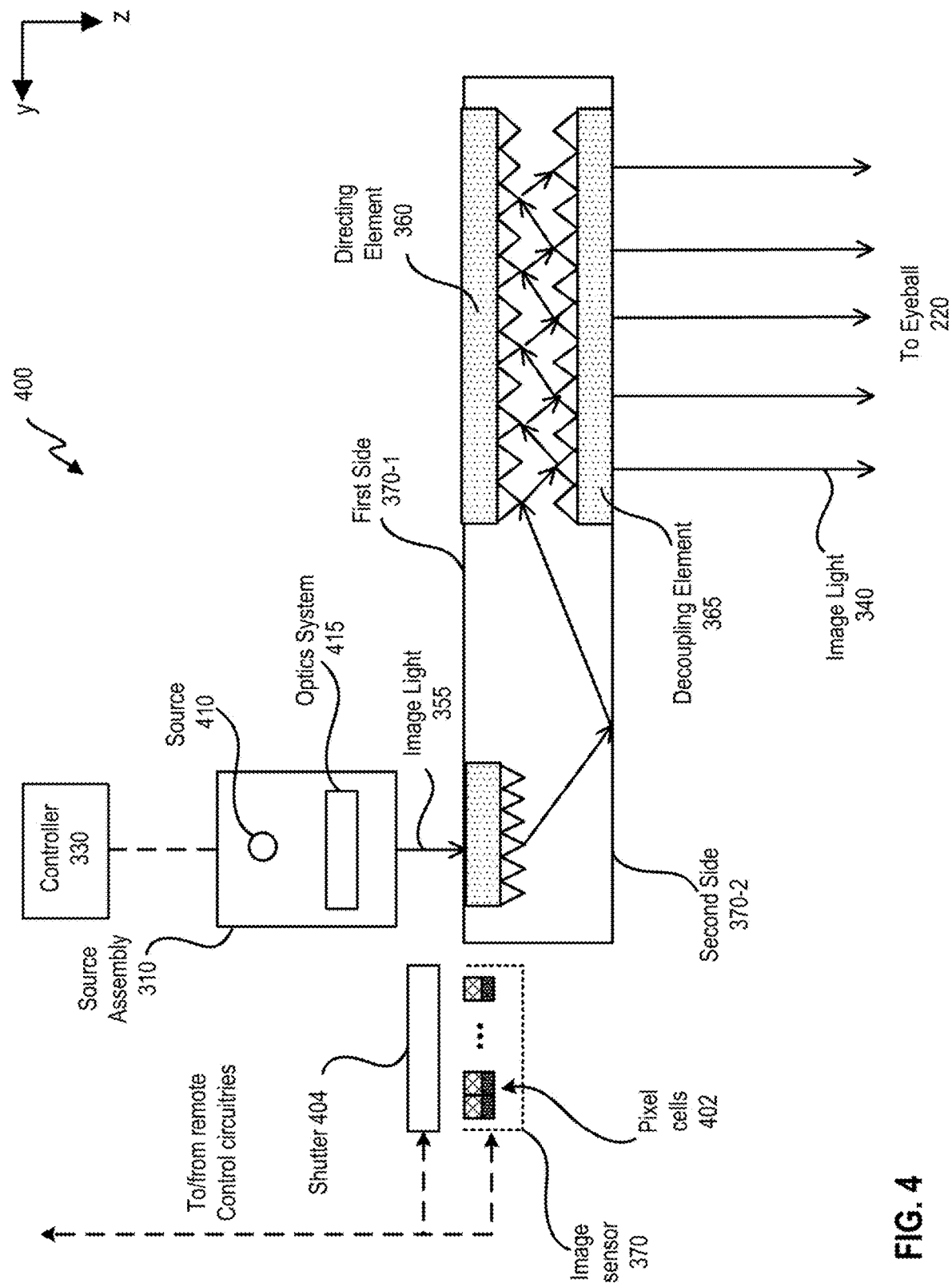
FIG. 4 illustrates a cross section of an example of the waveguide display.

FIG. 4 illustrates an example of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some examples, there can be a mechanical shutter 404 interposed between the set of pixel cells 402 and the physical environment to control the exposure of the set of pixel cells 402. In some examples, the mechanical shutter 404 can be replaced by an electronic shutter gate, as to be discussed below. Each of pixel cells 402 may correspond to one pixel of the image. Although not shown in FIG. 4, it is understood that each of pixel cells 402 may also be overlaid with a filter to control the frequency range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some examples, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In examples where coupling element 350 is diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In examples where directing element 360 is a diffraction grating, the pitch of the diffraction grating is chosen to cause incident image light 355 to exit output waveguide 320 at angle(s) of inclination relative to a surface of decoupling element 365.

In some examples, directing element 360 and/or decoupling element 365 are structurally similar. Expanded image light 340 exiting output waveguide 320 is expanded along one or more dimensions (e.g., may be elongated along x-dimension). In some examples, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
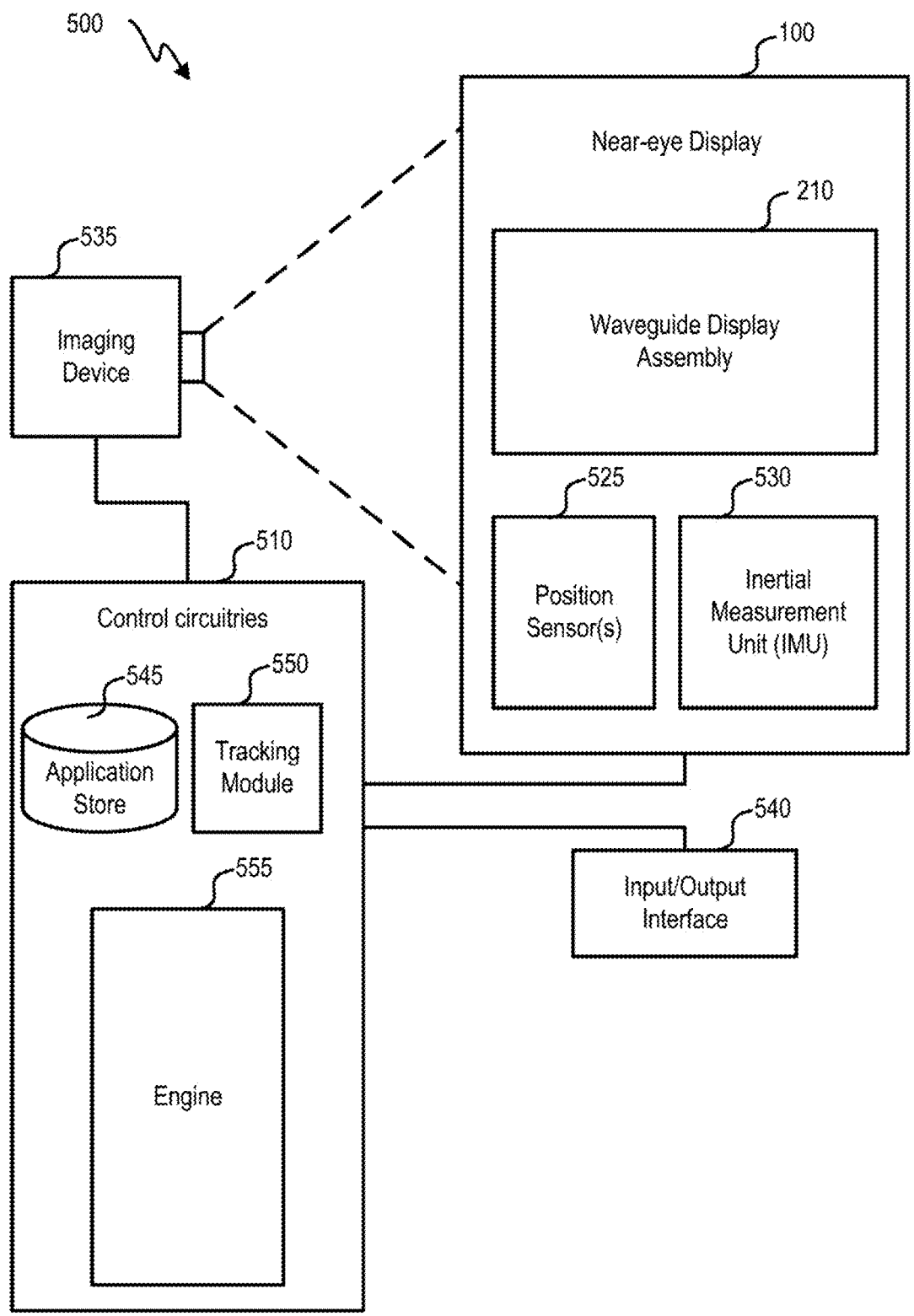
FIG. 5 is a block diagram of an example of a system including the near-eye display.

FIG. 5 is a block diagram of an example of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some examples, audio is presented via an external device (e.g., speakers and/or headphones) that receives audio information from near-eye display 100 and/or control circuitries 510 and presents audio data based on the audio information to a user. In some examples, near-eye display 100 may also act as an AR eyewear glass. In some examples, near-eye display 100 augments views of a physical, real-world environment, with computer-generated elements (e.g., images, video, sound, etc.).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating image data of a physical environment in which the user is located, for performing location tracking of the user. Imaging device 535 may further include, for example, image sensors 150a-150b of FIG. 1B for generating image data for determining a gaze point of the user, to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provide media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include: gaming applications, conferencing applications, video playback applications, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some examples, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), or a gaze point of the user (e.g., based on image data provided by imaging device 535), a distance between an object and user (e.g., based on image data provided by imaging device 535).

Figure 6:
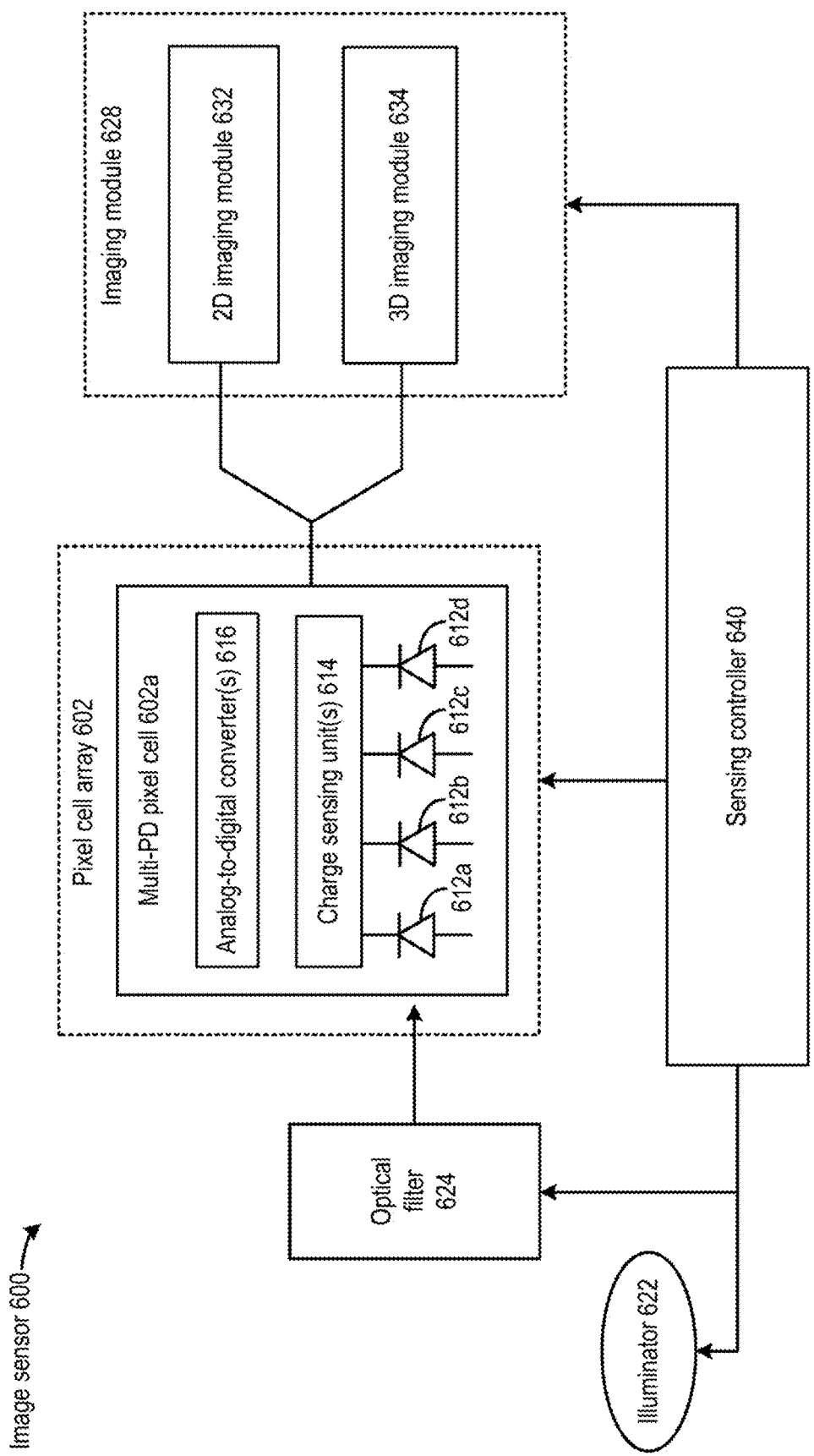
FIG. 6 illustrates block diagrams of examples of an image sensor.

FIG. 6 illustrates an example of an image sensor 600. Image sensor 600 can be part of near-eye display 100, and can provide 2D and 3D image data to control circuitries 510 of FIG. 5 to control the display content of near-eye display 100. As shown in FIG. 6, image sensor 600 may include an array of pixel cells 602 including pixel cell 602a. Pixel cell 602a can include a plurality of photodiodes 612 including, for example, photodiodes 612a, 612b, 612c, and 612d, one or more charge sensing units 614, and one or more analog-to-digital converters 616. The plurality of photodiodes 612 can convert different components of incident light to charge. For example, photodiode 612a-612c can correspond to different visible light channels, in which photodiode 612a can convert a visible blue component (e.g., a wavelength range of 450-490 nanometers (nm)) to charge. Photodiode 612b can convert a visible green component (e.g., a wavelength range of 520-560 nm) to charge. Photodiode 612c can convert a visible red component (e.g., a wavelength range of 635-700 nm) to charge. Moreover, photodiode 612d can convert an infra-red component (e.g., 700-1000 nm) to charge. Each of the one or more charge sensing units 614 can include a charge storage device and a buffer to convert the charge generated by photodiodes 612a-612d to voltages, which can be quantized by one or more ADCs 616 into digital values. The digital values generated from photodiodes 612a-612c can represent the different visible light components of a pixel, and each can be used for 2D sensing in a particular visible light channel. Moreover, the digital value generated from photodiode 612d can represent the infra-red light component of the same pixel and can be used for 3D sensing. Although FIG. 6 shows that pixel cell 602a includes four photodiodes, it is understood that the pixel cell can include a different number of photodiodes (e.g., two, three, etc.).

In some examples, image sensor 600 may also include an illuminator 622, an optical filter 624, an imaging module 628, and a sensing controller 630. Illuminator 622 may be an infra-red illuminator, such as a laser, a light emitting diode (LED), etc., that can project infra-red light for 3D sensing. The projected light may include, for example, structured light, light pulses, etc. Optical filter 624 may include an array of filter elements overlaid on the plurality of photodiodes 612a-612d of each pixel cell including pixel cell 606a. Each filter element can set a wavelength range of incident light received by each photodiode of pixel cell 606a. For example, a filter element over photodiode 612a may transmit the visible blue light component while blocking other components, a filter element over photodiode 612b may transmit the visible green light component, a filter element over photodiode 612c may transmit the visible red light component, whereas a filter element over photodiode 612d may transmit the infra-red light component.

Image sensor 600 further includes an imaging module 628. Imaging module 628 may further include a 2D imaging module 632 to perform 2D imaging operations and a 3D imaging module 634 to perform 3D imaging operations. The operations can be based on digital values provided by ADCs 616. For example, based on the digital values from each of photodiodes 612a-612c, 2D imaging module 632 can generate an array of pixel values representing an intensity of an incident light component for each visible color channel, and generate an image frame for each visible color channel. Moreover, 3D imaging module 634 can generate a 3D image based on the digital values from photodiode 612d. In some examples, based on the digital values, 3D imaging module 634 can detect a pattern of structured light reflected by a surface of an object, and compare the detected pattern with the pattern of structured light projected by illuminator 622 to determine the depths of different points of the surface with respect to the pixel cells array. For detection of the pattern of reflected light, 3D imaging module 634 can generate pixel values based on intensities of infra-red light received at the pixel cells. As another example, 3D imaging module 634 can generate pixel values based on time-of-flight of the infra-red light transmitted by illuminator 622 and reflected by the object.

Figure 7A:
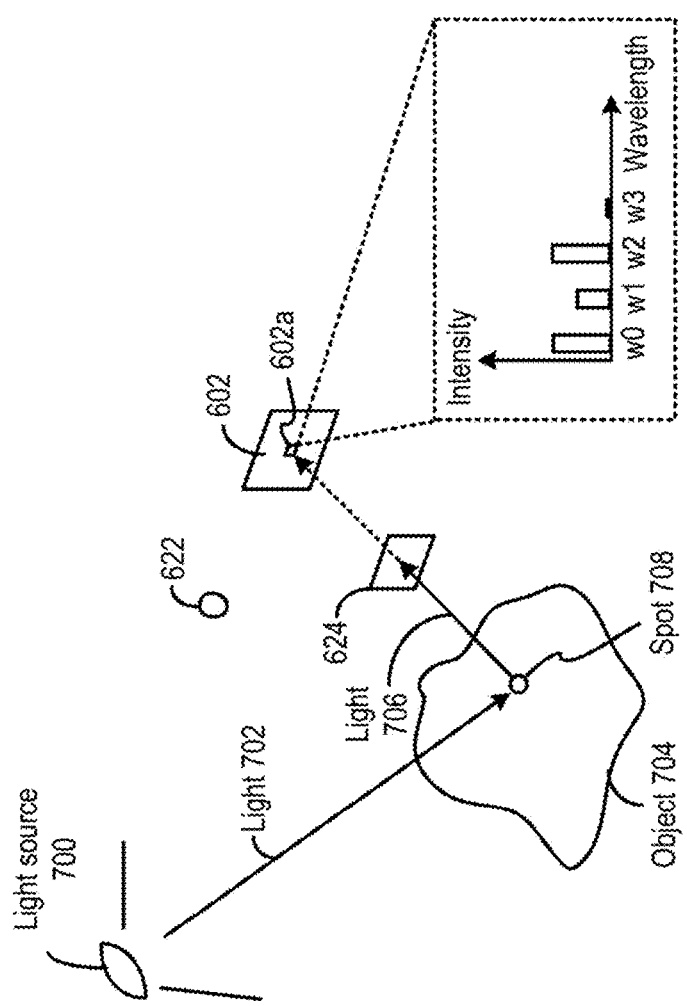
FIGS. 7A, 7B, and 7C illustrate operations for determining light intensities of different ranges by examples of FIG. 6.
Figure 7B:
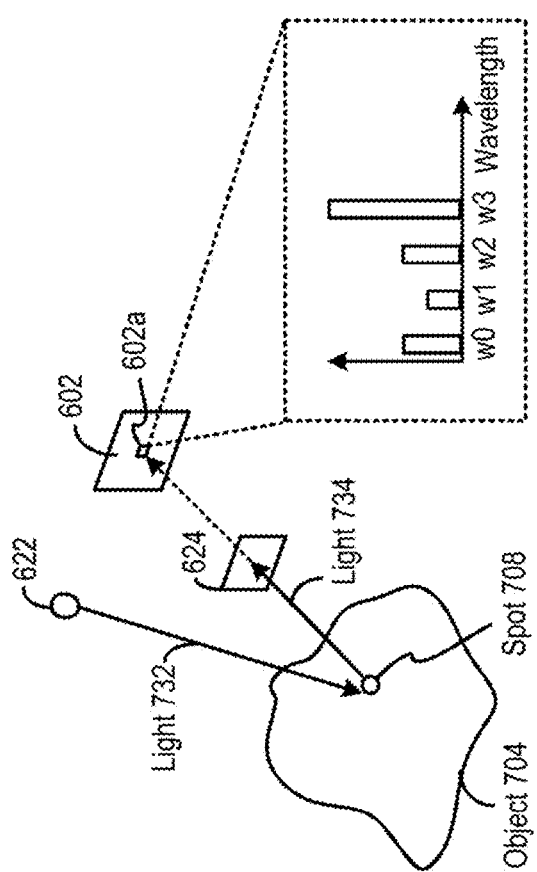
Figure 7C:
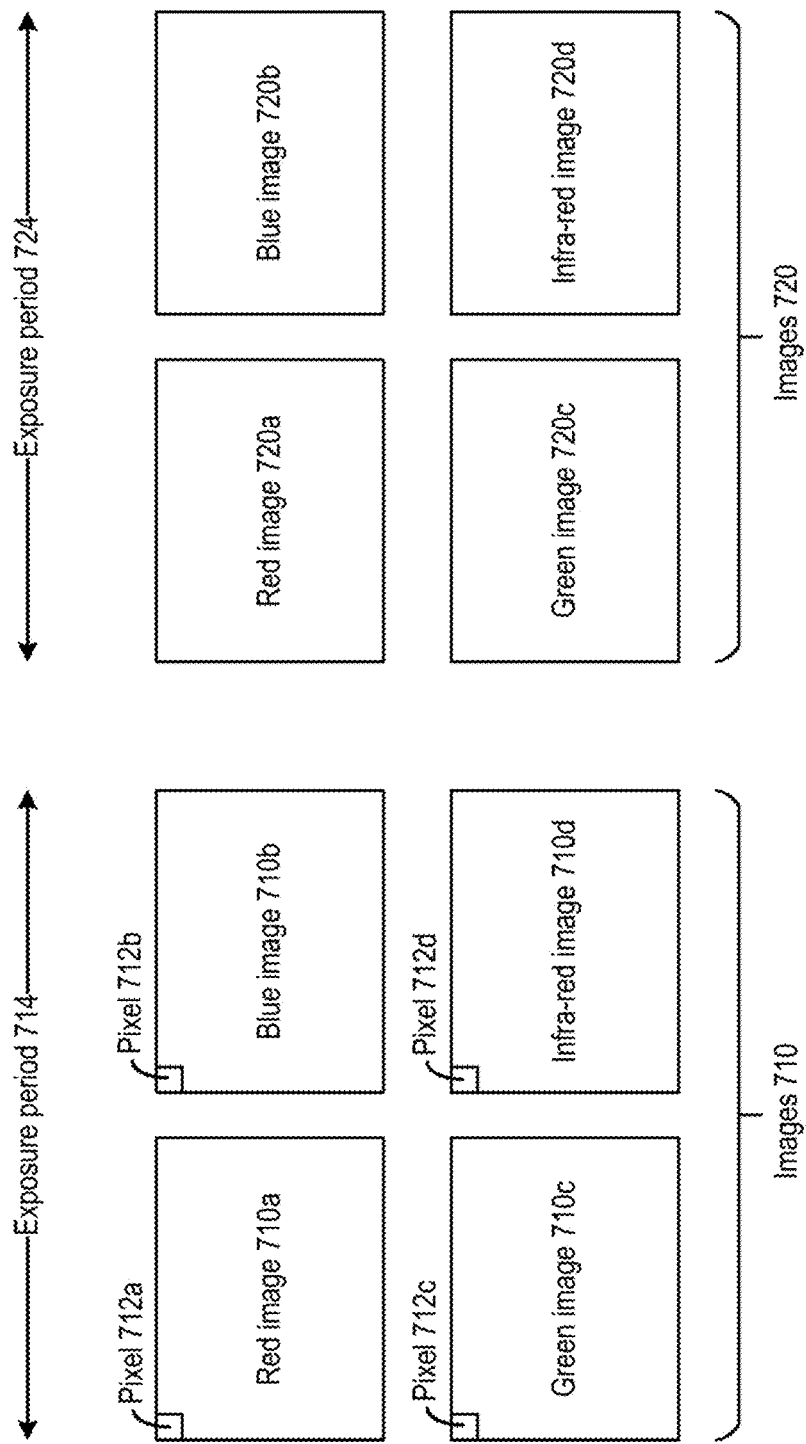

Image sensor 600 further includes a sensing controller 640 to control different components of image sensor 600 to perform 2D and 3D imaging of an object. Reference is now made to FIG. 7A-FIG. 7C, which illustrate examples of operations of image sensor 600 for 2D and 3D imaging. FIG. 7A illustrates an example of operations for 2D imaging. For 2D imaging, pixel cells array 602 can detect visible light in the environment including visible light reflected off an object. For example, referring to FIG. 7A, visible light source 700 (e.g., a light bulb, the sun, or other sources of ambient visible light) can project visible light 702 onto an object 704. Visible light 706 can be reflected off a spot 708 of object 704. Visible light 706 can also include the ambient infra-red light component. Visible light 706 can be filtered by optical filter array 624 to pass different components of visible light 706 of wavelength ranges w0, w1, w2, and w3 to, respectively, photodiodes 612a, 612b, 612c, and 612d of pixel cell 602a. Wavelength ranges w0, w1, w2, and w3 an correspond to, respectively, blue, green, red, and infra-red. As shown in FIG. 7A, as the infra-red illuminator 622 is not turned on, the intensity of infra-red component (w3) is contributed by the ambient infra-red light and can be very low. Moreover, different visible components of visible light 706 can also have different intensities. Charge sensing units 614 can convert the charge generated by the photodiodes to voltages, which can be quantized by ADCs 616 into digital values representing the red, blue, and green components of a pixel representing spot 708. Referring to FIG. 7C, after the digital values are generated, sensing controller 640 can control 2D imaging module 632 to generate, based on the digital values, sets of images including a set of images 710, which includes a red image frame 710a, a blue image frame 710b, and a green image frame 710c each representing one of red, blue, or green color image of a scene captured with the same exposure period 714. Each pixel from the red image (e.g., pixel 712a), from the blue image (e.g., pixel 712b), and from the green image (e.g., pixel 712c) can represent visible components of light from the same spot (e.g., spot 708) of a scene. A different set of images 720 can be generated by 2D imaging module 632 in a subsequent exposure period 724. Each of red image 710a, blue image 710b, and green image 710c can represent the scene in a specific color channel and can be provided to an application to, for example, extract image features from the specific color channel. As each image represents the same scene and each corresponding pixel of the images represent light from the same spot of the scene, the correspondence of images between different color channels can be improved.

Furthermore, image sensor 600 can also perform 3D imaging of object 704. Referring to FIG. 7B, sensing controller 610 can control illuminator 622 to project infra-red light 732, which can include a light pulse, structured light, etc., onto object 704. Infra-red light 732 can have a wavelength range of 700 nanometers (nm) to 1 millimeter (mm). Infra-red light 734 can reflect off spot 708 of object 704 and can propagate towards pixel cells array 602 and pass through optical filter 624, which can provide the infra-red component (of wavelength range w3) to photodiode 612d to convert to charge. Charge sensing units 614 can convert the charge to a voltage, which can be quantized by ADCs 616 into digital values. Referring to FIG. 7C, after the digital values are generated, sensing controller 640 can control 3D imaging module 634 to generate, based on the digital values, an infra-red image 710d of the scene as part of images 710 captured within exposure period 714. As infra-red image 710d can represent the same scene in the infra-red channel and a pixel of infra-red image 710d (e.g., pixel 712d) represents light from the same spot of the scene as other corresponding pixels (pixels 712a-712c) in other images within images 710, the correspondence between 2D and 3D imaging can be improved as well.

Figure 8A:
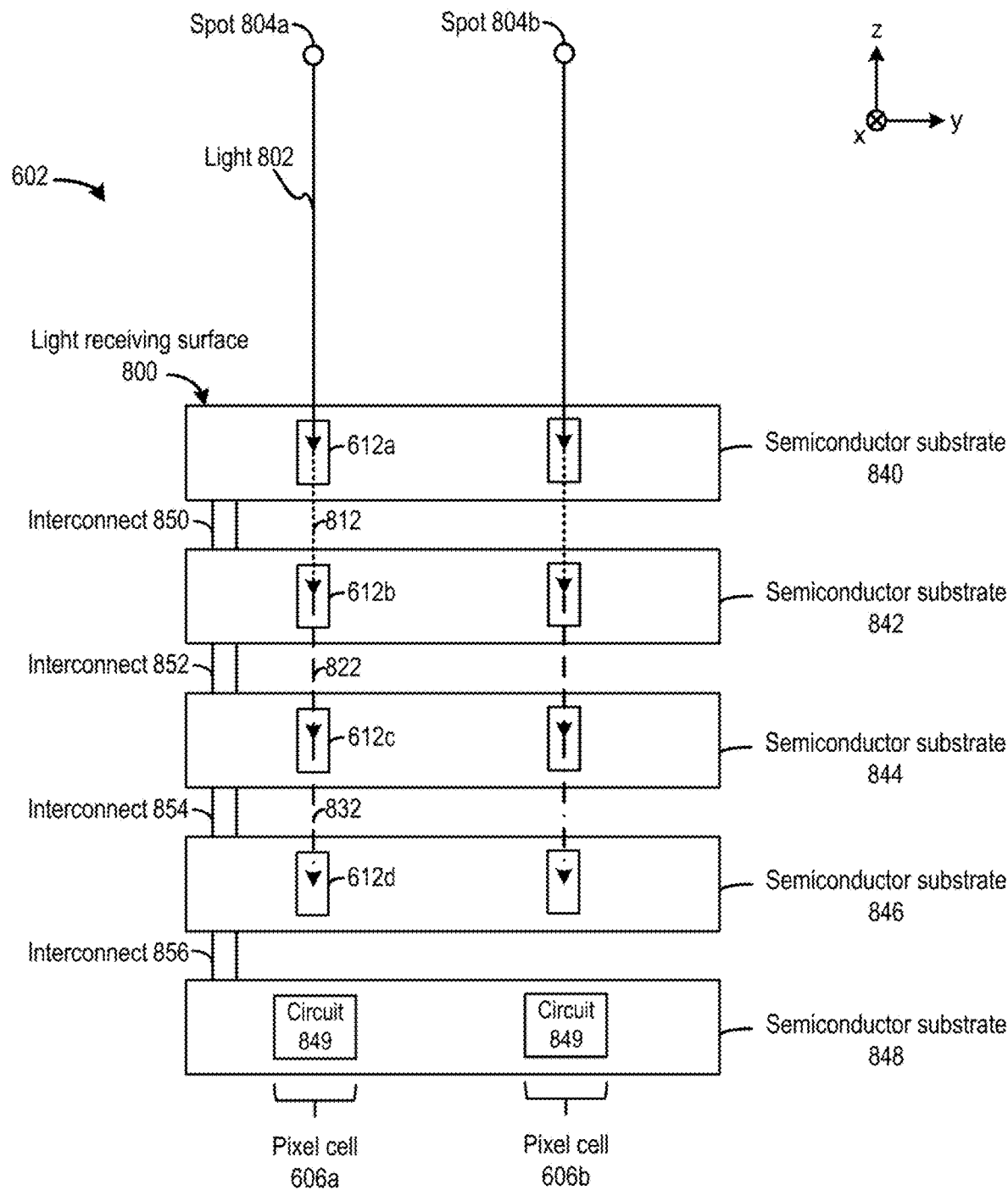
FIGS. 8A, 8B, 8C, and 8D illustrate examples of components of the image sensor of FIG. 6.

FIG. 8A-FIG. 8D illustrate examples of arrangements of photodiodes 612 in a pixel cell. As shown in FIG. 8A, the photodiodes 612a-612d in a pixel cell 602a can form a stack along an axis that is perpendicular to a light receiving surface 800 through which pixel cell 602a receives incident light 802 from a spot 804a. For example, the photodiodes 612a-612d can form a stack along a vertical axis (e.g., the z-axis) when the light receiving surface 800 is parallel with the x and y axes. Each photodiode can have a different distance from light receiving surface 800, and the distance can set the component of incident light 802 being absorbed and converted to charge by each photodiode. For example, photodiode 612a is closest to light receiving surface 800 and can absorb and convert the blue component to charge, which is of the shortest wavelength range among the other components. Light 812 includes the remaining components of light 802 (e.g., green, red, and infra-red) and can propagate to photodiode 612b, which can absorb and convert the green component. Light 822 includes the remaining components of light 812 (e.g., red and infra-red) and can propagate to photodiode 612c, which can absorb and convert the red component. The remaining infra-red component 832 can propagate to photodiode 612d to be converted to charge.

Each the photodiodes 612a, 612b, 612c, and 612d can be in a separate semiconductor substrate, which can be stacked to form image sensor 600. For example, photodiode 612a can be in a semiconductor substrate 840, photodiode 612b can be in a semiconductor substrate 842, photodiode 612c can be in a semiconductor substrate 844, whereas photodiode 612d can be in a semiconductor substrate 846. Each of substrates 840-846 can include a charge sensing unit, such as charge sensing units 614. Substrates 840-846 can form a sensor layer. Each semiconductor substrate can include other photodiodes of other pixel cells, such as pixel cells 602b to receive light from spot 804b. Image sensor 600 can include another semiconductor substrate 848 which can include pixel cell processing circuits 849 which can include, for example, ADCs 616, imaging module 628, sensing controller 640, etc. In some examples, charge sensing units 614 can be in semiconductor substrate 848. Semiconductor substrate 848 can form an application specific integrated circuit (ASIC) layer. Each semiconductor substrate can be connected to a metal interconnect, such as metal interconnects 850, 852, 854, and 856 to transfer the charge generated at each photodiode to processing circuit 849.

Figure 8B:
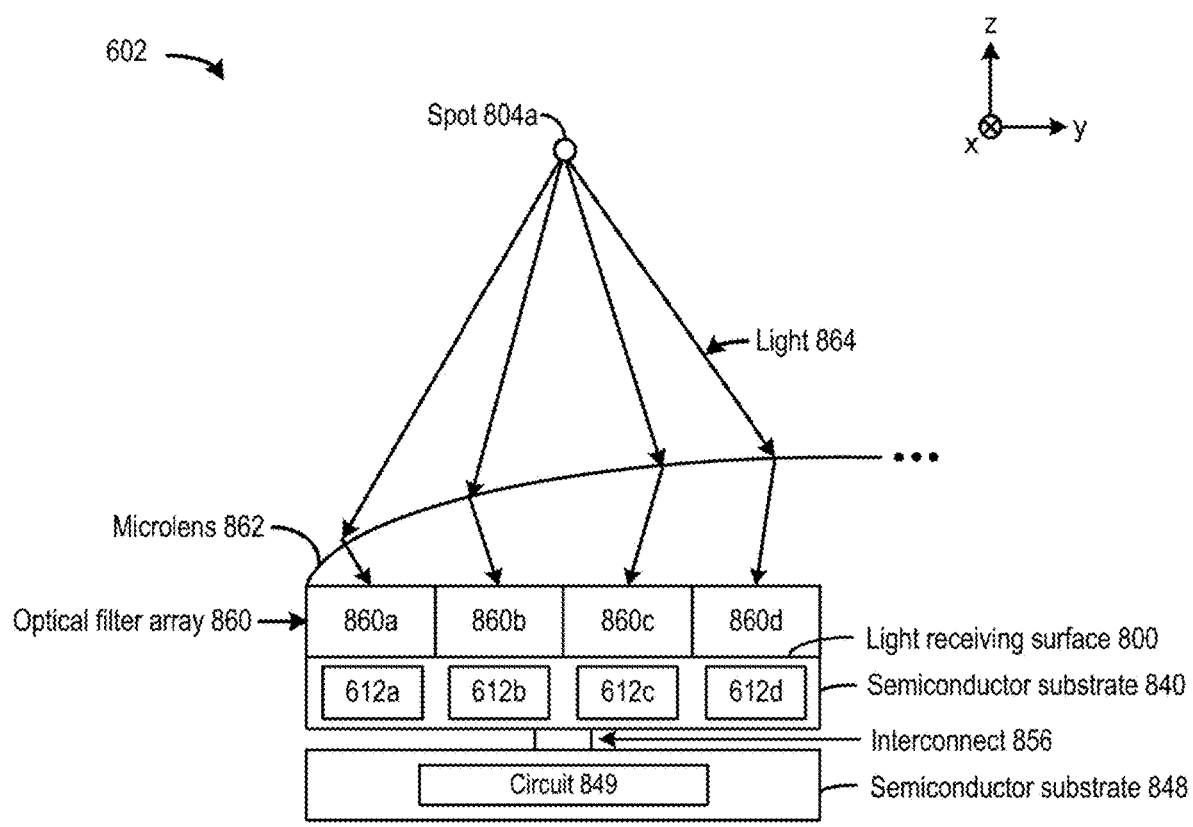
Figure 8B:
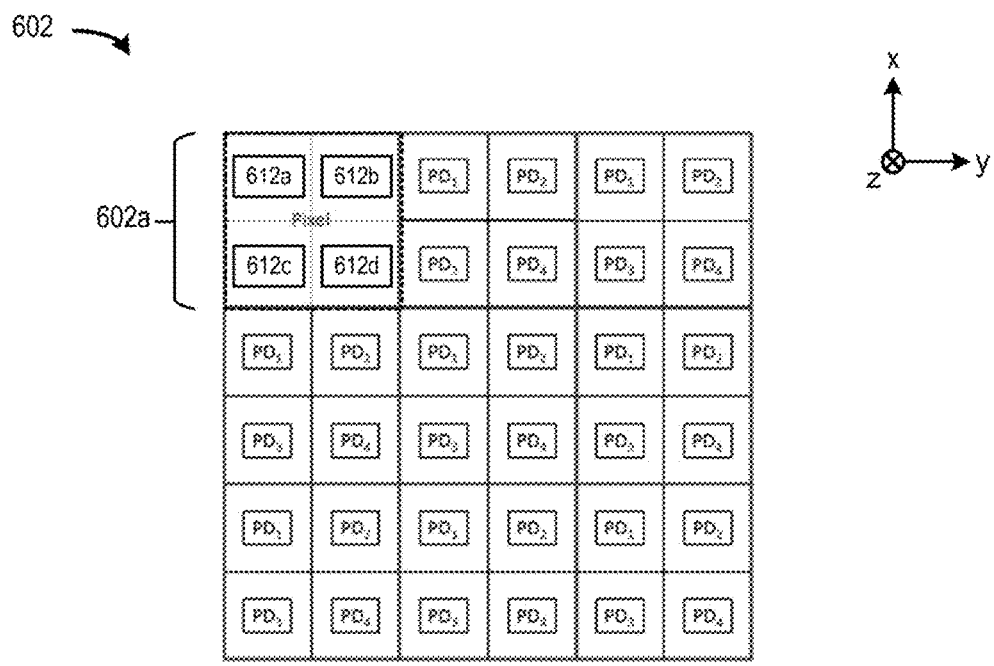
Figure 8C:
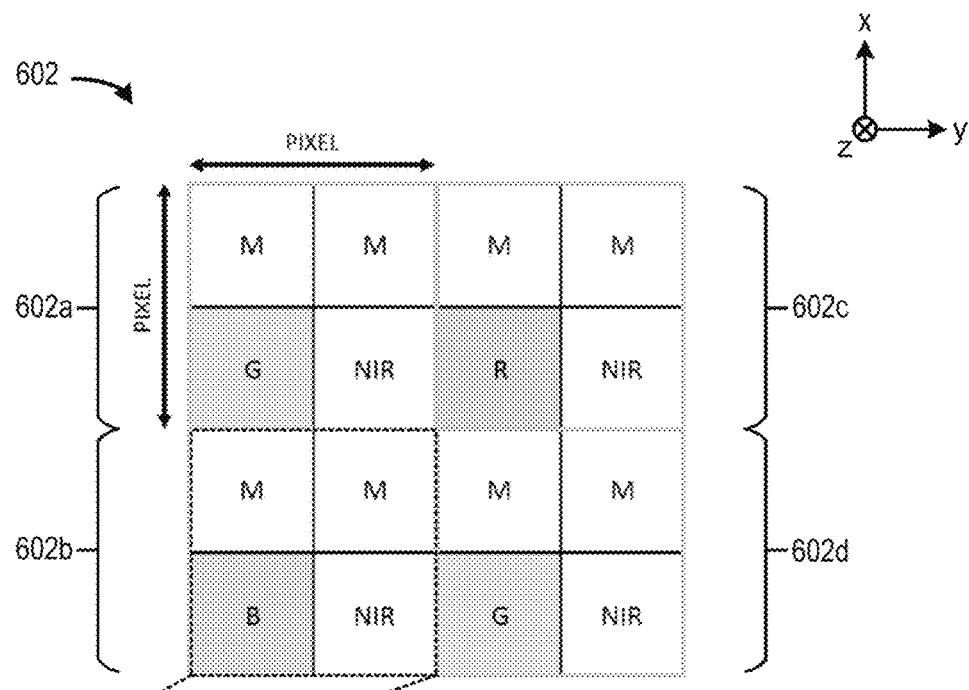
Figure 8C:
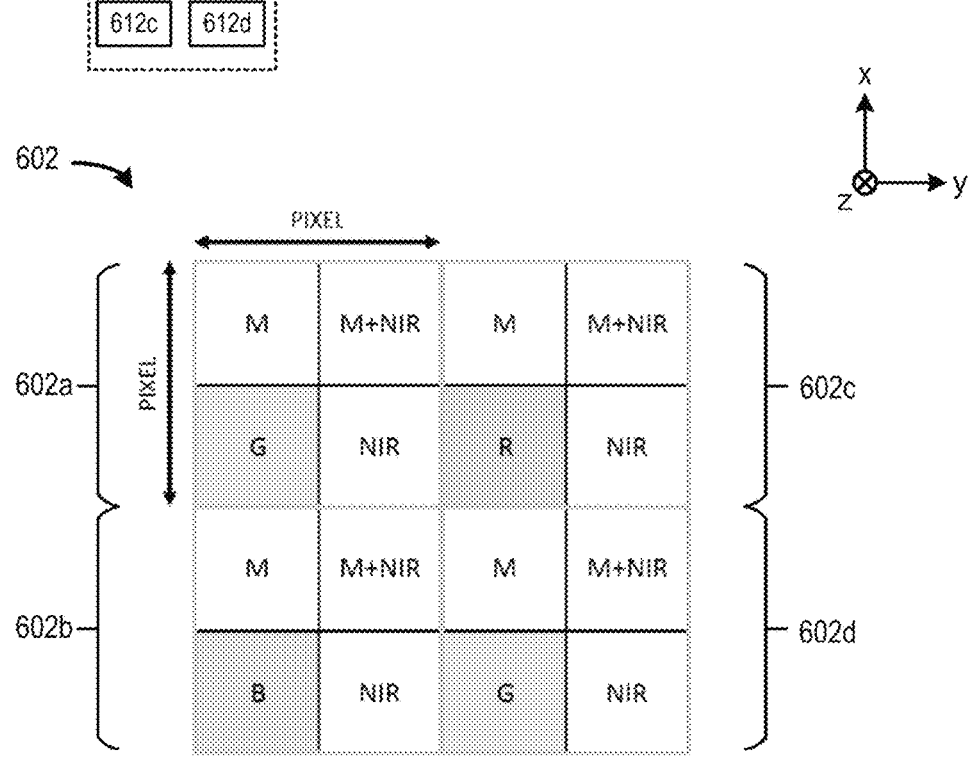
Figure 8D:
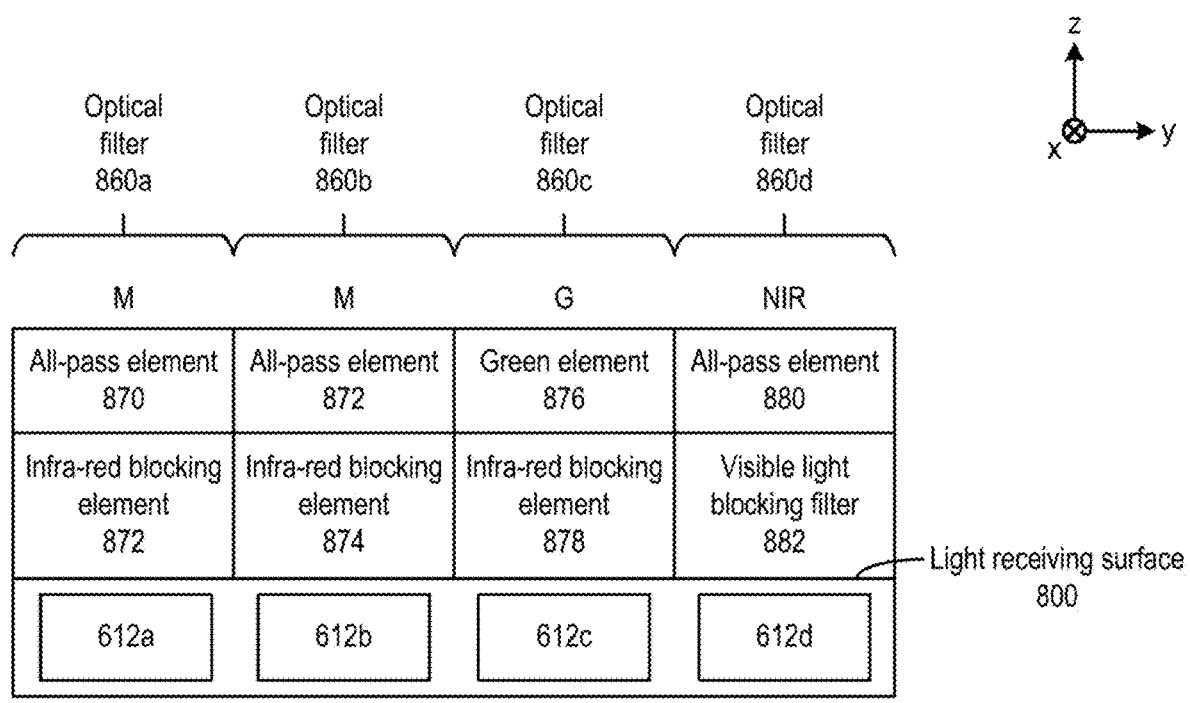
Figure 8D:
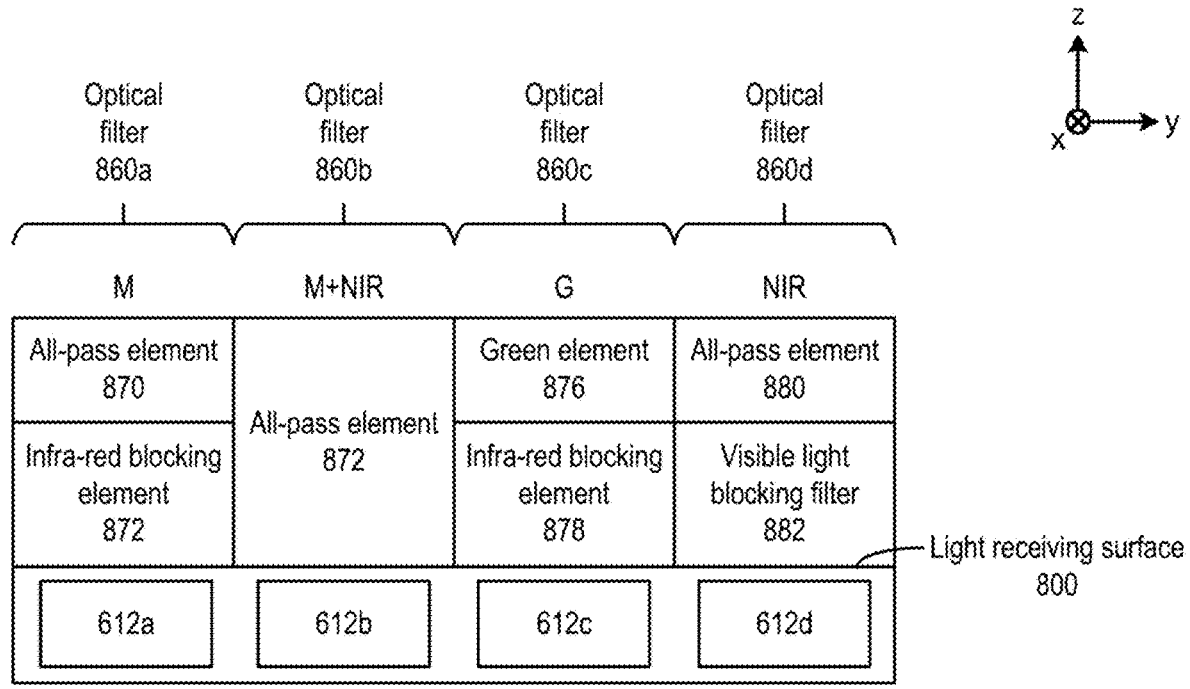

FIG. 8B-FIG. 8D illustrate other example arrangements of photodiodes 612. As shown in FIG. 8B-FIG. 8D, the plurality of photodiodes 612 can be arranged laterally parallel with light receiving surface 800. The top graph of FIG. 8B illustrates a side view of an example of pixel cell 602a, whereas the bottom graph of FIG. 8B illustrates a top view of pixel array 602 including pixel cell 602a. As shown in FIG. 8B, with light receiving surface 800 being parallel with the x and y axes, photodiodes 612a, 612b, 612c, and 612d can be arranged adjacent to each other also along the x and y axes in semiconductor substrate 840. Pixel cell 602a further includes an optical filter array 860 overlaid on the photodiodes. Optical filter array 860 can be part of optical filter 624. Optical filter array 860 can include a filter element overlaid on each of photodiodes 612a, 612b, 612c, and 612d to set a wavelength range of incident light component received by the respective photodiode. For example, filter element 860a is overlaid on photodiode 612a and can allow only visible blue light to enter photodiode 612a. Moreover, filter element 860b is overlaid on photodiode 612b and can allow only visible green light to enter photodiode 612b. Further, filter element 860c is overlaid on photodiode 612c and can allow only visible red light to enter photodiode 612c. Filter element 860d is overlaid on photodiode 612d and can allow only infra-red light to enter photodiode 612d. Pixel cell 602a further includes one or more microlens 862 which can project light 864 from a spot of a scene (e.g., spot 804a) via optical tiler array 860 to different lateral locations of light receiving surface 800, which allows each photodiode to become a sub-pixel of pixel cell 602a and to receive components of light from the same spot corresponding to a pixel. Pixel cell 602a can also include semiconductor substrate 848 which can include circuit 849 (e.g., charge sensing units 614, ADCs 616, etc.) to generate digital values from the charge generated by the photodiodes. Semiconductor substrates 840 and 848 can form a stack and can be connected with interconnect 856. In FIG. 8B, semiconductor substrate 840 can form a sensor layer, whereas semiconductor substrate 848 can form an ASIC layer.

The arrangements of FIG. 8B, in which the photodiodes are arranged laterally and an optical filter array is used to control the light components received by the photodiodes, can offer numerous advantages. For example, the number of stacks and the number of semiconductor substrates can be reduced, which not only reduce the vertical height but also the interconnects among the semiconductor substrates. Moreover, relying on filter elements rather than the propagation distance of light to set the wavelength ranges of the components absorbed by each photodiode can offer flexibilities in selecting the wavelength ranges. As shown in top graph of FIG. 8C, pixel cells array 602 can include different optical filter arrays 860 for different pixel cells. For example, each pixel cell of pixel cells array 602 can have an optical filter array that provides monochrome channel of a wavelength range of 380-740 nm (labelled with "M") for photodiodes 612a and 612b, and an infra-red channel of a wavelength range of 700-1000 nm (labelled with "NIR") for photodiode 612d. But the optical filter arrays may also provide a different visible color channel for the different pixel cells. For example, the optical filter arrays 860 for pixel cells array 602a, 602b, 602c, and 602d may provide, respectively, a visible green channel (labelled with "G"), a visible red channel (labelled with "R"), a visible blue channel (labelled with "B"), and a visible green channel for photodiode 612c of the pixel cells arrays. As another example, as shown in the bottom graph of FIG. 8C, each optical filter array 860 can provide a monochrome and infra-red channel (labelled "M+NIR") which spans a wavelength range of 380-1000 nm for photodiode 612b of each pixel cells array.

FIG. 8D illustrates examples of optical filter array 860 to provide the example channels shown in FIG. 8C. As shown in FIG. 8D, optical filter array 860 can include a stack of optical filters to select a wavelength range of light received by each photodiode within a pixel cell array. For example, referring to the top graph of FIG. 8D, optical filter 860a can include an all-pass element 870 (e.g., a transparent glass that passes both visible light and infra-red light) and an infra-red blocking element 872 forming a stack to provide a monochrome channel for photodiode 612a. Optical filter 860b can also include an all-pass element 874 and an infra-red blocking element 876 to also provide a monochrome channel for photodiode 612b. Further, optical filter 860c can include a green-pass element 876 which passes green visible light (but reject other visible light component), and an infra-red blocking element 878, to provide a green channel for photodiode 612c. Lastly, optical filter 860d can include an all-pass element 880 and a visible light blocking filter 882 (which can block out visible light but allows infra-red light to go through) to provide an infra-red channel for photodiode 612d. In another example, as shown in the bottom graph of FIG. 8D, optical filter 860b can include only all-pass element 872 to provide a monochrome and infra-red channel for photodiode 612b.

Figure 9:
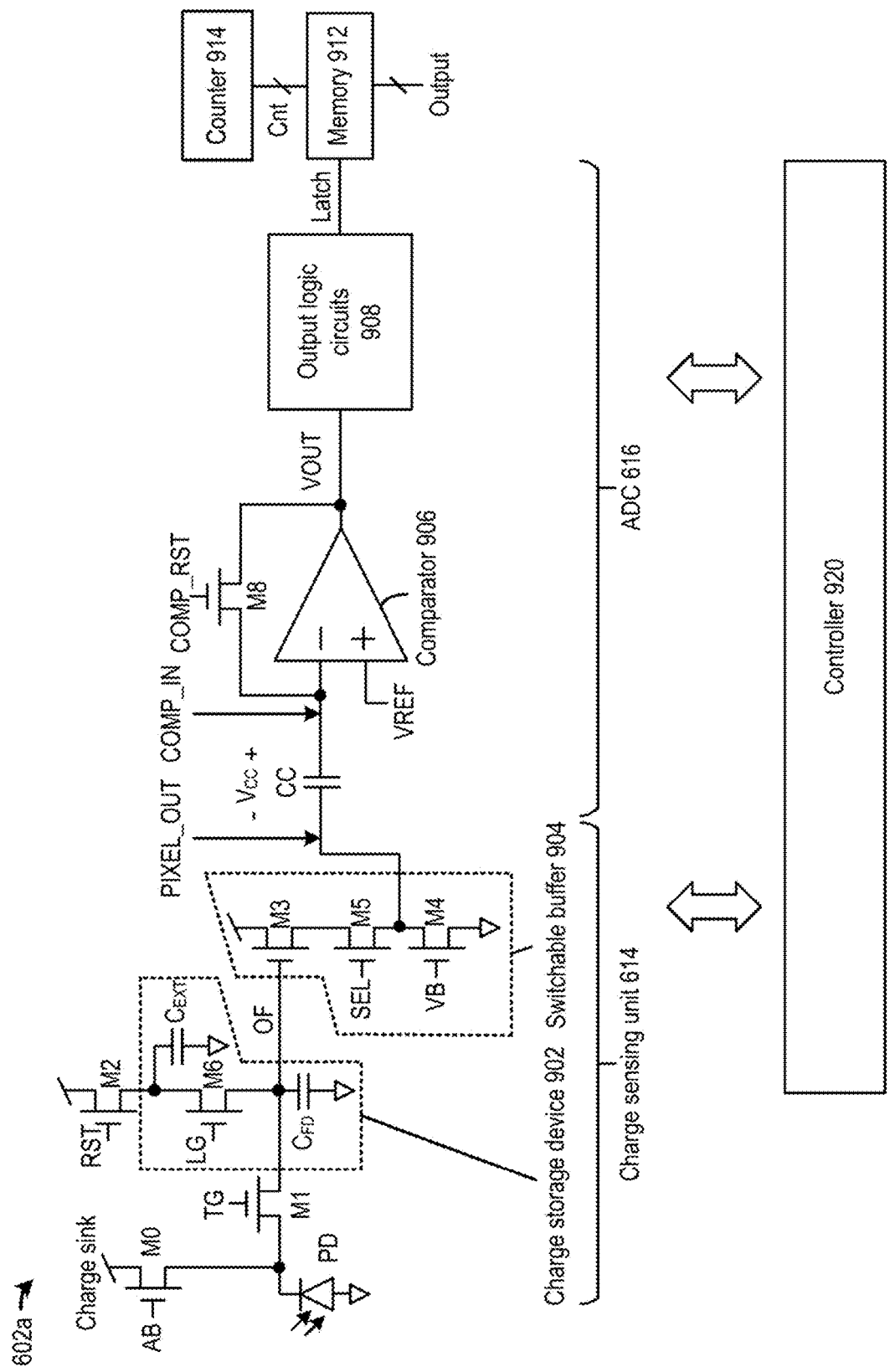
FIG. 9 illustrates examples of internal components of a pixel cell of FIG. 6.

Reference is now made to FIG. 9, which illustrates additional components of pixel cell 602a including an example of charge sensing unit 614 and ADC 616. As shown in FIG. 9, pixel cell 602a can include a photodiode PD (e.g., photodiode 612a), a charge draining transistor M0, a charge transfer transistor M1, a charge sensing unit 614 comprising a charge storage device 902 and a switchable buffer 904, and an ADC 616 comprising a CC capacitor, a comparator 906, and output logic circuits 908. The output of comparator 906 is coupled, via output logic circuits 908, with a memory 912 and a counter 914 which can be internal to or external to pixel cell 602a. Pixel cell 602 further includes a controller 920 to control the transistors, charge sensing unit 614, as well as ADC 616, As to be described below, controller 920 can set an exposure period to accumulate charge based on incident light, and can control charge sensing unit 614 and ADC 616 to perform multiple quantization operations associated with different light intensity ranges to generate a digital representation of the intensity of the incident light. Controller 920 can be internal to pixel cell 602a or part of sensing controller 640. Each transistor in pixel cell 602a can include, for example, a metal-oxide-semiconductor field-effect transistor (MOSFET), a bipolar junction transistor (BJT), etc. Photodiode PD, charge draining transistor M0, charge transfer transistor M1, and charge sensing unit 614 can be in a sensor layer (e.g., substrates 840-846 of FIG. 8A, substrate 840 of FIG. 8B), whereas ADC 616, memory 912, and counter 914 can be in an ASIC layer (e.g., substrate 848 of FIG. 8A and FIG. 8B), with the two substrates forming a stack.

Specifically, charge transfer transistor M1 can be controlled by a TG signal provided by controller 920 to transfer some of the charge to charge storage device 902. In one quantization operation, charge transfer transistor M1 can be biased at a partially-on state to set a quantum well capacity of photodiode PD, which also sets a quantity of residual charge stored at the photodiode PD. After the photodiode PD is saturated by the residual charge, overflow charge can flow through charge transfer transistor M1 to charge storage device 902. In another quantization operation, charge transfer transistor M1 can be fully turned on to transfer the residual charge from the photodiode PD to charge storage device for measurement. Moreover, charge draining transistor M0 is coupled between the photodiode PD and a charge sink. Charge draining transistor M0 can be controlled by an anti-blooming (AB) signal provided by controller 920 to start an exposure period, in which the photodiode PD can generate and accumulate charge in response to incident light. Charge draining transistor M0 can also be controlled to provide an anti-blooming function to drain away additional charge generated by the photodiode PD to the charge sink after charge storage device 902 saturates, to prevent the additional charge from leaking into neighboring pixel cells. As to be described below, charge draining transistor M0 and charge transfer transistor M1 can be configured to generate a potential difference in response to, respectively, AB signal and TG signal, to control a charge (e.g., residual charge, overflow charge, etc.) to flow to either charge sensing unit 614 or a charge sink.

Charge storage device 902 has a configurable capacity and can convert the charge transferred from transistor M1 to a voltage at the OF node. Charge storage device 902 includes a $C_{FD}$ capacitor (e.g., a floating drain) and a $C_{EXT}$ capacitor (e.g., a MOS capacitor, a metal capacitor, etc.) connected by a M6 transistor. M6 transistor can be enabled by a LG signal to expand the capacity of charge storage device 902 by connecting $C_{FD}$ and $C_{EXT}$ capacitors in parallel, or to reduce the capacity by disconnecting the capacitors from each other. The capacity of charge storage device 902 can be reduced for measurement of residual charge to increase the charge-to-voltage gain and to reduce the quantization error. Moreover, the capacity of charge storage device 902 can also be increased for measurement of overflow charge to reduce the likelihood of saturation and to improve non-linearity. As to be described below, the capacity of charge storage device 902 can be adjusted for measurement of different light intensity ranges. Charge storage device 902 is also coupled with a reset transistor M2 which can be controlled by a reset signal RST, provided by controller 920, to reset $C_{FD}$ and $C_{EXT}$ capacitors between different quantization operations.

Switchable buffer 904 can be include a transistor M3 configured as a source follower to buffer the voltage at the OF node to improve its driving strength. The buffered voltage can be at the input node PIXEL_OUT of ADC 616. The M4 transistor provides a current source for switchable buffer 904 and can be biased by a VB signal. Switchable buffer 904 also includes a transistor M5 which be enabled or disabled by a SEL signal. When transistor M5 is disabled, source follower M3 can be disconnected from the PIXEL_OUT node. As to be described below, pixel cell 602a may include multiple charge sensing units 614 each including a switchable buffer 904, and one of the charge sensing units can be coupled with PIXEL_OUT (and ADC 616) at one time based on the SEL signal.

Figure 10:
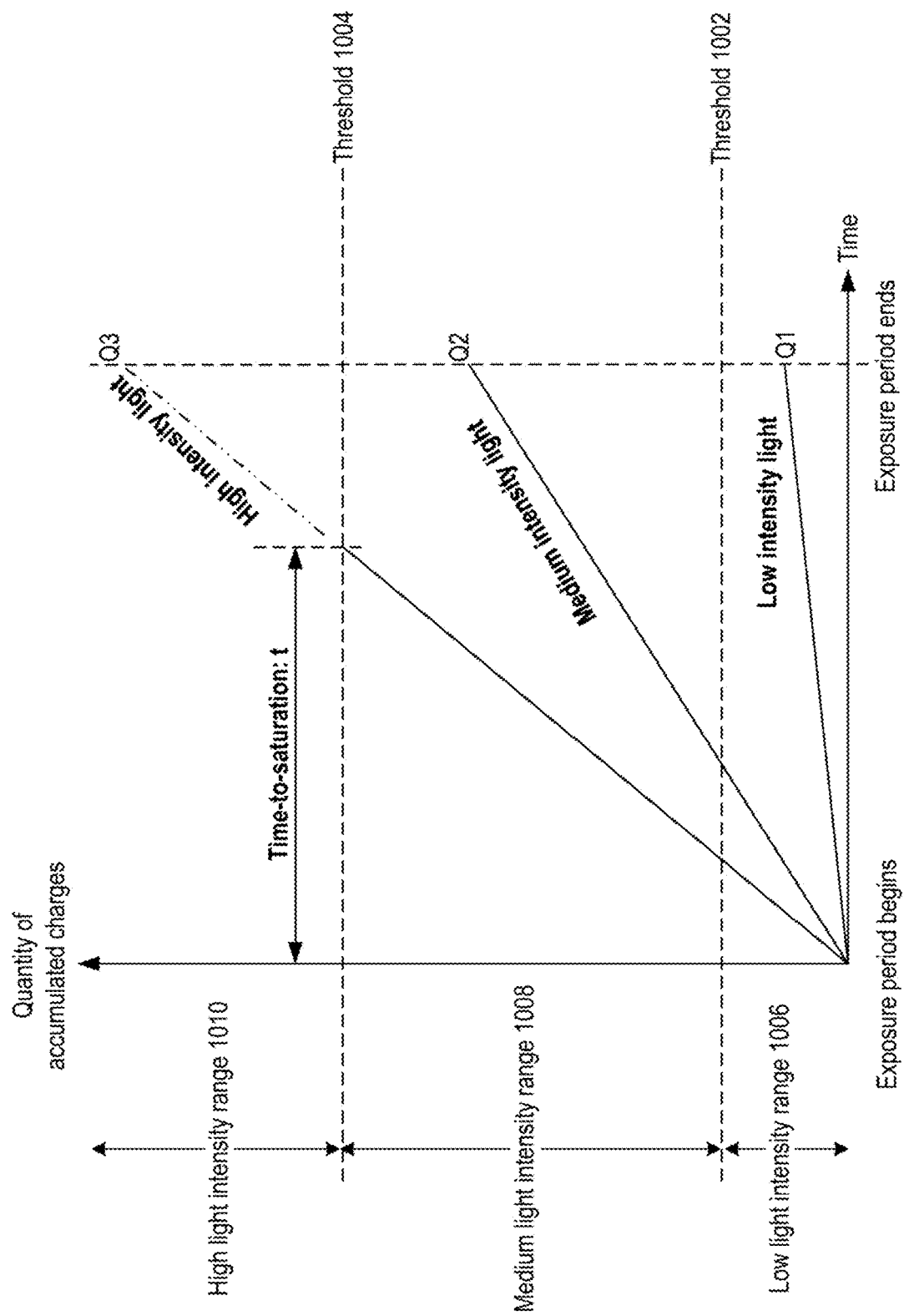
FIG. 10 illustrates examples of light intensity ranges to be measured by a pixel cell of FIG. 6.

As described above, charge generated by photodiode PD within an exposure period can be temporarily stored in charge storage device 902 and converted to a voltage. The voltage can be quantized to represent an intensity of the incident light based on a pre-determined relationship between the charge and the incident light intensity. Reference is now made to FIG. 10, which illustrates a quantity of charge accumulated with respect to time for different light intensity ranges. The total quantity of charge accumulated at a particular time point can reflect the intensity of light incident upon photodiode PD of FIG. 6 within an exposure period. The quantity can be measured when the exposure period ends. A threshold 1002 and a threshold 1004 can be defined for a threshold's quantity of charge defining a low light intensity range 1006, a medium light intensity range 1008, and a high light intensity range 1010 for the intensity of the incident light. For example, if the total accumulated charge is below threshold 1002 (e.g., Q1), the incident light intensity is within low light intensity range 1006. If the total accumulated charge is between threshold 1004 and threshold 1002 (e.g., Q2), the incident light intensity is within medium light intensity range 1008. If the total accumulated charge is above threshold 1004, the incident light intensity is within medium light intensity range 1010. The quantity of the accumulated charge, for low and medium light intensity ranges, can correlate with the intensity of the incident light, if the photodiode does not saturate within the entire low light intensity range 1006 and the measurement capacitor does not saturate within the entire medium light intensity range 1008.

The definitions of low light intensity range 1006 and medium light intensity range 1008, as well as thresholds 1002 and 1004, can be based on the full well capacity of photodiode PD and the capacity of charge storage device 902. For example, low light intensity range 706 can be defined such that the total quantity of residual charge stored in photodiode PD, at the end of the exposure period, is below or equal to the storage capacity of the photodiode, and threshold 1002 can be based on the full well capacity of photodiode PD. Moreover, medium light intensity range 1008 can be defined such that the total quantity of charge stored in charge storage device 902, at the end of the exposure period, is below or equal to the storage capacity of the measurement capacitor, and threshold 1004 can be based on the storage capacity of charge storage device 902. Typically threshold 1004 is can be based on a scaled storage capacity of charge storage device 902 to ensure that when the quantity of charge stored in charge storage device 902 is measured for intensity determination, the measurement capacitor does not saturate, and the measured quantity also relates to the incident light intensity. As to be described below, thresholds 1002 and 1004 can be used to detect whether photodiode PD and charge storage device 902 saturate, which can determine the intensity range of the incident light.

In addition, in a case where the incident light intensity is within high light intensity range 1010, the total overflow charge accumulated at charge storage device 902 may exceed threshold 1004 before the exposure period ends. As additional charge is accumulated, charge storage device 902 may reach full capacity before the end of the exposure period, and charge leakage may occur. To avoid measurement error caused due to charge storage device 902 reaching full capacity, a time-to-saturation measurement can be performed to measure the time duration it takes for the total overflow charge accumulated at charge storage device 902 to reach threshold 1004. A rate of charge accumulation at charge storage device 902 can be determined based on a ratio between threshold 1004 and the time-to-saturation, and a hypothetical quantity of charge (Q3) that could have been accumulated at charge storage device 902 at the end of the exposure period (if the capacitor had limitless capacity) can be determined by extrapolation according to the rate of charge accumulation. The hypothetical quantity of charge (Q3) can provide a reasonably accurate representation of the incident light intensity within high light intensity range 1010.

Referring back to FIG. 9, to measure high light intensity range 1010 and medium light intensity range 1008, charge transfer transistor M1 can be biased by TG signal in a partially turned-on state. For example, the gate voltage of charge transfer transistor M1 (TG) can be set based on a target voltage developed at photodiode PD corresponding to the full well capacity of the photodiode. With such arrangements, only overflow charge (e.g., charge generated by the photodiode after the photodiode saturates) will transfer through charge transfer transistor M1 to reach charge storage device 902, to measure time-to-saturation (for high light intensity range 1010) and/or the quantity of charge stored in charge storage device 902 (for medium light intensity range 1008). For measurement of medium and high light intensity ranges, the capacitance of charge storage device 902 (by connecting $C_{EXT}$ and $C_{FD}$) can also be maximized to increase threshold 1004.

Moreover, to measure low light intensity range 1006, charge transfer transistor M1 can be controlled in a fully turned-on state to transfer the residual charge stored in photodiode PD to charge storage device 902. The transfer can occur after the quantization operation of the overflow charge stored at charge storage device 902 completes and after charge storage device 902 is reset. Moreover, the capacitance of charge storage device 902 can be reduced. As described above, the reduction in the capacitance of charge storage device 902 can increase the charge-to-voltage conversion ratio at charge storage device 902, such that a higher voltage can be developed for a certain quantity of stored charge. The higher charge-to-voltage conversion ratio can reduce the effect of measurement errors (e.g., quantization error, comparator offset, etc.) introduced by subsequent quantization operation on the accuracy of low light intensity determination. The measurement error can set a limit on a minimum voltage difference that can be detected and/or differentiated by the quantization operation. By increasing the charge-to-voltage conversion ratio, the quantity of charge corresponding to the minimum voltage difference can be reduced, which in turn reduces the lower limit of a measurable light intensity by pixel cell 602*a* and extends the dynamic range.

The charge (residual charge and/or overflow charge) accumulated at charge storage device 902 can develop an analog voltage at the OF node, which can be buffered by switchable buffer 904 at PIXEL_OUT and quantized by ADC 616. As shown in FIG. 9, ADC 616 includes a comparator 906 which can be reset by a transistor M8, and output logic circuits 908. ADC 616 is also coupled with memory 912 and counter 914. Counter 914 can generate a set of count values based on a free-running clock signal, whereas memory 912 can be controlled, by comparator 906 via output logic circuits 908, to store a count value (e.g., the latest count value) generated by counter 914. Memory 912 can be, for example, a latch circuit to store the counter value based on local pixel value as described below. The stored count value can be output via pixel output buses 816.

Comparator 906 can compare an analog voltage COMP_IN, which is derived from PIXEL_OUT by the CC capacitor, against a threshold VREF, and generate a decision VOUT based on the comparison result. The CC capacitor can be used in a noise/offset compensation scheme to store the reset noise and comparator offset information in a VCC voltage, which can be added to the PIXEL_OUT voltage to generate the COMP_IN voltage, to cancel the reset noise component in the PIXEL_OUT voltage. The offset component remains in the COMP_IN voltage and can be cancelled out by the offset of comparator 906 when comparator 906 compares the COMP_IN voltage against threshold VREF to generate the decision VOUT. Comparator 906 can generate a logical one for VOUT if the COMP_IN voltage equals or exceeds VREF. Comparator 906 can also generate a logical zero for VOUT if the COMP_IN voltage falls below VREF. VOUT can control a latch signal which controls memory 912 to store a count value from counter 914.

Figure 11B:
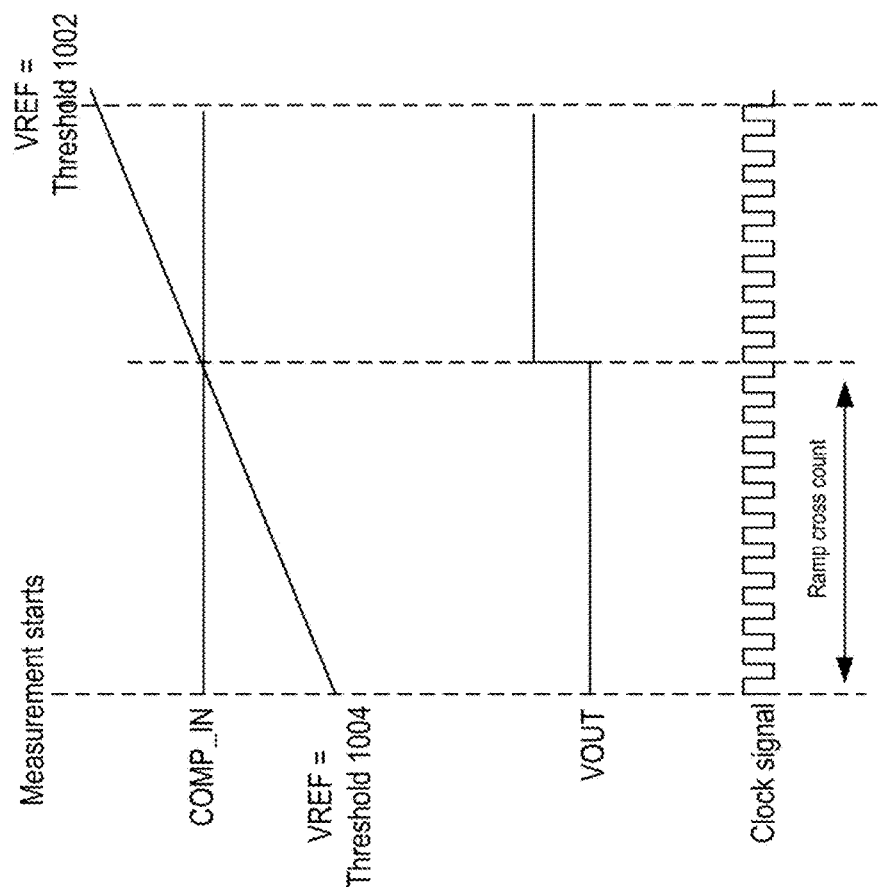
Figure 11A:
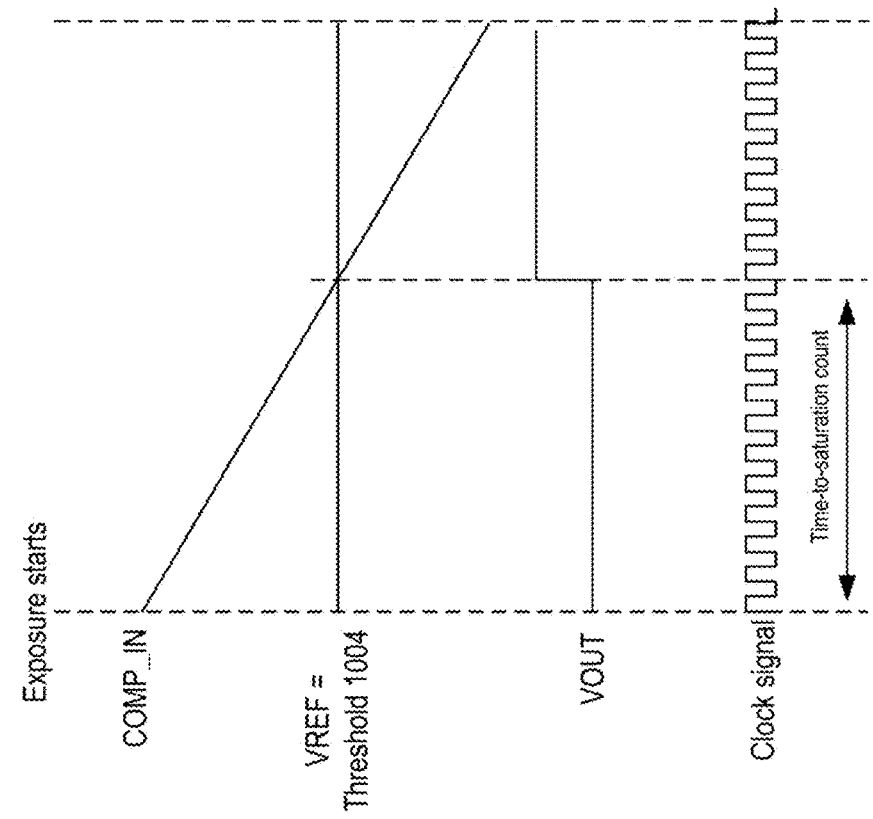

FIG. 11A illustrates an example of time-to-saturation measurement by ADC 616. To perform the time-to-saturation measurement, a threshold generator (which can be external to pixel cell 602*a*) can generate a fixed VREF. Fixed VREF can be set at a voltage corresponding a charge quantity threshold for saturation of charge storage device 902 (e.g., threshold 1004 of FIG. 10). Counter 914 can start counting right after the exposure period starts (e.g., right after charge draining transistor M0 is disabled). As the COMP_IN voltage ramps down (or up depending on the implementation) due to accumulation of overflow charge at charge storage device 902, clock signal keeps toggling to update the count value at counter 914. The COMP_IN voltage may reach the fixed VREF threshold at a certain time point, which causes VOUT to flip from low to high. The change of VOUT may stop the counting of counter 914, and the count value at counter 914 may represent the time-to-saturation.

FIG. 11B illustrates an example of measurement of a quantity of charge stored at charge storage device 902. After measurement starts, the threshold generator can generate a ramping VREF, which can either ramp up (in the example of FIG. 11B) or ramp down depending on implementation. The rate of ramping can be based on the frequency of the clock signal supplied to counter 914. In a case where overflow charge is measured, the voltage range of ramping VREF can be between threshold 1004 (charge quantity threshold for saturation of charge storage device 902) and threshold 1002 (charge quantity threshold for saturation of photodiode PD), which can define the medium light intensity range. In a case where residual charge is measured, the voltage range of the ramping VREF can be based on threshold 1002 and scaled by the reduced capacity of charge storage device 902 for residual charge measurement. In the example of FIG. 11B, the quantization process can be performed with uniform quantization steps, with VREF increasing (or decreasing) by the same amount for each clock cycle. The amount of increase (or decrease) of VREF corresponds to a quantization step. When VREF reaches within one quantization step of the COMP_IN voltage, VOUT of comparator 906 flips, which can stop the counting of counter 914, and the count value can correspond to a total number of quantization steps accumulated to match, within one quantization step, the COMP_IN voltage. The count value can become a digital representation of the quantity of charge stored at charge storage device 902, as well as the digital representation of the incident light intensity.

As discussed above, ADC 616 can introduce quantization errors when there is a mismatch between a quantity of charge represented by the quantity level output by ADC 616 (e.g., represented by the total number of quantization steps) and the actual input quantity of charge that is mapped to the quantity level by ADC 808. The quantization error can be reduced by using a smaller quantization step size. In the example of FIG. 11B, the quantization error can be reduced by the amount of increase (or decrease) in VREF per clock cycle.

Although quantization error can be reduced by using smaller quantization step sizes, area and performance speed may limit how far the quantization step can be reduced. With smaller quantization step size, the total number of quantization steps needed to represent a particular range of charge quantities (and light intensity) may increase. A larger number of data bits may be needed to represent the increased number of quantization steps (e.g., 8 bits to represent 255 steps, 7 bits to represent 127 steps, etc.). The larger number of data bits may require additional buses to be added to pixel output buses 816, which may not be feasible if pixel cell 601 is used on a head-mounted device or other wearable devices with very limited spaces. Moreover, with a larger number of quantization step size, ADC 808 may need to cycle through a larger number of quantization steps before finding the quantity level that matches (with one quantization step), which leads to increased processing power consumption and time, and reduced rate of generating image data. The reduced rate may not be acceptable for some applications that require a high frame rate (e.g., an application that tracks the movement of the eyeball).

One way to reduce quantization error is by employing a non-uniform quantization scheme, in which the quantization steps are not uniform across the input range. FIG. 11C illustrates an example of a mapping between the ADC codes (the output of the quantization process) and the input charge quantity level for a non-uniform quantization process and a uniform quantization process. The dotted line illustrates the mapping for the non-uniform quantization process, whereas the solid line illustrates the mapping for the uniform quantization process. For the uniform quantization process, the quantization step size (denoted by $\Delta_1$) is identical for the entire range of input charge quantity. In contrast, for the non-uniform quantization process, the quantization step sizes are different depending on the input charge quantity. For example, the quantization step size for a low input charge quantity (denoted by $\Delta_S$) is smaller than the quantization step size for a large input charge quantity (denoted by $\Delta_L$). Moreover, for the same low input charge quantity, the quantization step size for the non-uniform quantization process ($\Delta_S$) can be made smaller than the quantization step size for the uniform quantization process ($\Delta_1$).

One advantage of employing a non-uniform quantization scheme is that the quantization steps for quantizing low input charge quantities can be reduced, which in turn reduces the quantization errors for quantizing the low input charge quantities, and the minimum input charge quantities that can be differentiated by ADC 616 can be reduced. Therefore, the reduced quantization errors can push down the lower limit of the measureable light intensity of the image sensor, and the dynamic range can be increased. Moreover, although the quantization errors are increased for the high input charge quantities, the quantization errors may remain small compared with high input charge quantities. Therefore, the overall quantization errors introduced to the measurement of the charge can be reduced. On the other hand, the total number of quantization steps covering the entire range of input charge quantities may remain the same (or even reduced), and the aforementioned potential problems associated with increasing the number of quantization steps (e.g., increase in area, reduction in processing speed, etc.) can be avoided.

FIG. 11D illustrates an example of quantizing an analog voltage by pixel ADC 808 using a non-uniform quantization process. Compared with FIG. 11B (which employs a uniform quantization process), VREF increases in a non-linear fashion with each clock cycle, with a shallower slope initially and a steeper slope at a later time. The differences in the slopes are attributed to the uneven quantization step sizes. For lower counter count values (which correspond to a lower input quantity range), the quantization steps are made smaller, hence VREF increases at a slower rate. For higher counter count values (which correspond to a higher input quantity range), the quantization steps are made larger, hence VREF increases at a higher rate. The non-uniform VREF slope can be generated based on, for example, changing the frequency of counting of counter 814, changing the relationship between the VREF voltage and the count values of counter 914, etc. In some examples, the non-uniform quantization process of FIG. 11D can be employed for light intensity determination for low light intensity range 1006 and medium light intensity range 1008.

Referring back to FIG. 9, controller 920 can perform a TTS quantization operation, a quantization operation to measure a quantity of overflow charge (herein after, "FD ADC" operation), and a quantization operation to measure a quantity of residual charge (hereinafter "PD ADC" operation). Controller 920 can also skip one or more of the quantization operations. Output logic circuits 908 can select which of the quantization operations to store the count value at memory 912. Output logic circuits 908 can make the selection based on determining, based on the output of comparator 906 in each quantization operation, whether a quantity of the residual charge in the photodiode PD exceeds a saturation threshold of the photodiode (e.g., corresponding to threshold 1002 of FIG. 10), and whether a quantity of the overflow charge in charge storage device 902 exceeds a saturation threshold of the charge storage device (e.g., corresponding to threshold 1004 of FIG. 10). If output logic circuits 908 detect that the quantity of the overflow charge exceeds threshold 1004 during the TTS operation, output logic circuits 908 can store the TTS output in memory 912. If output logic circuits 908 detect that the quantity of the overflow charge does not exceed threshold 1004 but that the quantity of the residual charge exceeds threshold 1002, output logic circuits 908 can store the FD ADC output in memory 912. Lastly if output logic circuits 908 detect the quantity of the residual charge does not exceed threshold 1002, output logic circuits 908 can store the PD ADC output in memory 912. In some examples, output logic circuits 908 can include registers to store one or more states of whether saturation of charge storage device 902 is detected and whether the saturation of photodiode PD is detected, which output logic circuits 908 can use to perform the selection.

Figure 12A:
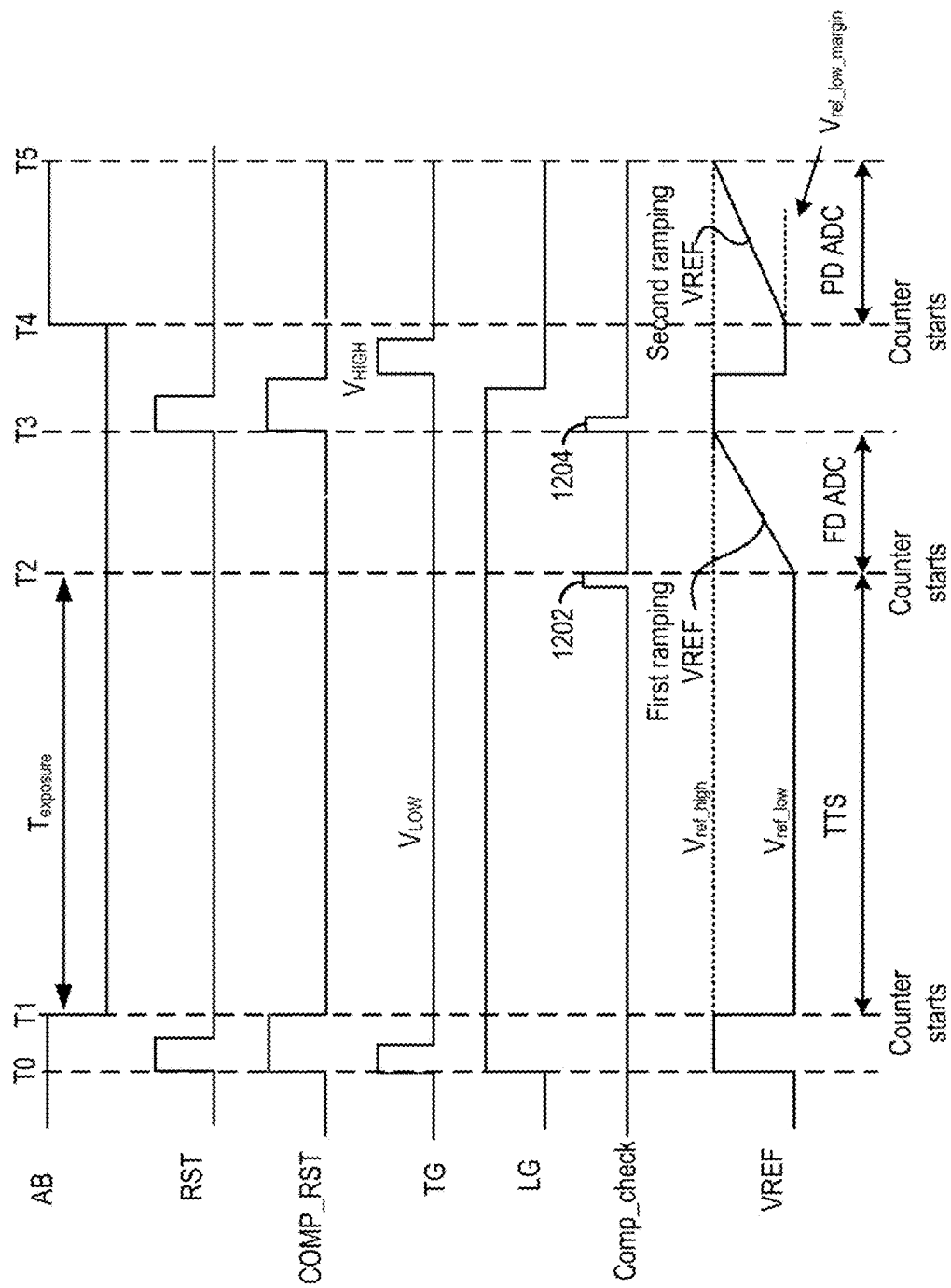
FIGS. 12A and 12B illustrate example sequences of control signals to perform light intensity measurement.
Figure 12B:
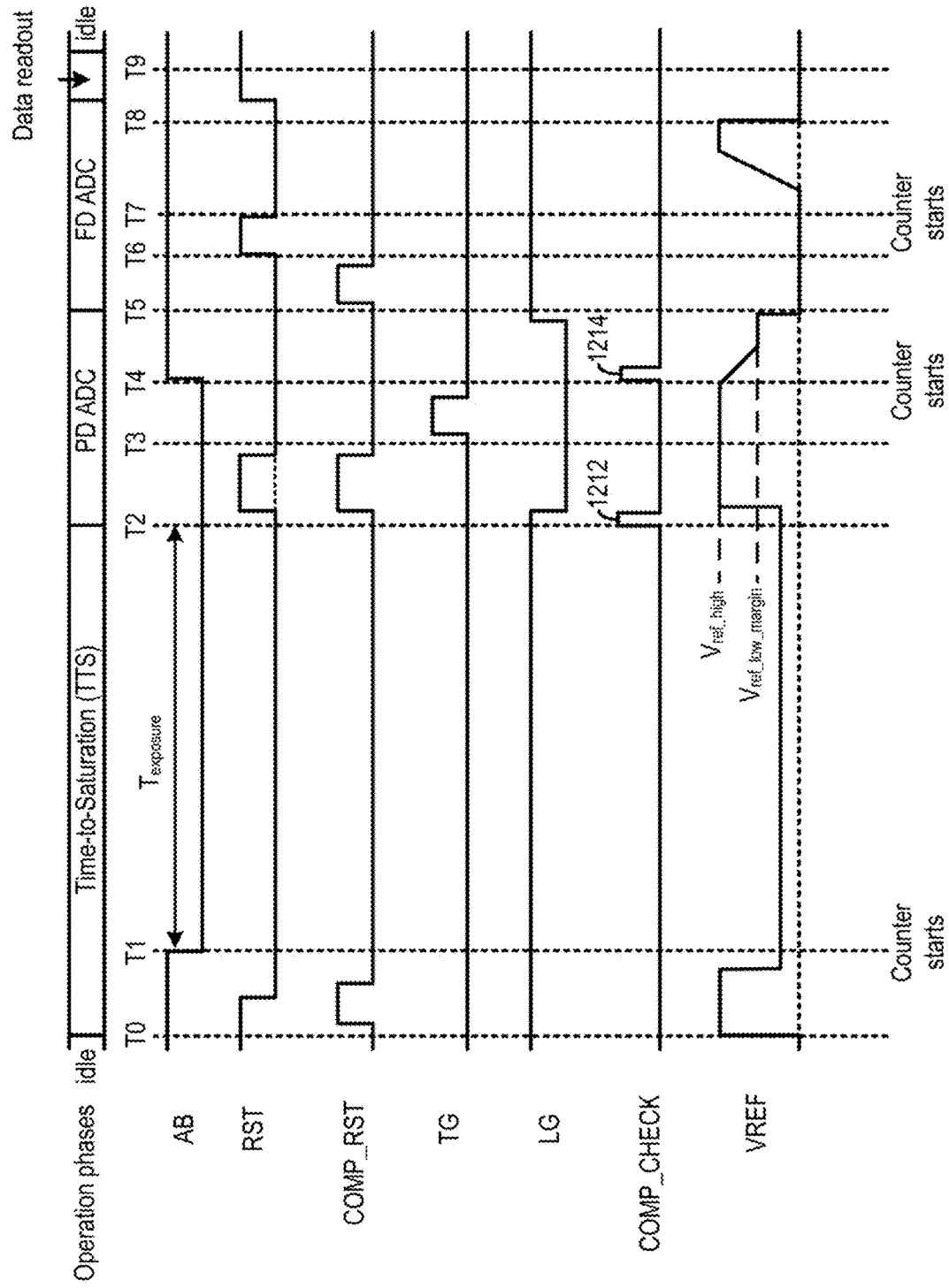

Reference is now made to FIG. 12A and FIG. 12B, which illustrate example sequences of the control signals of pixel cell 602*a* generated by controller 920. Both FIG. 12A and FIG. 12B illustrate the change of AB, RST, COMP_RST, TG, LG, and VREF with respect to time. Referring to FIG. 12A, the period between times T0 and T1 can correspond to a first reset phase, in which charge storage device 902 and comparator 906 can be put in a reset state by controller 920 by asserting the RST and COMP_RST signals, while the AB signal can be asserted to prevent charge generated by photodiode PD from reaching charge storage device 902. Both RST and LG signals are asserted to reset $C_{FD}$ and $C_{EXT}$ capacitors to set PIXEL_OUT at the reset level. With COMP_RST signal asserted and the positive terminal of comparator 906 connected to $V_{ref\_high}$, COMP_IN can be set to a sum of $V_{ref\_high}$ and comparator offset $V_{comp\_offset}$. Moreover, with RST signal asserted, PIXEL_OUT can be set the reset voltage $V_{pixel\_out\_rst}$ and can include reset noise $V\sigma_{KTC}$. A first sampling operation can be performed by the CC capacitor to store a $V_{CC}$ voltage including the components of the comparator offset, the reset noise, and PIXEL_OUT voltage at the reset level, as follows:

$$V_{cc}(T1) = (V_{ref\_high} + V_{comp\_offset}) - (V_{pixel\_out\_rst} + V\sigma_{KTC}) \quad \text{(Equation 1)}$$

At time T1, the RST signal, the AB signal, and the COMP_RST signal are released, which starts an exposure period (labelled $T_{exposure}$) in which photodiode PD can accumulate and transfer charge. Exposure period $T_{exposure}$ can end at time T2. Between times T1 and T3, TG signal can set charge transfer transistor M1 in a partially turned-on state to allow PD to accumulate residual charge before photodiode PD saturates. If the light intensity in the medium or high intensity ranges of FIG. 10, photodiode PD can saturate and transfer overflow charge via charge transfer transistor M1. LG signal can remain asserted to operate in low gain mode, in which both $C_{FD}$ capacitor and $C_{EXT}$ capacitor are connected in parallel to form charge storage device 902 to store the overflow charge. The overflow charge develops a new PIXEL_OUT voltage, $V_{pixel\_out\_sig1}$. The CC capacitor can AC couple the new PIXEL_OUT voltage $V_{pixel\_out\_sig1}$ into COMP_IN voltage by adding the $V_{CC}$ voltage, which includes the reset noise and comparator offset component. The new PIXEL_OUT voltage also includes reset noise, which can be cancelled by the reset noise component of the $V_{CC}$ voltage. The COMP_IN voltage at time Tx between times T1 and T3 can be as follows:

$$V_{comp\_in}(Tx) = V_{pixel\_out\_sig1} - V_{pixel\_out\_rst} + V_{ref\_high} + V_{comp\_offset} \quad \text{(Equation 2)}$$

In Equation 2, the difference between $V_{pixel\_out\_sig1} - V_{pixel\_out\_rst}$ represents the quantity of overflow charge stored in charge storage device 902. The comparator offset in the COMP_IN voltage can also cancel out the comparator offset introduced by comparator 906 when performing the comparison.

Between times T1 and T3, two phases of measurement of the COMP_IN voltage can be performed, including a time-to-saturation (TTS) measurement phase for high light intensity range 1010 and an FD ADC phase for measurement of overflow charge for medium light intensity 1008. Between times T1 and T2 ($T_{exposure}$) the TTS measurement can be performed by comparing COMP_IN voltage with a static $V_{ref\_low}$ representing a saturation level of charge storage device 902 by comparator 906. When PIXEL_OUT voltage reaches the static VREF, the output of comparator 906 (VOUT) can trip, and a count value from counter 914 at the time when VOUT trips can be stored into memory 912. At time T2, controller 920 can perform a check 1202 of the state of comparator 906. If the output of comparator 906 trips, controller 920 can store the state in a register of output logic circuits 908 indicating that the overflow charge in charge storage device 902 exceeds threshold 1004. The storage of the state can also prevent subsequent measurement phases (FD ADC and PD ADC) from overwriting the count value stored in memory 912. The count value from TTS can then be provided to represent the intensity of light received by the photodiode PD during the exposure period.

Between times T2 and T3, the FD ADC operation can be performed by comparing COMP_IN voltage with a ramping VREF voltage that ramps from $V_{ref\_low}$ to $V_{ref\_high}$, which represents the saturation level of photodiode PD (e.g., threshold 1002), as described in FIG. 11B. If VOUT of comparator 906 trips during FD ADC, the count value of counter 914 at the time when VOUT trips can be stored in memory 912, if the state flag in output logic circuits 908 is not asserted which indicated that charge storage device 902 does not saturate in the TTS operation. Although exposure period ends at time T2, between times T2 and T3 the photodiode PD remains capable of accumulating residual charge (if not saturated) or transferring overflow charge to charge storage device 902. At time T3, the controller can perform a check 1204 of the state of comparator 906 of the state of comparator 906. If the output of comparator 906 trips, and the state flag in output logic circuits 908 is not asserted from the TTS operation, controller 920 can assert the state flag in output logic circuits 908 to indicate that the overflow charge in charge storage device 902 exceeds threshold 1004. The assertion of the state flag can also prevent subsequent PD ADC phase from overwriting the count value stored in memory 912. The count value from FD ADC can then be provided to represent the intensity of light received by the photodiode PD during the exposure period.

Between times T3 and T4 can be the second reset phase, in which both RST and COMP_RST signals are asserted to reset charge storage device 902 (comprising the parallel combination of $C_{FD}$ capacitor and $C_{EXT}$ capacitor) and comparator 906 to prepare for the subsequent PD ADC operation. The $V_{CC}$ voltage can be set according to Equation 1.

After RST and COMP_RST are released, LG is turned off to disconnect $C_{EXT}$ from $C_{FD}$ to increase the charge-to-voltage conversion rate for the PD ADC operation. TG is set at a level to fully turn on the M1 charge transfer transistor to transfer the residual charge stored in the photodiode PD to $C_{FD}$. The residual charge develops a new PIXEL_OUT voltage, $V_{pixel\_out\_sig2}$. The CC capacitor can AC couple the new PIXEL_OUT voltage $V_{pixel\_out\_sig2}$ into COMP_IN voltage by adding the $V_{CC}$ voltage. Between times T3 and T4, the photodiode PD remains capable of generating additional charge in addition to the charge generated between times T1 to T3, and transferring the additional charge to charge storage device 902. The $V_{pixel\_out\_sig2}$ also represents the additional charge transferred between times T3 and T4. At time T4, the COMP_IN voltage can be as follows:

$$V_{comp\_in}(T4) = V_{pixel\_out\_sig2} - V_{pixel\_out\_rst} - V_{ref\_high} + V_{comp\_offset} \quad \text{(Equation 3)}$$

In Equation 3, the difference between $V_{pixel\_out\_sig2} - V_{pixel\_out\_rst}$ represents the quantity of charge transferred by the photodiode to charge storage device 902 between times T3 and T4. The comparator offset in the COMP_IN voltage can also cancel out the comparator offset introduced by comparator 906 when performing the comparison.

At time T4, the AB signal is asserted to prevent the photodiode PD from accumulating and transferring additional charge. Moreover, VREF can be set a static level $V_{ref\_low\_margin}$. Comparator 906 can compare the COMP_IN voltage with $V_{ref\_low\_margin}$ to determine whether the photodiode PD saturates. $V_{ref\_low\_margin}$ is slightly higher than $V_{ref\_low}$, which represents the saturation level of photodiode PD (e.g., threshold 1002), to prevent false tripping of comparator 906 when the quantity of residual charge is close to but does not exceed the saturation level.

Between times T4 and T5, controller 920 can perform the PD ADC operation by comparing the COMP_IN voltage with a VREF ramp that starts from $V_{ref\_low\_margin}$ to $V_{ref\_high}$. In PD ADC phase, $V_{ref\_high}$ can represent the minimum detectable quantity of residual charge stored in photodiode PD, whereas $V_{ref\_low\_margin}$ can represent the saturation threshold of photodiode PD with margin to account for dark current, as described above. If the state flag in output logic circuits 908 remains not asserted at this point, and if the output of comparator 906 trips, the count value of counter 914 when comparator 906 trips can be stored into memory 912, and the count value from PD ADC can be provided to represent the intensity of light.

Reference is now made to FIG. 12B, which illustrates another example sequence of the control signals of pixel cell 602a generated by controller 920. In FIG. 12B, PD ADC operation can be performed between the TTS and FD ADC operations, which can reduce the accumulation of additional charge in charge storage device 902 or in the photodiode PD after the TTS operation and improve shutter efficiency. As shown in FIG. 12B, between times T0 and T1 is a first reset phase as in FIG. 12A, in which both charge storage device 902 and comparator 906 can be put in a reset state by controller 920 by asserting the RST and COMP_RST signals. Moreover, LG signal is asserted, which allows $C_{FD}$ and $C_{EXT}$ capacitors to be reset by the RST signal and the PIXEL_OUT signal is set at the reset level. With COMP_RST signal asserted and the positive terminal of comparator 1102 connected to $V_{ref\_high}$, COMP_IN can be set to a sum of $V_{ref\_high}$ and comparator offset $V_{comp\_offset}$. Moreover, with RST signal asserted, PIXEL_OUT can be set the reset voltage $V_{pixel\_out\_rst}$ and can include reset noise $V\sigma_{KTC}$. A first sampling operation can be performed by the CC capacitor to store a $V_{CC}$ voltage including the components of the comparator offset, the reset noise, and PIXEL_OUT voltage at the reset level, as described in Equation 1 above:

$$V_{cc}(T1)=(V_{ref\_high}+V_{comp\_offset})-(V_{pixel\_out\_rst}+V\sigma_{KTC}) \quad \text{(Equation 1)}$$

Moreover, AB signal can be asserted to prevent charge generated by photodiode PD from reaching charge storage device 902.

At time T1, the AB, COMP_RST, and the RST signals are released, which starts the exposure period in which photodiode PD can accumulate and transfer charge. TG signal can set transfer transistor M1 in a partially turned-on state to allow PD to transfer overflow charge to charge storage device 902. LG signal can remain asserted to operate in low gain mode, in which both $C_{FD}$ capacitor and $C_{EXT}$ capacitor are connected in parallel to form charge storage device 902 to store the overflow charge. The overflow charge develops a new PIXEL_OUT voltage, $V_{pixel\_out\_sig1}$. The CC capacitor can AC couple the PIXEL_OUT voltage to become the COMP_IN voltage. The COMP_IN voltage between times T1 and T2 can be set based on Equation 1 above.

Between times T1 and T2, a time-to-saturation (TTS) measurement can be performed by comparator 906 comparing COMP_IN voltage with a static $V_{ref\_low}$ to generate VOUT. At time T2, controller 920 can perform a check 1212 of the state of comparator 906. If the output of comparator 906 trips, controller 920 can store the state in a register of output logic circuits 908 indicating that the overflow charge in charge storage device 902 exceeds threshold 1004 as in FIG. 12A.

Following the TTS measurement, between times T2 and T5, the PD ADC operation can be performed to measure the residual charge stored in the photodiode PD. The LG signal is de-asserted to disconnect $C_{EXT}$ from $C_{FD}$ to increase charge-to-voltage conversion ratio, as described above. The overflow charge (if any) is divided between $C_{FD}$ and $C_{EXT}$ based on a ratio of capacitances between $C_{FD}$ and $C_{EXT}$ such that $C_{FD}$ stores a first portion of the overflow charge and $C_{EXT}$ stores a second portion of the overflow charge. $V_{pixel\_out\_sig1}$ can correspond to the first portion of the overflow charge stored in $C_{FD}$.

To prepare for the PD ADC operation, between times T2 and T3, COMP_RST signal is asserted again to reset comparator 1102. The resetting of comparator 1102 can set a new $V_{CC}$ voltage across the CC capacitor based on a difference between $V_{pixel\_out\_sig1}$ and the output of comparator 1102 in the reset state, as follows:

$$V_{cc}(T2)=(V_{ref\_high}+V_{comp\_offset})-(V_{pixel\_out\_sig1}(T3)+V\sigma_{KTC}) \quad \text{(Equation 4)}$$

Optionally, the RST signal can be asserted between times T2 and T3 to reset $C_{FD}$ and to remove the first portion of the overflow charge, prior to the transfer of the residual charge. This allows the subsequent PD ADC operation to quantize only the residual charge rather than a mixture of the residual charge and the first portion of the overflow charge. Such arrangements can improve the accuracy of measurement of low light intensity as there is no need to remove the overflow charge component (based on the result of the subsequent FD ADC operation) from the PD ADC operation output which could otherwise introduce additional errors. On the other hand, not asserting the RST signal between times T2 and T3 can be advantageous, as such arrangements can introduce redundancy in the PD ADC and FD ADC operations and increase the signal-to-noise ratio, as both operations measure a mixture of residual and overflow charge.

Between times T3 and T4, COMP_RST signal is released so that comparator 1102 exits the reset state. Moreover, the TG signal can set transfer transistor M1 in a fully turned-on state to transfer the residual charge to $C_{FD}$. The residual charge can be transferred to $C_{FD}$, which changes the PIXEL_OUT voltage to $V_{pixel\_out\_sig2}$. The new PIXEL_OUT voltage can be AC coupled into a new COMP_IN voltage at time T4, as follows:

$$V_{comp\_in}(T4)=V_{pixel\_out\_sig2}-V_{pixel\_out\_sig1}+V_{ref\_high}+V_{comp\_offset} \quad \text{(Equation 5)}$$

In Equation 5, the difference between $V_{pixel\_out\_sig2}-V_{pixel\_out\_sig1}$ represents the quantity of residual charge transferred by the photodiode to charge storage device 902 between times T3 and T4.

After TG is fully turned-on between times T3 and T4, the TG is de-asserted to disconnect the photodiode PD from $C_{FD}$ and $C_{EXT}$. As a result, no additional charge is transferred to $C_{FD}$ and $C_{EXT}$ after time T4 until the start of next exposure period. Compared with the arrangements of FIG. 12A where additional charge can be accumulated in the photodiode PD during the FD ADC operation which typically takes a long time, in FIG. 12B the additional charge is accumulated only during the reset period T2-T3 and the transfer period T3-T4, both of which are typically much shorter than a FD ADC operation. Moreover, after T4, no additional overflow charge is accumulated at charge storage device 608a. As a result, both FD ADC and PD ADC can process charge accumulated in almost the same exposure period as the TTS operation, which can improve the shutter efficiency of the image sensor.

Between times T4 and T5, controller 920 can perform the PD ADC operation by comparing the COMP_IN voltage with a VREF ramp that starts from $V_{ref\_high}$ to $V_{ref\_low\_margin}$. In PD ADC phase, $V_{ref\_high}$ can represent the minimum detectable quantity of residual charge stored in photodiode PD, whereas $V_{ref\_low\_margin}$ can represent the saturation threshold of photodiode PD with margin to account for dark current, as described above. If the photodiode PD does not saturate, COMP_IN can go above the VREF ramp. An inverted VOUT (VOUTb) can become a logical one and cause a count value to be stored in memory 912 for PD ADC. At time T5, the controller can perform a check 1214 of the state of comparator 906 of the state of comparator 906. If the output of comparator 906 trips, and the state flag in output logic circuits 908 is not asserted from the TTS operation, controller 920 can assert the state flag in output logic circuits 908 to indicate that the residual charge exceeds threshold 1002. The assertion of the state flag can also prevent subsequent FD ADC phase from overwriting the count value stored in memory 912. The count value from PD ADC can then be provided to represent the intensity of light received by the photodiode PD during the exposure period.

Between times T5 and T8, a FD ADC operation can be made to measure the overflow charge transferred by the photodiode PD within the exposure period. As photodiode PD remains disconnected from $C_{FD}$ and $C_{EXT}$, no additional charge is transferred to $C_{FD}$ and $C_{EXT}$, and the total charge stored in $C_{FD}$ and $C_{EXT}$ is mostly generated in the exposure period $T_{exposure}$, together with additional charge generated by the photodiode between times T3 and T4.

At time T5, the LG signal is asserted to connect $C_{FD}$ with $C_{EXT}$, which allows the second portion of the overflow charge stored in $C_{EXT}$ to combine with the residual charge stored in $C_{FD}$ (and the first portion of the overflow charge if RST is not asserted between times T2 and T3), and a new PIXEL_OUT voltage $V_{pixel\_out\_sig3}$ can develop at the parallel combination of $C_{FD}$ and $C_{EXT}$ and is to be quantized.

Between times T5 and T7, a noise sampling operation can be performed to mitigate the effect of reset noise and comparator offset on the FD ADC operation. Between times T5 and T6, comparator 1102 can be reset as part of the first sampling operation. The positive terminal of comparator 1102 is connected to the lower end of VREF, $V_{ref\_low}$. The $V_{CC}$ voltage can include components of reset noise and comparator offset as described above. The $V_{CC}$ voltage can be as follows:

$$V_{cc}(T5) = (V_{ref\_low} + V_{comp\_offset}) - (V_{pixel\_out\_sig3} + V\sigma_{KTC1})$$ (Equation 6)

Between times T6 and T7, both $C_{FD}$ and $C_{EXT}$ can be reset, while comparator 1102 exits the reset state, as part of a second sampling operation. As a result of resetting, PIXEL_OUT can be reset to a reset voltage $V_{pixel\_out\_rst}$. Moreover, second reset noise charge is also introduced into charge storage device 608, which can be represented by $V\sigma_{KTC2}$. The second reset noise charge typically tracks the first reset noise charge. At time T6, as the result of the second sampling operation, $V_{pixel\_out}$ can be as follows:

$$V_{pixel\_out}(T6) = V_{pixel\_out\_rst} + V\sigma_{KTC2}$$ (Equation 7)

At time T7, COMP_RST is released, and comparator 1102 exits the reset state. Via AC-coupling, the COMP_IN voltage can track $V_{pixel\_out}(T6)$ in addition to $V_{cc}(T5)$ as follows:

$$V_{comp\_in}(T7) = (V_{ref\_low} + V_{comp\_offset}) + (V_{pixel\_out\_rst} - V_{pixel\_out\_sig3}) + (V\sigma_{KTC2} - V\sigma_{KTC1})$$ (Equation 8)

Following the second sampling operation, the COMP_IN voltage can be quantized by comparing against a VREF ramp between times T7 and T8. When VREF goes above COMP_IN, VOUT can become a logical one. If the state flag in output logic circuits 908 remains not asserted at this point, the count value of counter 914 when comparator 906 trips can be stored into memory 912, and the count value from FD ADC can be provided to represent the intensity of light. After time T8, the digital value stored in memory 912 can be read out to represent the intensity of light received by the photodiode PD within the integration, at time T9. In a case where one image frame is generated in a single frame period, the frame period can span from time T0 to T8.

Although FIG. 12A and FIG. 12B show TTS, FD ADC and PD ADC operations are performed, it is understood that ADC 616 (and pixel cell 602a) needs not perform all of these operations, and can skip some of them. As to be described below, the quantization operations may vary for different photodiodes within pixel cell 602a.

The multi-stage quantization operations described in FIG. 12A and FIG. 12B, which involve the charge sensing unit 614, ADC 616, and memory 912, can substantially extend the dynamic range of a pixel cell and improve the pixel cell's performance in measuring high light intensity and low light intensity. However, in a case where a pixel cell includes multiple photodiode, as shown in FIG. 8A-FIG. 8C, providing a charge sensing unit 614, an ADC 616, and a memory 912 for each photodiode of a pixel cell to support the multi-stage quantization operations for the each photodiode can be challenging due to size and power. Specifically, buffer 904 and $C_{EXT}$ capacitor of charge sensing unit 614, as well as comparator 906, typically have very large footprint and can dominate the size of the pixel cell. In addition, circuit components such comparator 906, buffer 904, and memory 912 also consume a lot of power. If a charge sensing unit 614, an ADC 616, and a memory 912 is provided for each photodiode of a pixel cell, both the footprint and the power consumption of the pixel cell can be substantially increased, which may render the pixel cells unsuitable for applications where space and power are at a premium, such as applications at mobile devices and wearable devices.

Figure 13A:
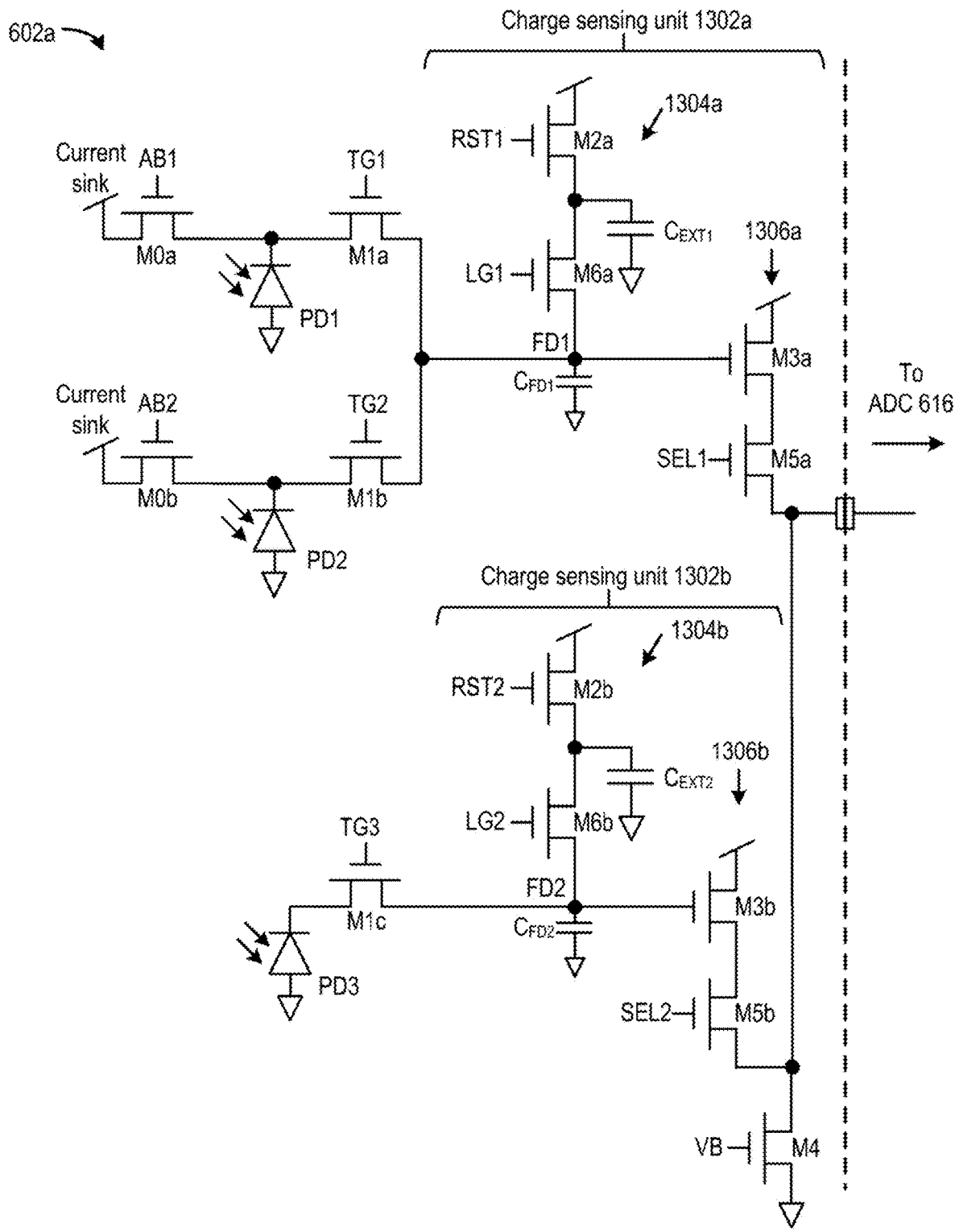

Reference is now made to FIG. 13A-FIG. 13G, which illustrate example techniques to reduce the footprint of a sensor layer (e.g., substrates 840-846 of FIG. 8A, substrate 840 of FIG. 8B) of a multi-photodiode pixel cell. FIG. 13A illustrates an example of circuit components of pixel cell 602a having a plurality of photodiodes including PD1, PD2, and PD3. Photodiodes PD1, PD2, PD3 can correspond to, photodiodes 612a, 612b, and 612c. PD1 and PD2 shares a charge sensing unit 1302a which includes a charge storage device 1304a and a switchable buffer 1306a, whereas PD3 has a charge sensing unit 1302b which includes a charge storage device 1304b and a switchable buffer 1306b. Charge storage device 1304a includes a floating drain node FD1 which includes a capacitance represented by $C_{FD1}$, as well as an external capacitor $C_{EXT1}$. FD1 and $C_{EXT1}$ can be connected in parallel by transistor M6a based on assertion of LG1 signal to expand the charge storage capacity of charge storage device 1304a, or $C_{EXT1}$ can be disconnected from FD1 to reduce the charge storage capacity. M2a can be controlled by RST1 signal to reset $C_{FD1}$ and $C_{EXT1}$. Moreover, charge storage device 1304b includes a floating drain node FD2 which includes a capacitance represented by $C_{FD2}$, as well as an external capacitor $C_{EXT2}$. FD2 and $C_{EXT2}$ can be connected in parallel by transistor M6b based on assertion of LG2 signal to expand the charge storage capacity of charge storage device 1304b, or $C_{EXT2}$ can be disconnected from FD2 to reduce the charge storage capacity. M2b can be controlled by RST2 signal to reset $C_{FD2}$ and $C_{EXT2}$.

In FIG. 13A, a charge sensing unit is shared between two photodiodes PD1 and PD2. Compared with a case where two charge sensing units (and two capacitor $C_{EXT}$) are provided to photodiodes PD1 and PD2, the reduction of the one sensing unit and the associated capacitor $C_{EXT}$ can reduce power and footprint of pixel cell 602a. Moreover, charge sensing units 1302a and 1302b can share an ADC 616 (not shown in FIG. 13A) and a current source M4, based on enabling one of selection signals SEL1 or SEL2, to generate a buffered voltage and quantize the buffered voltage. Compared with a case where three ADCs 616 are provided to perform quantization for photodiodes PD1, PD2, and PD3, power and footprint of pixel cell 602a can be reduced. The power and footprint of pixel cell 602a can be further reduced by enabling only one of switchable buffers 1306a or 1306b at a time to connect to the single ADC, and by providing a single current source M4 to provide bias current to one of the enabled switchable buffers 1306a or 1306b. The bias current can be controlled by bias signal VB.

Pixel cell 602a further includes a first charge draining transistor M0a and a first charge transfer transistor M1a, a second charge draining transistor M0b and a second charge transfer transistor M1b, and a third charge transfer transistor M1c. First charge draining transistor M0a can be coupled between photodiode PD1 and a first current sink, whereas first charge transfer transistor M1a can be coupled between photodiode PD2 and charge sensing unit 1302a. Second charge draining transistor M0b can be coupled between photodiode PD1 and a second current sink, whereas second charge transfer transistor M1b can be coupled between photodiode PD1 and charge sensing unit 1302a. First charge draining transistor M0a and first charge transfer transistor M1a can control a flow direction of first charge from photodiode PD0 based on first bias signals AB1 and TG1, whereas second charge draining transistor M0b and second charge transfer transistor M1b can control a flow direction of second charge from photodiode PD2 based on a second bias signals AB2 and TG2. Depending on an operation mode, the first charge and the second charge can be controlled to flow simultaneously to charge sensing unit 1302a for read out, or can be controlled to flow separately to the charge sensing unit for read out. First charge draining transistor M0a and second charge draining transistor M0b can also control the start of exposure time for photodiodes PD1 and PD2.

In addition, third charge transfer transistor M1c can control the flow of a third charge from photodiode PD3 to charge sensing unit 1302b. As photodiode PD3 does not share a floating drain node with other photodiodes, a charge draining transistor similar to M0a and M0b is optional for photodiode PD3. Exposure time of photodiode PD3 can also be controlled through resetting of photodiode PD3 via third transfer transistor M1c as well as transistors M6b and M2b.

Figure 13B:
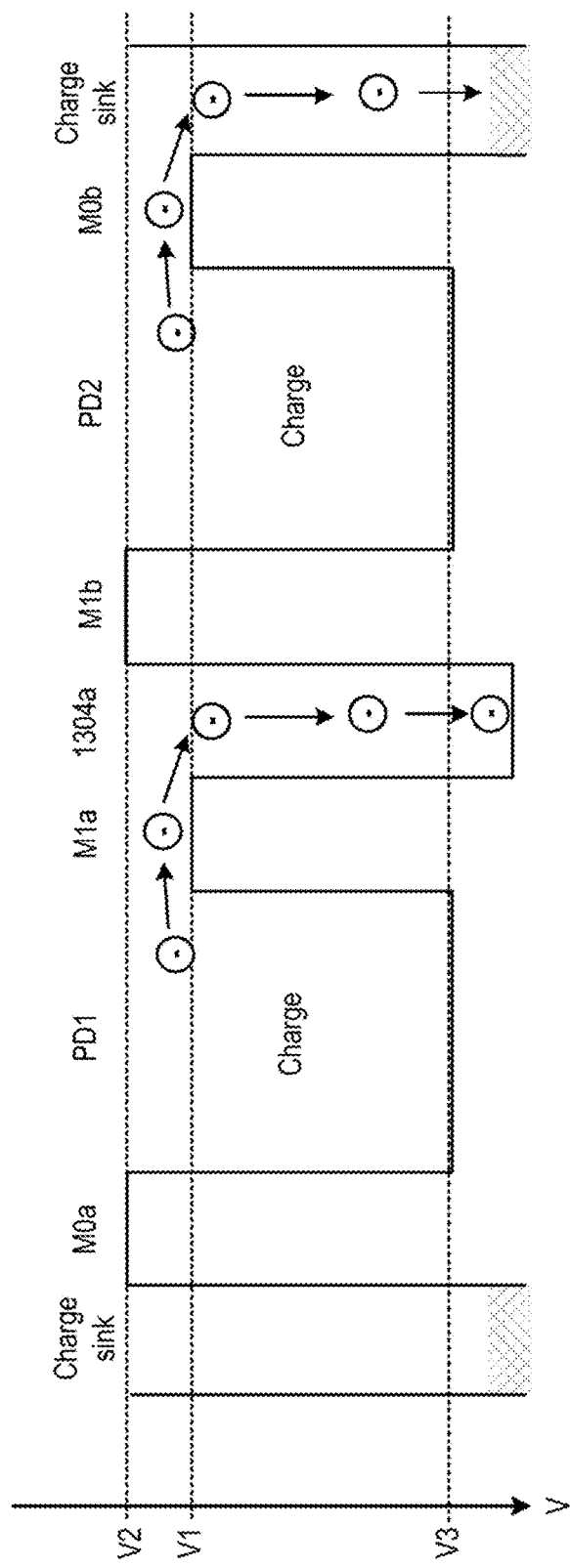

The control signals shown in FIG. 13A, including AB1, TG1, AB2, TG2, RST1, LG1, RST2, LG2, SEL2, and VB, can be provided by controller 920, and the control signals can vary based on the operation mode. Specifically, in a first operation mode, controller 920 can generate the first bias signals TG1 and AB1 and the second bias signals TG2 and AB2 to separately read out the first charge and the second charge. FIG. 13B illustrates an example of the electrical potentials of photodiodes PD1 and PD2, first and second charge draining transistors M0a and M0b, and first and second charge transfer transistors M1a and M1b in the first operation mode. As shown in FIG. 13B, in the first operation mode, TG1 signal can configure first charge transfer transistor M1a in a partially-on state and set a channel potential of charge transfer transistor M1a at V1. Photodiode PD1 can accumulate residual charge until its quantum well is saturated when the potential of photodiode PD1 reaches V1. After the potential of photodiode PD1 reaches V1, additional charge generated by photodiode PD1 can flow to charge storage device 1304a. Moreover, AB1 signal can disable first charge draining transistor M0a by setting the channel potential of first charge draining transistor M0a at V2 to block the charge from photodiode PD1 (residual charge and overflow charge) from reaching the charge sink.

Moreover, in the first operation mode, AB2 signal can configure second charge draining transistor M0b in a partially-on state by setting the channel potential of second charge draining transistor M0b at V1 (or a lower). Photodiode PD1 can accumulate residual charge until its quantum well is saturated when the potential of photodiode PD2 reaches V1. After the potential of photodiode PD2 reaches V1, additional charge generated by photodiode PD2 can flow to the charge sink via second charge draining transistor M0b. Moreover, TG2 signal can disable second charge transfer transistor M1b by setting the channel potential of second charge transfer transistor M1b at V2 (or higher) to block the charge from photodiode PD2 (residual charge and overflow charge) from reaching charge storage device 1304a, to separate the charge of photodiode PD1 from the charge of photodiode PD2.

There are various ways to create a potential difference (e.g., V1 and V2) between the channel regions of a pair of charge draining transistor and charge transfer transistor to control the direction of flow of charge between the transistors in FIG. 13B. In one example, different gate voltages can be applied to the charge draining transistor and to the charge transfer transistor to create different channel potentials at the transistors, which can result in the potential difference. For example, the gate voltage of first charge transfer transistor M1a can be slightly higher than that of first charge draining transistor M0a, whereas the gate voltage of second charge transfer transistor M1b can be slight lower than that of second charge draining transistor M0b. The different gate voltages can be supplied directly by the controller, or generated through other techniques. For example, based on physical designs, an output voltage from controller 920 can travel through different routing distances to a charge draining transistor and a charge transfer transistor. The different routing distances can introduce different IR drops to the voltage, which allows the charge draining transistor and the charge transfer transistor to receive different gate voltages.

In another example, the channel regions of the charge draining transistor and the charge transfer transistor can have different built-in potentials such that even a same gate voltage applied to the charge draining transistor and the charge transfer transistor can create different channel potentials at the transistors. There are various ways to create different built-in potentials between the transistors. For example, the two transistors can have different doping profiles to create different built-in potentials. For transistors with p type channel doping, one with higher doping will have lower built-in channel potential comparing to one with lower doping. As another example, the two transistors can have different and isolated wells, with each well being connected to a different bias voltage to set a different built-in potential. As yet another example, the two transistors can have built-in channel potentials based on a width of the channel region. A transistor having a narrower channel region can have a lower built-in channel potential compared with another transistor having a wider channel region.

In the first operation mode, controller 920 can perform different read out and quantization operations on the charge generated by photodiodes PD1, PD2, and PD3. FIG. 13C illustrates an example sequence 1350 of read out and quantization operations of pixel cell 602*a* in the first operation mode based on control signals from controller 920. Specifically, within an exposure period of PD1 between times T0 and T1 in which charge sensing unit 1302*a* is connected with ADC 616 (based on assertion of SEL1 signal), a TTS operation can be performed based on sequences of control signals in FIG. 12A and FIG. 12B. The TTS operation can be followed by a FD ADC operation between times T1 and T2 to measure a quantity of the overflow charge of photodiode PD1 and a PD ADC operation between times T2 and T3 to measure a quantity of the residual charge of photodiode PD1, where AB1 and TG1 signals can be based on the AB and TG signal of FIG. 12A. The TTS operation can also be followed by a PD ADC operation between times T1 and T2 to measure a quantity of the residual charge of photodiode PD1 and a FD ADC operation between times T2 and T3 to measure a quantity of the overflow charge of photodiode PD1, where AB1 and TG1 signals can be based on the AB and TG signals of FIG. 12B. Referring to FIG. 13B, the TG1 signal can configure first charge transfer transistor M0*a* to be in a fully-on state by setting the channel potential of first charge transfer transistor M0*a* at V3.

Referring back to FIG. 13C, between times T0 and T3, photodiode PD2 can accumulate residual charge while any overflow charge from photodiode PD2 can be drained away to the charge sink to prevent the overflow charge from reaching charge sensing unit 1302*a*. Moreover, within an exposure period between times T0 and T3 photodiode PD3 can accumulate residual charge, whereas charge sensing unit 1302*b* can also store overflow charge (if any) from photodiode PD3. The exposure period for PD3 can also start later than time T0 and/or end earlier than time T3 to reduce the risk of saturating charge sensing unit 1302*b*.

Between times T3 and T4, a PD ADC operation can be performed on the residual charge accumulated in photodiode PD2, where AB2 and TG2 signals can be based on the AB and TG signals of PD ADC operation of FIG. 12A and FIG. 12B. For example, the TG2 signal can configure second charge transfer transistor M0*b* to be in a fully-on state by setting the channel potential of second charge transfer transistor M0*b* at V3. Moreover, PD3 may continue to accumulate residual charge, whereas charge sensing unit 1302*b* can also continue to store overflow charge from photodiode PD3, between times T3 and T4.

Between times T4 and T5, charge sensing unit 1302*a* can be disconnected from ADC 616 (based on de-assertion of SEL1), whereas charge sensing unit 1302*b* can be connected to ADC 616 (based on assertion of SEL2). With charge sensing unit 1302*b* connected to ADC 616, a FD ADC operation followed by a PD ADC operation can be performed for photodiode PD3, where AB3 and TG3 signals can be based on the AB and TG signals of FIG. 12A. A PD ADC operation followed by a FD ADC operation can also be performed for photodiode PD3, where AB3 and TG3 signals can be based on the AB and TG signals of FIG. 12B.

Meanwhile, photodiode PD1 can be reset after time T3 based on, for example, enabling first charge draining transistor M0*a* to drain away any additional charge generated by photodiode PD1. Moreover, photodiode PD2 can be reset after time T4 to drain away any additional charge generated by photodiode PD2 based on, for example, enabling second charge draining transistor M0*b*. Moreover, after time T5, photodiode PD3 can be reset to drain away any additional charge generated by photodiode PD3 based on, for example, setting TG3, LG2, and RST2 signals to fully turn on third charge transfer transistor M1*c*, as well as transistors M6*b* and M2*b* of charge sensing unit 1302*b*.

The example operation of FIG. 13C can be performed to individually measurement different frequency components having different frequency ranges and expected intensity range. For example, photodiode PD1 can be configured to sense monochrome visible light (including the entire visible light frequency range) and infra-red light (M+IR), photodiode PD2 can be configured to sense only infra-red light (IR), whereas photodiode PD3 can be configured to sense a particular color of visible light (e.g., one of red, green, or blue). It may be expected due to PD1 measuring the widest frequency range, the intensity range of light sensed by photodiode PD1 is also the largest, therefore a three-stage quantization comprising TTS, FD ADC, and PD ADC operations are provided to measure the light sensed by photodiode PD1. Moreover, it may be expected that the intensity of infra-red light sensed by photodiode PD2 is in the low intensity range (e.g., based on the setting of infra-red illuminator 622), therefore only PD ADC operation is provided to measure the infra-red sensed by photodiode PD2. Further, it may be expected that the intensity of one of red/green/blue component of light sensed by photodiode PD3 can be of no higher than the medium intensity range, therefore only FD ADC and PD ADC operations are provided to measure the light sensed by photodiode PD3. In another example, the quantum well capacity of photodiode PD2 can be expanded compared with, for example, photodiode PD1, to reduce the likelihood of photodiode PD2 being saturated by residual charge as overflow charge of photodiode PD2 will not be measured. Moreover, the storage capacity of charge sensing unit 1302*b* can also be expanded compared with charge sensing unit 1302*a*, to reduce the likelihood of charge sensing unit 1302*b* being saturated by the overflow charge of photodiode PD3 as TTS operation is not performed for photodiode PD3.

Figure 13D:
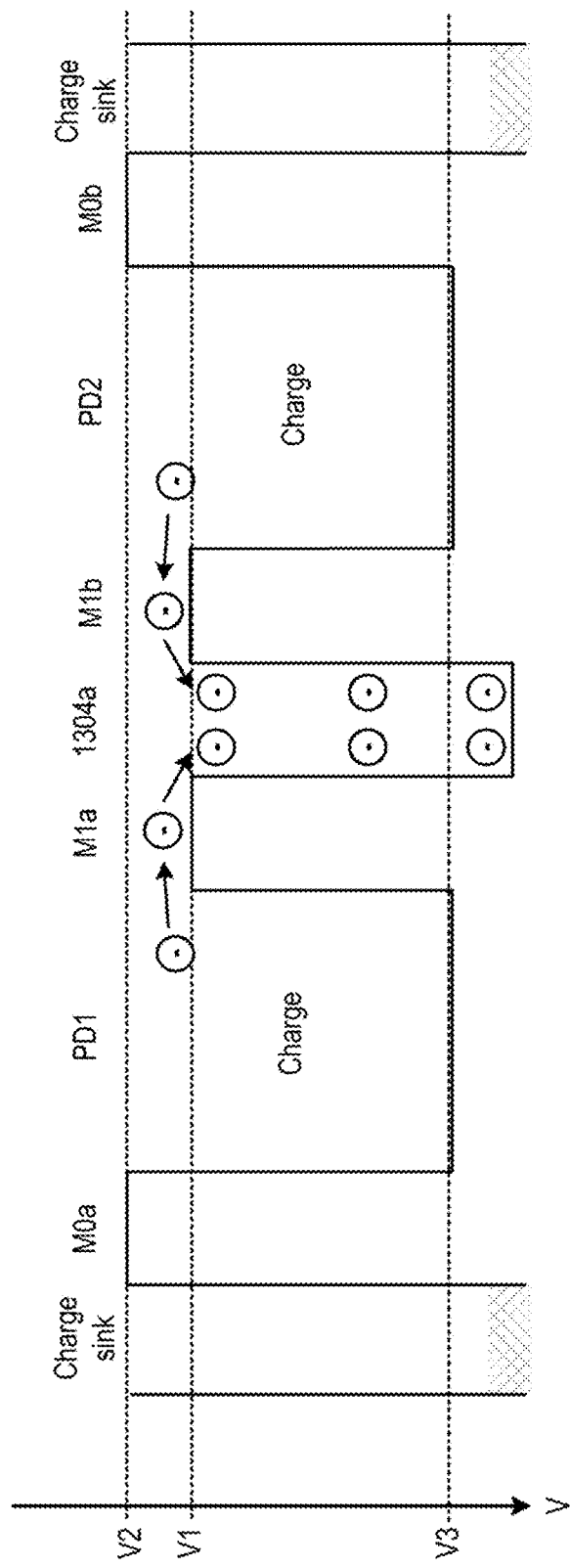

Referring back to FIG. 13A, pixel cell 602*a* can also support a second operation mode in which a first charge from photodiode PD1 and a second charge from PD2 can be controlled to flow simultaneously to charge sensing unit 1302*a* for read out. FIG. 13D illustrates an example of the electrical potentials of photodiodes PD1 and PD2, first and second charge draining transistors M0*a* and M0*b*, and first and second charge transfer transistors M1*a* and M1*b* in the second operation mode. As shown in FIG. 13D, in the second operation mode, TG1 and TG2 signals can configure, respectively, first charge transfer transistor M1*a* and second charge transfer transistor M1*b* in the partially-on state and set the channel potential of both charge transfer transistors at V1. Photodiodes PD1 and PD2 can accumulate residual charge until their quantum wells become saturated when the potential of photodiodes PD1 and PD2 reach V1. Additional charge generated by both photodiodes PD1 and PD2 can then flow to charge storage device 1304*a*. Moreover, AB1 and AB2 signals can disable both first charge draining transistor M0a and second charge draining transistor M0b by setting the channel potentials of both transistors to V2, to block the charge from both photodiodes PD1 and PD2 (residual charge and overflow charge) from reaching the charge sink.

Figure 13E:
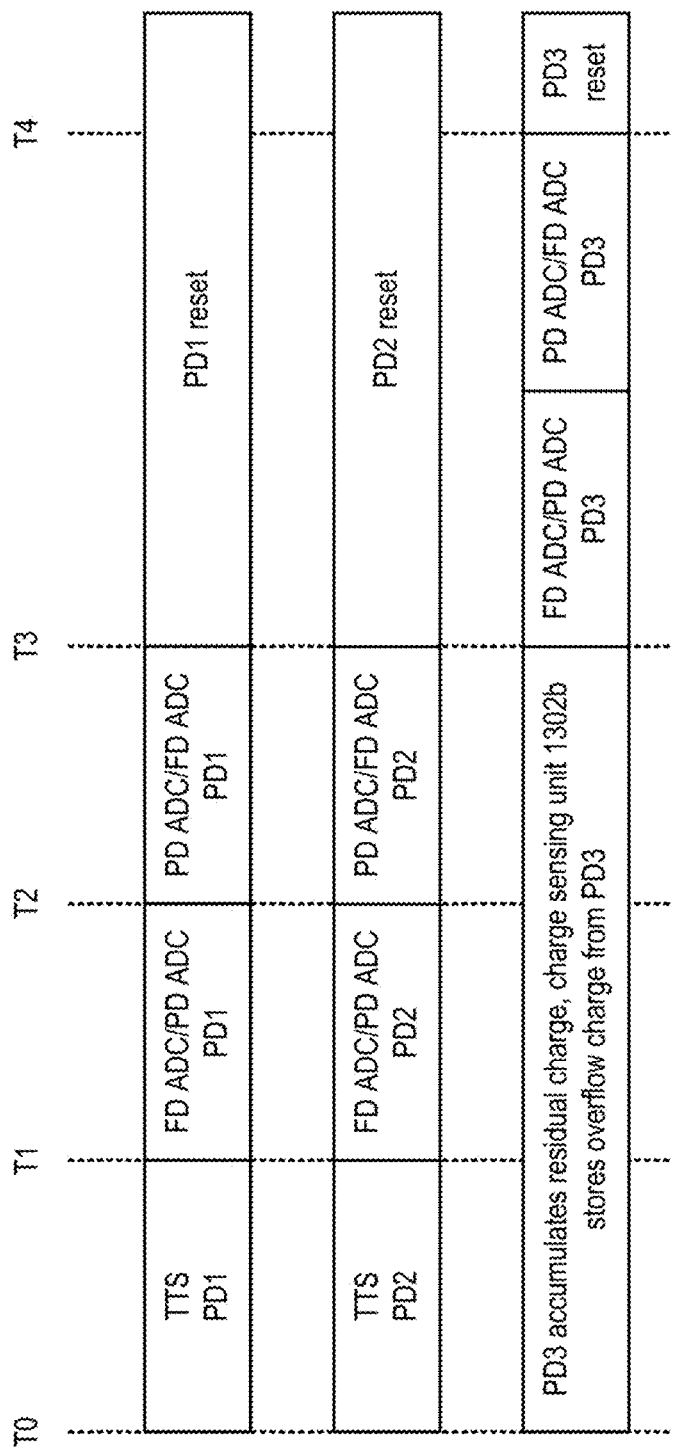

In the second operation mode, controller 920 can perform the same read out and quantization operations on the charge generated by photodiodes PD1 and PD2, as well as a separate read out and quantization operation on the charge generated by photodiode PD3. FIG. 13E illustrates an example sequence 1360 of read out and quantization operations of pixel cell 602a in the second operation mode based on control signals from controller 920. Specifically, between times T0 and T3, TTS operation, followed by FD ADC operation (as in FIG. 12A) or PD ADC operation (as in FIG. 12B), and then followed by PD ADC operation (as in FIG. 12A) or FD ADC operation (as in FIG. 12B), can be performed for both photodiodes PD1 and PD2. Between times T3 and T4, FD ADC and PD ADC operations can be performed for photodiode PD3, while both photodiodes PD1 and PD2 can be reset. Photodiode PD3 can be reset after time T4 as well.

In some examples, the second operation mode can provide a charge binning operation in which charge generated by photodiodes PD1 and PD2 are combined. In a case where photodiode PD1 senses monochrome and infra-red (IR) light and second photodiode PD2 senses only infra-red (IR) light, the second operation mode can support an IR-assisted stereo camera system. In an IR-assisted stereo camera system, active IR light is projected from a projector to add texture on a surface being imaged. The pixel cells of multiple cameras can be operated, under the second operation mode and via charge binning, as wide passband pixel cells to generate charge representing combined intensities of monochrome and IR light to generate M+IR (monochrome+infra-red) stereo images. The M+IR stereo images can then be processed to extract depth. Compared with a case monochrome stereo images are used to extract depth, IR-assisted stereo camera can improve the quality of depth extraction especially for surfaces having little or no texture. In some examples, as part of the IR-assisted stereo camera system, the pixel cells of the multiple cameras can also be operated under the first operation mode to individually read out monochrome and IR measurements. The monochrome and IR measurements can be combined off-chip with tunable weights. Such arrangements can be advantageous as the weights can be adjusted to ensure that the IR charge is not overwhelmed by the monochrome light charge, or vice versa. This allows the IR projector power to be reduced.

Besides the first operation mode and the second operation mode, controller 920 can also control the light sensing and quantization operations in pixel cell 602a based on other schemes. For example, controller 920 can disable one or more of photodiodes PD1, PD2, and PD3. The disabling can be based on putting the photodiode in a reset state (e.g., by fully turning on the associated charge draining transistor and turning off the associated charge transfer transistor, and/or disconnecting the associated switchable buffer from ADC 616.

Figure 13F:
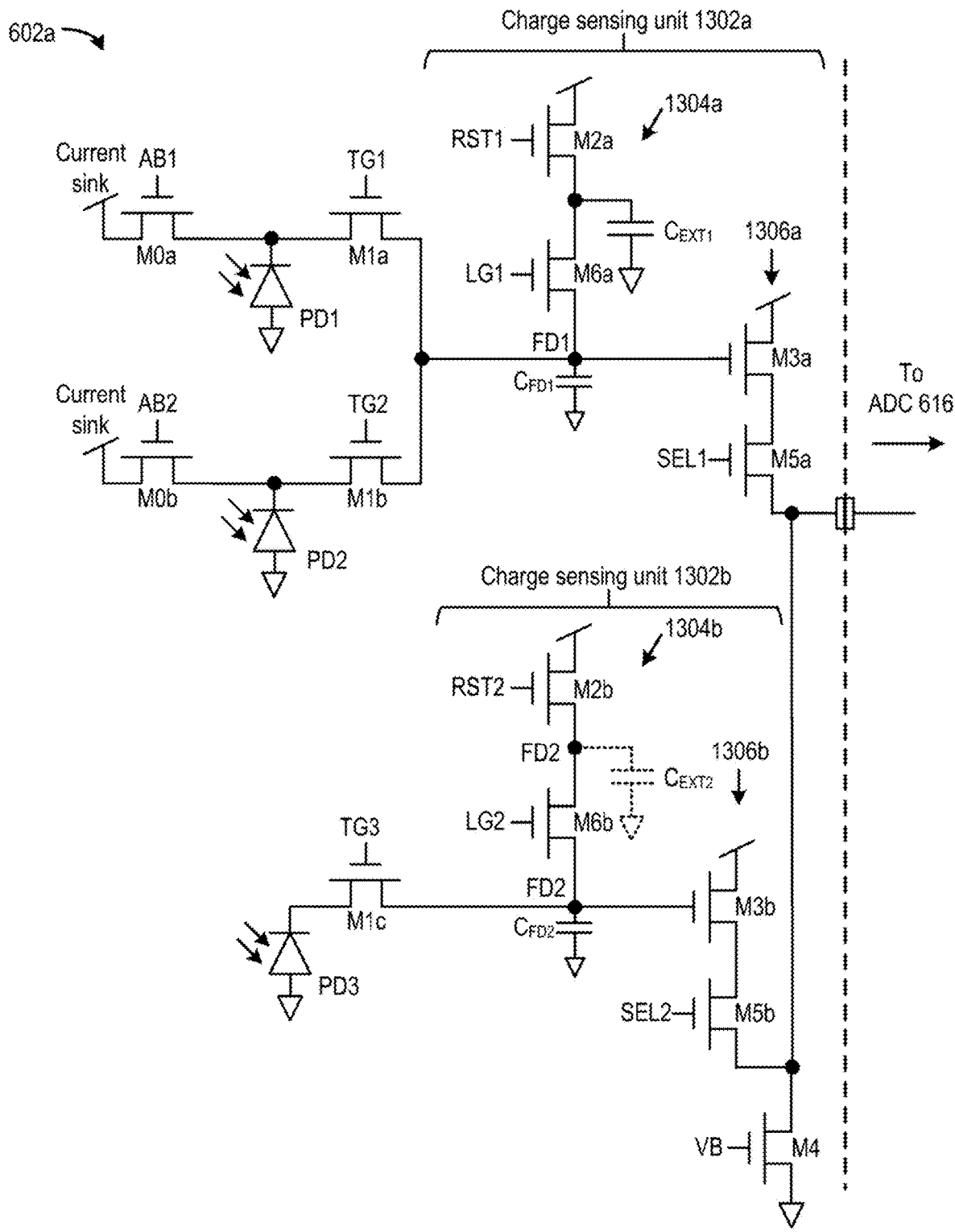

In addition to the arrangements of FIG. 13A, other techniques are proposed to further reduce the footprint of the sensor layer. FIG. 13F illustrates a modified version of pixel cell 602a of FIG. 13A. As shown in FIG. 13F, external capacitor $C_{EXT1}$ and/or external capacitor $C_{EXT2}$ can be reduced or even eliminated. In FIG. 13F, external capacitor $C_{EXT2}$ (represented in dotted line) of charge sensing unit 1302b can be implemented based on the parasitic capacitance of a second floating drain node FD2. Such arrangements can be provided in pixel cell 602a when, for example, the component of light to be sensed by photodiode PD3 is of a relatively low intensity, the exposure period of photodiode PD3 is reduced, etc., such that the reduced capacity of charge sensing unit 1302b is sufficient to store the charge (residual charge and overflow charge) generated by photodiode PD3. In addition, the external capacitor $C_{EXT1}$ (as well as external capacitor $C_{EXT2}$) can be implemented using charge storage devices that can reduce the footprint of the sensor layer. For example, the external capacitors can be implemented using metal-to-metal capacitors, such as metal-insulator-metal (MIM) capacitors, metal-oxide-metal (MOM) capacitors, etc. In contrast with capacitors that are formed on or within the substrate and contribute substantially to the footprint of the sensor layer, such as polysilicon capacitors, metal oxide semiconductor (MOS) capacitors, etc., metal-to-metal capacitors can be stacked on top of the semiconductor substrate, while the capacitance of a metal-to-metal capacitor can be increased by increasing the number of metal layers in the stack. The density of MIM capacitors and the resulting capacitance are typically higher than those of MOM capacitors. All these can reduce the footprint of the pixel cell. In addition, MOS and polysilicon capacitors can introduce non-linearity and increased storage sensitivity with respect to photodiode sensitivity, which in turn can increase the parasitic light sensitivity (PLS) of the pixel cell. Therefore, to reduce pixel cell footprint and to improve PLS, MIM capacitors can be used to implement the external capacitors $C_{EXT1}$ and $C_{EXT2}$.

Figure 13G:
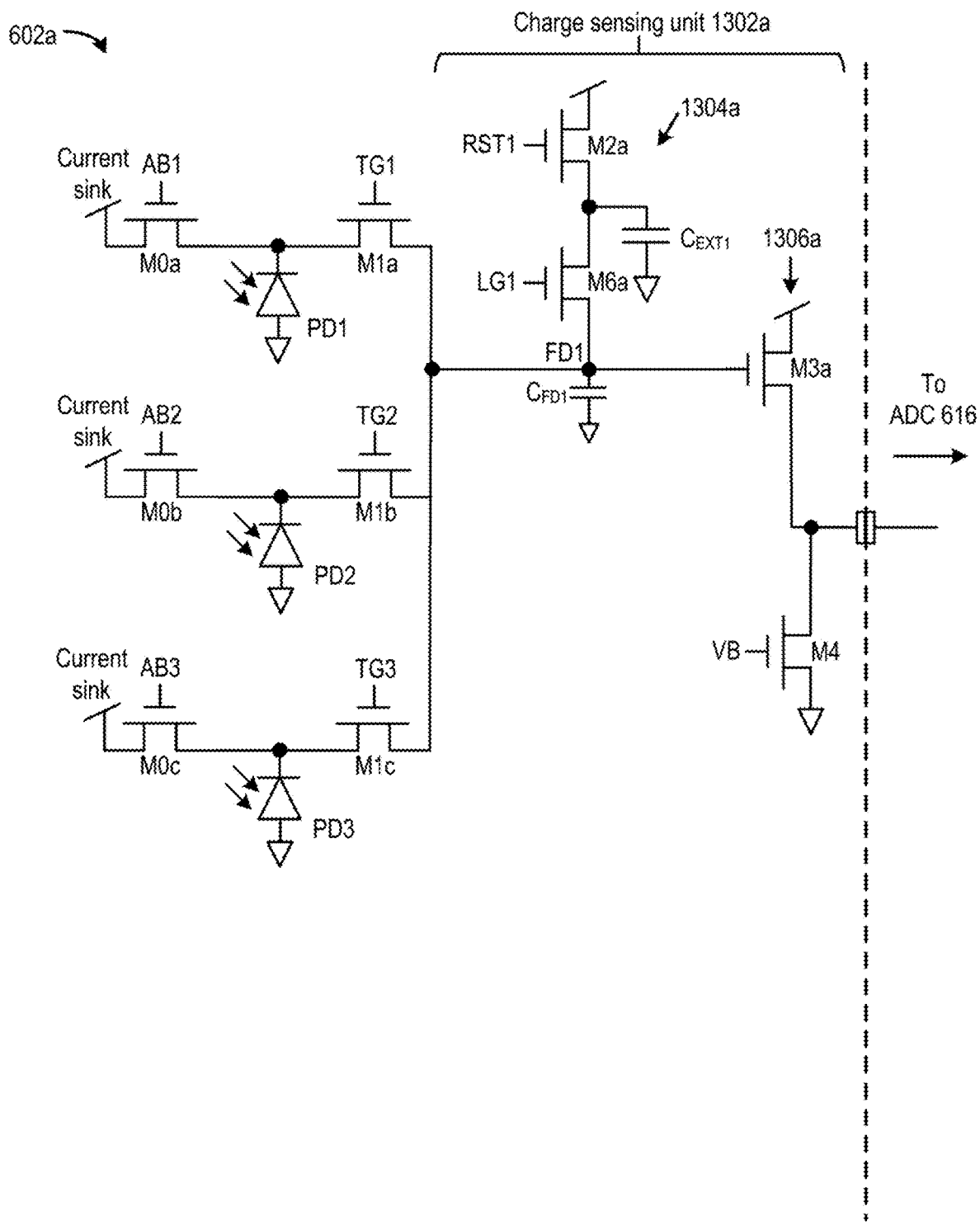

FIG. 13G illustrates another example of pixel cell 602a modified from FIG. 13A, with reduced sensor layer footprint. Compared with FIG. 13A, charge sensing unit 1302b has been removed such that photodiodes PD1, PD2, and PD3 all share charge sensing unit 1302a. In addition, charge sensing unit 1302b further includes a third charge draining transistor M0c which, together with third charge transfer transistor M1c, can be controlled to prevent overflow charge from PD3 from mixing with the charge stored in charge sensing unit 1302a when, for example, a quantization operation is performed for photodiode PD1 or PD2. In FIG. 13G, in a case where the charge for each photodiode is to be read out separately, TTS, FD ADC, and PD ADC operations can be performed for one of the photodiodes (e.g., photodiode PD1) when that photodiode is connected to charge sensing unit 1302a during the exposure period, while the charge generated by the other photodiodes that are not connected to charge sensing unit 1302a during the exposure period can be quantized using PD ADC operation.

Figure 14A:
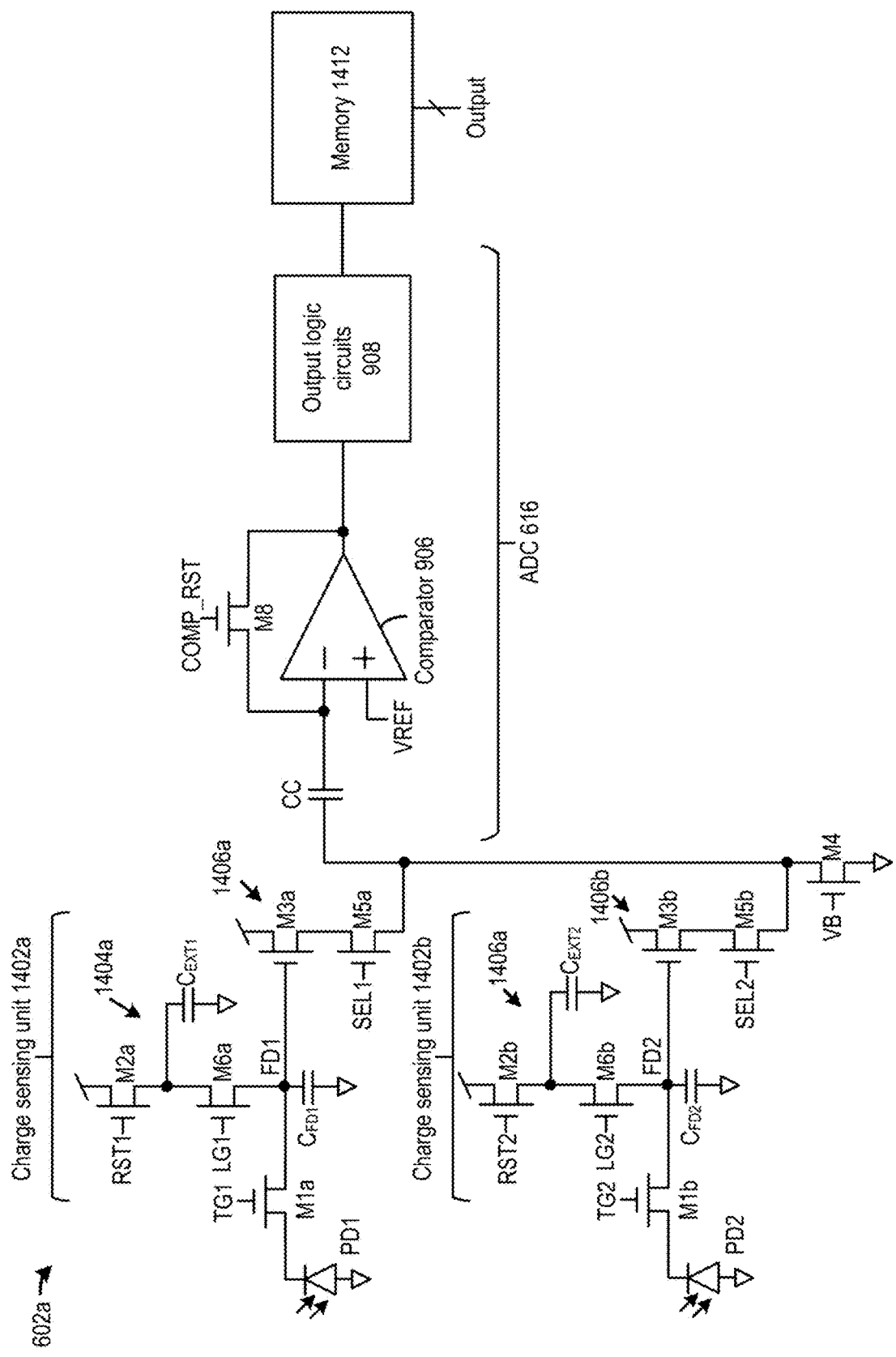
FIGS. 14A, 14B, 14C, and 14D illustrate examples of a pixel cell and their operations.

Reference is now made to FIG. 14A-FIG. 14D, which illustrate example techniques to reduce the footprint of an ASIC layer (e.g., substrate 848 of FIG. 8A and FIG. 8B) of a multi-photodiode pixel cell. As shown in FIG. 14A, pixel cell 602a may include a charge sensing unit 1402a and a charge sensing unit 1402b coupled with a single ADC 616 and a single memory 1412. Charge sensing unit 1402a is coupled with a photodiode PD1 via charge transfer transistor M1a, whereas charge sensing unit 1402b is coupled with a photodiode PD2 via charge transfer transistor M1b. Although FIG. 14A illustrates that each charge sensing unit is coupled with a photodiode, it is understood that a charge sensing unit can also be shared among a plurality of photodiodes, and pixel cell 602a may include pairs of charge draining transistors and charge transfer transistors to control the flow of charge into the shared charge sensing unit as shown in FIG. 13A.

Charge sensing unit 1402a includes a charge storage device 1404a and a switchable buffer 1406a, whereas charge sensing unit 1402b includes a charge storage device 1404b and a switchable buffer 1406b. Charge storage device 1404a includes a floating drain node FD1 which includes a capacitance represented by $C_{FD1}$, as well as an external capacitor $C_{EXT1}$. FD1 and $C_{EXT1}$ can be connected in parallel by transistor M6a based on assertion of LG1 signal to expand the charge storage capacity of charge storage device 1404a, or $C_{EXT1}$ can be disconnected from FD1 to reduce the charge storage capacity. M2a can be controlled by RST1 signal to reset $C_{FD1}$ and $C_{EXT1}$. Moreover, charge storage device 1404b includes a floating drain node FD2 which includes a capacitance represented by $C_{FD2}$, as well as an external capacitor $C_{EXT2}$. FD2 and $C_{EXT2}$ can be connected in parallel by transistor M6ba based on assertion of LG2 signal to expand the charge storage capacity of charge storage device 1404b, or $C_{EXT2}$ can be disconnected from FD2 to reduce the charge storage capacity. M2b can be controlled by RST2 signal to reset $C_{FD2}$ and $C_{EXT2}$.

Charge sensing units 1402a and 1402b can take turn in accessing ADC 616 to perform quantization operations and store a quantization output in memory 1412. For example, charge sensing unit 1402a can be connected to ADC 616 and current source M4 by asserting the SEL1 signal, while charge sensing unit 1402b can be disconnected from ADC 616 and M4 by de-asserting the SEL2 signal. After the quantization operations for charge sensing unit 1402 complete, charge sensing unit 1402 can be disconnected from ADC 616 and M4 by de-asserting the SEL1 signal, while charge sensing unit 1402b can be connected to ADC 616 and M4 by asserting the SEL2 signal. Although not shown in FIG. 14A, it is understood that the control signals TG1, RST1, LG1, SEL1, TG2, RST2, LG2, SEL2, VB, and COMP_RST signals are provided by controller 920.

Figure 14B:
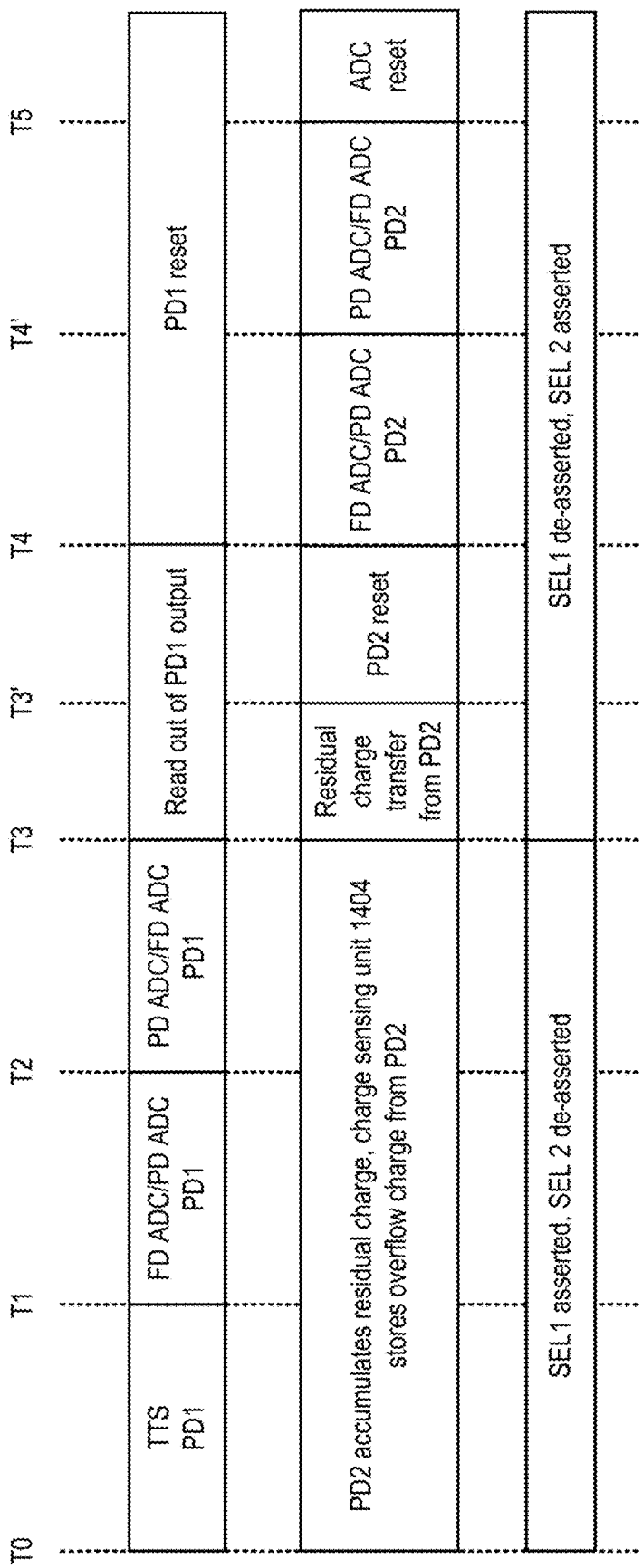

To reduce the footprint and power consumption of pixel cell 602a, memory 1412 can include a bank of memory devices to only store the quantization output for one of charge sensing units 1402a or 1402b, but not both. FIG. 14B illustrates an example sequence 1420 of read out and quantization operations of pixel cell 602a of FIG. 14A based on control signals from controller 920. Referring to FIG. 14B, within an exposure period of photodiode PD1 between times T0 and T1 in which charge sensing unit 1402a is connected with ADC 616 (based on assertion of SEL1 signal), a TTS operation can be performed, followed by FD ADC and PD ADC operations between times T1 and T3. Output logics 908 can control which quantization operation's output is to be stored in memory 1412 based on whether the charge storage device of charge sensing unit 1402 is saturated and whether the photodiode PD1 is saturated, as explained above. After time T3, charge sensing unit 1402a can be disconnected from ADC 616 (based on de-assertion of SEL1 signal), whereas charge sensing unit 1402b can be connected to ADC 616 based on assertion of SEL2 signal.

Between times T3 and T4, the output of photodiode PD1 is read out from memory 1412 before memory 1412 is overwritten by the subsequent quantization operations for photodiode PD2. The read out of memory 1412 can be by a host device and typically can take a very long time compared with the quantization operations, as the host device also performs read operations for other pixel cells of the pixel cell array. Moreover, some or all of the read operations may need to be performed in batches due to, for example, limited rate of data transfer between the pixel cells and the host device.

Meanwhile, within exposure period between times T0 and T3, photodiode PD2 can accumulate residual charge, whereas charge sensing unit 1402b can store overflow charge from photodiode PD2. As charge sensing unit 1402a (for photodiode PD1) is connected to ADC 616 between times T0 and T3, no quantization operation can be performed for photodiode PD2. In some examples, the exposure period for photodiode PD2 can start later than time T0 and/or end earlier than time T3, to reduce the likelihood of saturating charge sensing unit 1402b.

In a case where the sequence of quantization operations of FIG. 12B are performed (e.g., PD ADC first, followed by FD ADC), between times T3 and T3', the residual charge stored in photodiode PD2 can be transferred to charge sensing unit 1402. Photodiode PD2 is then reset (e.g., by turning on M1b, M6b, and M2b) between times T3' and T4 to end the exposure period. In a case where the quantization operations of FIG. 12A are performed, the accumulation of residual charge and overflow charge at photodiode PD2 and charge sensing unit 1402b may continue until time T4.

Between times T4 and T5, after the quantization output of PD1 has been read out from memory 1412, photodiode PD1 can be reset (e.g., by turning on M1a, M6a, and M2a). Moreover, two quantization operations (e.g., FD ADC and PD ADC) can be performed for photodiode PD2 between times T4 and T4' and between times T4' and T5. After the quantization output is stored in memory 1412 and the quantization operations complete, ADC 616 can be reset after time T5. If photodiode PD2 is not reset between times T3' and T4, photodiode PD2 can also be reset after time T5.

The arrangements of FIG. 14B, where a memory 1412 is provided to store the quantization outputs of each photodiode at different times, can reduce the number of memory devices in a pixel cell, which in turn can reduce the power and footprint of pixel cell 602a. However, the substantial wait time for read out of photodiode PD1 output from memory 1412 between times T3 and T4, prior to the quantization operations of photodiode PD2 output, can introduce various errors to the quantization operations of photodiode PD2 output due to charge leakage and dark current. Specifically, at the end of T3 when the quantization operations of photodiode PD1 complete, comparator 906 can be reset to store the noise information (reset noise, comparator offset, etc.) as charge in the CC capacitor. The noise information can be used to compensate for the reset noise and/or comparator offset as described above in FIG. 12A and FIG. 12B and Equations 1-8. But the charge in the CC capacitor may leak during the wait time between times T3 and T4, and the noise information stored in the CC capacitor may no longer accurately represent the reset noise and comparator offset at time T4 when the quantization operations for photodiode PD2 start. Moreover, between times T3 and T4 at least a part of the overflow charge of photodiode PD2 in charge sensing unit 1402b remains in floating node FD2 (and $C_{FD2}$) and can be contaminated by substantial dark charge due to the accumulation of dark current at FD2 between times T3 and T4. The leakage and dark charge can degrade the accuracy of the quantization operations of photodiode PD2 and reduce the dynamic range of pixel cell 602a in measuring the intensity of the light sensed by photodiode PD2.

Figure 14C:
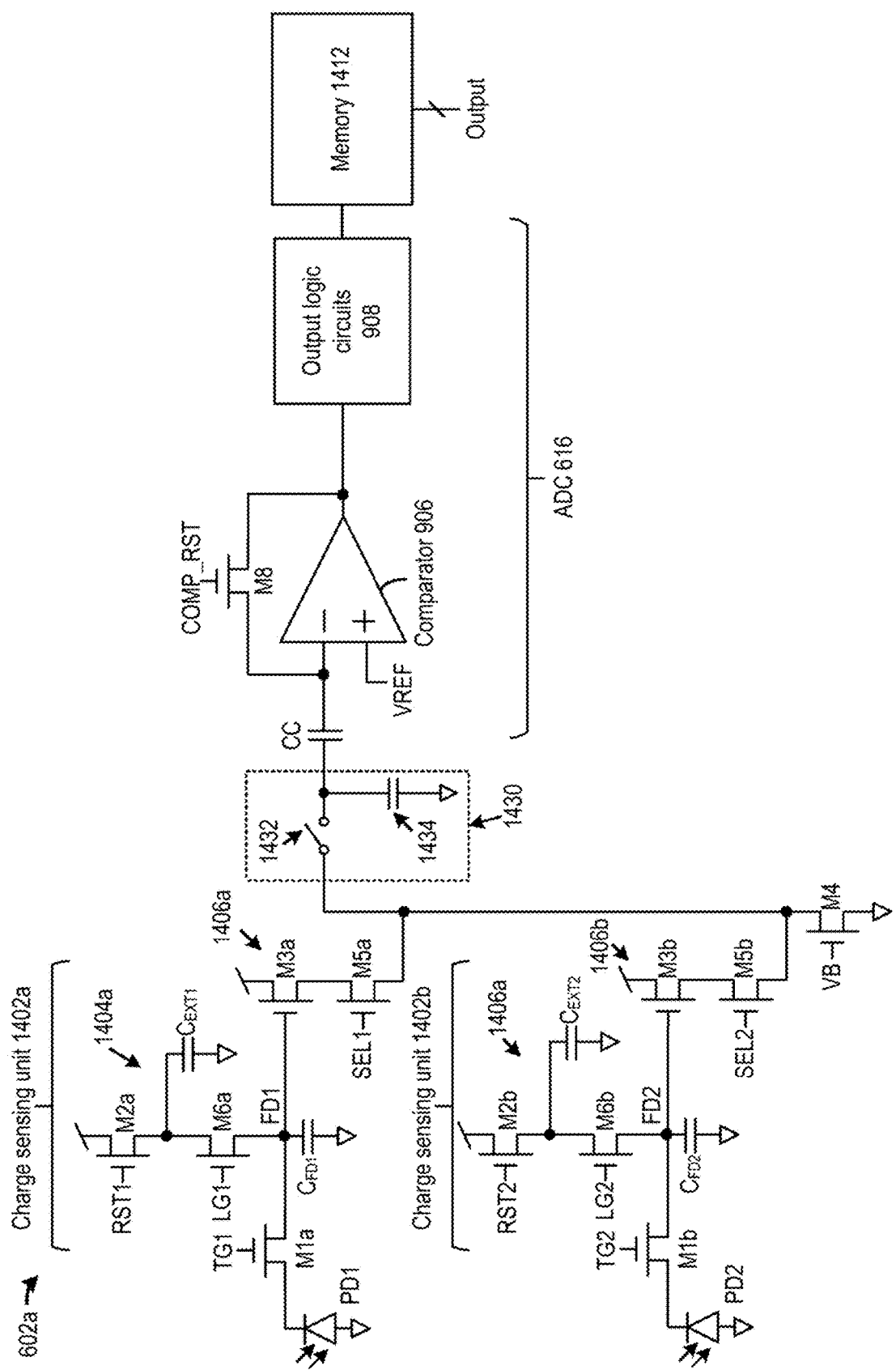

FIG. 14C illustrates example additional components of pixel cell 602a which can reduce the errors introduced to quantization operations for photodiode PD2 due to the wait time for read out of photodiode PD1 output from memory 1412. As shown in FIG. 14C, pixel cell 602a may include a sample-and-hold (S/H) circuit 1430 coupled between each of charge sensing units 1402a and 1402b and ADC 616. S/H circuit 1430 includes a sampling switch 1432 (which can be implemented with a transistor), a sampling capacitor 1434, and a reset switch (not shown). S/H circuit 1430 can sample and hold the output of each charge sensing unit, and provide the sampled output to ADC 616 for quantization. To reduce the effect of leakage and dark charge, the sampling of output of charge sensing unit 1402b can be performed prior to the memory read out period between times T3 and T4. Sampling capacitor 1434 can hold the sampled output of charge sensing unit 1402b between times T3 and T4 and during the subsequent quantization operations. Sampling capacitor 1434 can include, for example, a MOS capacitor, a metal-to-metal capacitor, etc. The capacitance of sampling capacitor 1434 can be configured such that the change in the sampled output due to leakage within the memory read out period (times T3 to T4) is within a predetermined threshold. Moreover, as sampling capacitor 1434 is typically not implemented with a floating drain node, sampling capacitor 1434 receives much less dark current, and the quantity of dark charge accumulated in sampling capacitor 1434 within the memory read out period can be substantially reduced compared with a floating drain node (e.g., FD2 and $C_{FD2}$). All these can reduce the errors introduced to the quantization operations of photodiode PD2 and improve the dynamic range of pixel cell 602a.

Figure 14D:
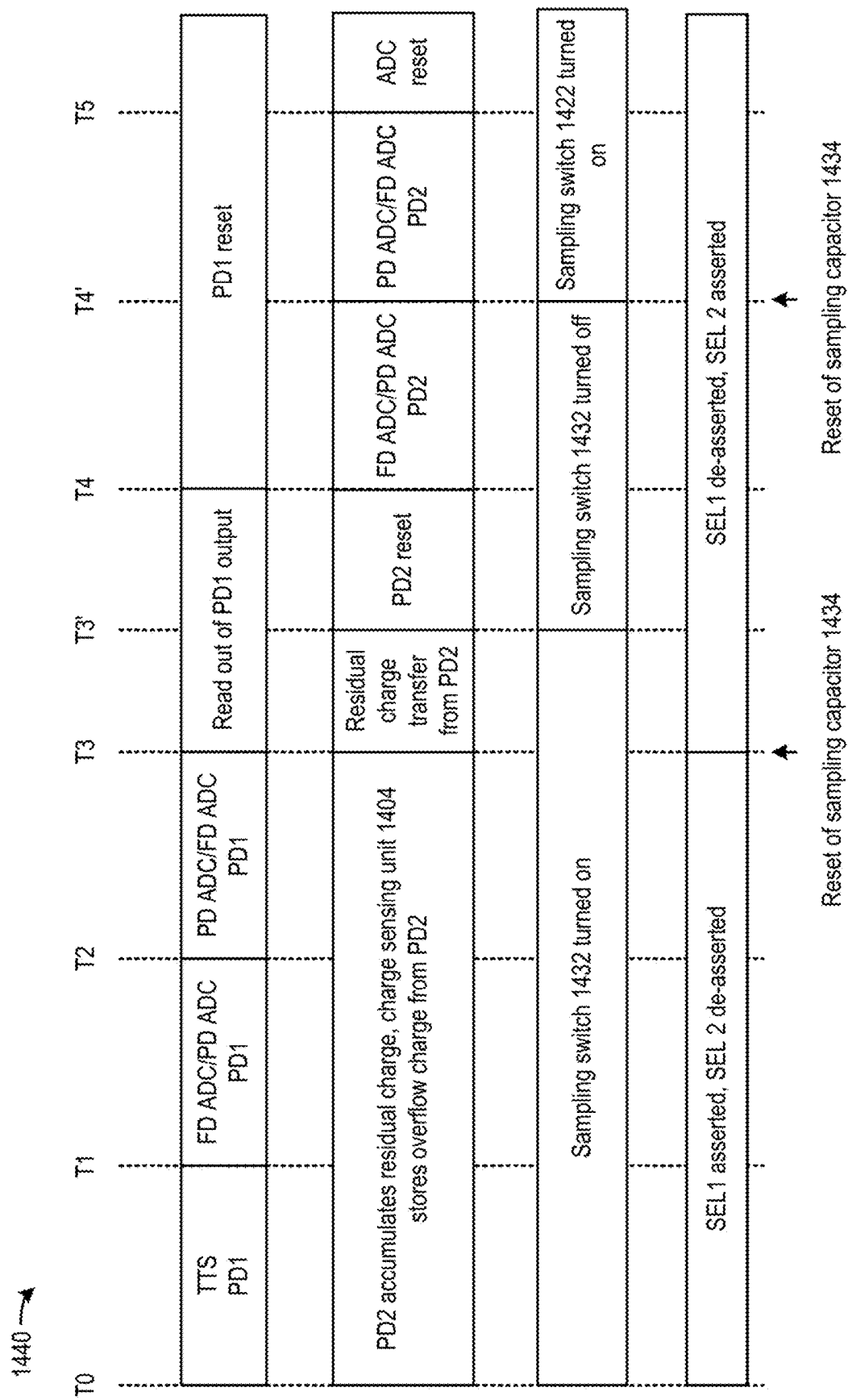

FIG. 14D illustrates an example sequence 1440 of read out and quantization operations of pixel cell 602a of FIG. 14C based on control signals from controller 920. Referring to FIG. 14D, between times T0 and T3 sampling switch 1432 can be turned on. Moreover, SEL1 signal is also asserted to connect charge sensing unit 1402a to sampling capacitor 1434, whereas SEL2 signal is de-asserted to disconnect charge sensing unit 1402b from sampling capacitor 1434. As a result, sampling capacitor 1434 can track the output of charge sensing unit 1402a. TTS, FD ADC, and PD ADC operations can then be performed on the output of sampling capacitor 1434 to generate quantization outputs for photodiode PD1 between times T0 and T3, as in FIG. 14B. Meanwhile, within exposure period between times T0 and T3, photodiode PD2 can accumulate residual charge, whereas charge sensing unit 1402b can store overflow charge from photodiode PD2.

At time T3, sampling capacitor 1434 an be reset. Moreover, starting from time T3, SEL1 signal can be de-asserted while SEL2 signal can be asserted to connect charge sensing unit 1402b to sampling capacitor 1434. Between times T3 and T3', sampling switch 1432 remains turned on. In a case where the quantization operations of FIG. 12A are performed, sampling capacitor 1434 can sample, between times T3 and T3', an output of charge sensing unit 1402b representing a quantity of overflow charge from photodiode PD2 stored in charge storage device 1404b. In a case where the quantization operations of FIG. 12B are performed, residual charge from photodiode PD2 can be transferred to $C_{FD2}$ of charge storage device 1402b. Sampling capacitor 1434 can sample, between times T3 and T3', an output of charge sensing unit 1402b representing a quantity of the residual charge from photodiode PD2. The output may also include part of the overflow charge from photodiode PD2, if $C_{FD2}$ is not reset prior to the residual charge transfer as described above.

Starting from time T3', sampling switch 1432 can be turned off, which allows sampling capacitor 1434 to hold the output of charge sensing unit 1402b sampled between times T3 and T3'. As sampling switch 1432 is turned off, sampling capacitor 1434 is disconnected from floating drain FD2 and no longer tracks the output of charge sensing unit 1402b. As a result, even if the floating drain node FD2 receives a lot of dark charge after times T3', those dark charge do not affect the sampled output at sampling capacitor 1434. Photodiode PD2 can then reset between times T3' and T4. Meanwhile, between times T3 and T4, the output of photodiode PD1 is read out from memory 1412 so that memory 1412 can be overwritten by the subsequent quantization operations for photodiode PD2.

Between times T4 and T5, after the quantization output of PD1 has been read out from memory 1412, photodiode PD1 can be reset (e.g., by turning on M1a, M6a, and M2a). Moreover, two quantization operations (e.g., FD ADC and PD ADC) can be performed for photodiode PD2 between times T4 and T4' and between times T4' and T5.

In a case where the quantization operations of FIG. 12A are performed where a FD ADC operation is performed followed by a PD ADC operation, between times T4 and T4' a FD ADC operation can first be performed on the sampled output of sampling capacitor 1434 which represents the quantity of overflow charge. At time T4', sampling capacitor 1434 can be reset to remove the sampled output. Sampling switch 1432 can then be turned on again. Between times T4' and T5, charge sensing unit 1402b can be reset again to remove the dark charge accumulated at floating drain node FD2, and then residual charge can be transferred from photodiode PD2 to $C_{FD2}$ for read out. Sampling capacitor 1434 can track the output of charge sensing unit 1402b which represents a quantity of the residual charge. A PD ADC operation can then be performed on the output of charge sensing unit 1402b. Output logics circuit 908 can store the output of one of the FD ADC or PD ADC operations in memory 1412.

In a case where the quantization operations of FIG. 12B are performed where a PD ADC operation is performed followed by a FD ADC operation, between times T4 and T4' a FD ADC operation can first be performed on the sampled output of sampling capacitor 1434 which represents the quantity of residual charge. At time T4', sampling capacitor 1434 can be reset to remove the sampled output. Sampling switch 1432 can then be turned on again. Between times T4' and T5, charge sensing unit 1402b can be reset again to remove the dark charge accumulated at floating drain node FD2, and then a part of overflow charge stored in $C_{EXT2}$ can be redistributed between $C_{EXT2}$ and $C_{FD2}$ for read out. Sampling capacitor 1434 can track the output of charge sensing unit 1402b which represents a quantity of the residual charge and part of the overflow charge. A FD ADC operation can then be performed on the output of charge sensing unit 1402b. Output logics circuit 908 can store the output of one of the FD ADC or PD ADC operations in memory 1412.

FIG. 15 illustrates a flowchart of a method 1500 for measuring intensities of different components of light. Method 1500 can be performed by, for example, various components of pixel cell 602a as shown in FIG. 13A-FIG. 14D. Pixel cell 602a may include, for example, a first photodiode (e.g., PD1), a second photodiode (e.g., PD2), and a charge sensing unit (e.g., charge sensing unit 1302a). Pixel cell 602a may further include a first charge draining transistor (e.g., M0a) coupled between the first photodiode and a first charge sink, a second charge draining transistor (e.g., M0b) coupled between the second photodiode and a second charge sink, a first charge transfer transistor coupled between the first photodiode and the charge sensing unit (e.g., M1a), and a second charge transfer transistor coupled between the second photodiode and the charge sensing unit (M1b). Pixel cell 602a further includes a controller (e.g., controller 920).

In step 1502, the controller determines, based on whether a first charge from the first photodiode and a second charge from the second photodiode are to flow simultaneously to the charge sensing unit within an exposure period or are to flow to the charge sensing unit at different times, first bias signals for the first charge transfer transistor and the first charge draining transistor, and second bias signals for the second charge transfer transistor and the second charge draining transistor.

Specifically, in the first operation mode, the controller can generate the first bias signals and the second bias signals to separately read out the first charge and the second charge. In the first operation mode, the first bias signals and the second bias signals can enable the first photodiode and the second photodiode to accumulate residual charge. The first and second bias signals also set potential differences of different directions between the pair of first charge draining transistor and first charge transfer transistor and the pair of second charge draining transistor and second charge transfer transistor, to ensure that overflow charge generated by the two photodiodes do not mix. For example, the first bias signals can create a first potential difference between the first charge draining transistor and the first charge transfer transistor to move a first overflow charge from the first photodiode to the charge sensing unit for storage, whereas the second bias signals can create a second potential difference between the second charge draining transistor and the second transistor to move a second overflow charge from the second photodiode to the second charge sink. An example first operation is illustrated in FIG. 13B.

In the first operation mode, the controller can perform different quantization operations on the first charge and the second charge. For example, within the exposure period for the first photodiode, the quantizer can perform a time-to-saturation (TTS) measurement operation to determine whether the first overflow charge saturates the charge sensing unit and if does, the time-of-saturation, which can be inversely proportional to the intensity of the frequency component sensed by the first photodiode. The TTS operation can be targeted at the high light intensity. After the exposure period ends for the first photodiode, the controller can perform a FD ADC measurement in which the quantizer measures a quantity of the first overflow charge stored in the charge sensing unit. The FD ADC operation can be targeted at the medium light intensity. The controller can also apply third bias signals to transfer a first residual charge from the first photodiode to the charge sensing unit, and then perform a PD ADC measurement in which the quantizer measures a quantity of the first residual charge. The PD ADC operation can be targeted at the low light intensity. The memory can store an output of one of the TTS, PD ADC, or FD ADC measurements.

During the quantization operations of the first charge, the exposure time for the second photodiode can continue in which the second photodiode continue to accumulate residual charge. If the second photodiode saturates and generates a second overflow charge, the second overflow charge can flow to the second charge sink under the second bias signals and do not mix with the first overflow charge (if any) stored in the charge sensing unit. After the measurement output of the first photodiode has been read out from the memory, the controller can supply the third bias signals to the second charge draining transistor and the second charge transfer transistor to move the second residual charge to the charge sensing unit for read out, perform the PD ADC operation on the second residual charge, and store the PD ADC output of the second residual charge at the memory.

On the other hand, in a second operation mode, the controller can generate the first bias signals and the second bias signals to combine the first charge and the second charge and to read out the combined charge. The second operation mode can provide a charge binning operation. In a case where the first photodiode senses monochrome and infra-red (IR) light, whereas the second photodiode senses only infra-red (IR) light, the second operation mode can support an IR-assisted stereo camera as described above. In the second operation mode, the first bias signals and the second bias signals can be identical to allow both the first photodiode and the second photodiode to accumulate residual charge, and to allow the overflow charge from both photodiodes to flow to the charge sensing unit for read out. Within the same exposure period, the controller can perform TTS operation on the combined overflow charge in the charge sensing unit. After the exposure period ends, the controller can perform FD ADC operation on the combined overflow charge. The controller can also supply third bias signals to both pairs of charge draining transistor and charge transfer transistor to transfer the residual charge from each photodiode to the charge sensing unit, and perform PD ADC operation on the combined residual charge.

Various ways to create a potential difference (e.g., V1 and V2) between the channel regions of a pair of charge draining transistor and charge transfer transistor to control the direction of flow of charge are proposed. In one example, different gate voltages can be applied to the charge draining transistor and to the charge transfer transistor to create different channel potentials at the transistors, which can result in the potential difference. For example, the gate voltage of first charge transfer transistor M1a can be slightly higher than that of first charge draining transistor M0a, whereas the gate voltage of second charge transfer transistor M1b can be slight lower than that of second charge draining transistor M0b. The different gate voltages can be supplied directly by the controller, or generated through other techniques. For example, based on physical designs, an output voltage from controller 920 can travel through different routing distances to a charge draining transistor and a charge transfer transistor. The different routing distances can introduce different IR drops to the voltage, which allows the charge draining transistor and the charge transfer transistor to receive different gate voltages.

In another example, the channel regions of the charge draining transistor and the charge transfer transistor can have different built-in potentials such that even a same gate voltage applied to the charge draining transistor and the charge transfer transistor can create different channel potentials at the transistors. There are various ways to create different built-in potentials between the transistors. For example, the two transistors can have different doping profiles to create different built-in potentials. As another example, the two transistors can have different and isolated wells, with each well being connected to a different bias voltage to set a different built-in potential.

In step 1504, the controller supplies the first bias signals to the first charge transfer transistor and the first charge draining transistor, and the second bias signals to the second charge transfer transistor and the second charge draining transistor, to control directions of flow of the first charge and the second charge with respect to the charge sensing unit within the exposure period, as described above.

In some examples, the charge sensing unit described above is a first charge sensing unit. Pixel cell 602a may further includes a second charge sensing unit coupled with a third photodiode, and both the charge sensing units are coupled with an ADC 616 via a sample-and-hold circuit (e.g., S/H circuit 1430 of FIG. 14C). In such a case, the controller can control S/H circuit 1430 to sample a first output of the first charge sensing unit, perform one or more quantization operations (e.g., TTS, FD ADC, and PD ADC) on the sampled first output to generate a first digital output, and store the first digital output in a memory of the pixel cell (e.g., memory 1412). After the quantization operations of the first output completes, the controller can control S/H circuit 1430 to sample a second output of the second charge sensing unit. While the first digital output is being read out from the memory, the controller can disconnect S/H circuit 1430 from the second charge sensing unit to hold the sampled second output. After the read out of the first digital output from the memory completes, the controller can perform one or more quantization operations (e.g., FD ADC and PD ADC) on the sampled second output to generate a second digital output, and store the second digital output in the memory in place of the first digital output.

Some portions of this description describe the examples of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some examples, a software module is implemented with a computer program product comprising a computer-readable medium containing computer program code, which can be executed by a computer processor for performing any or all of the steps, operations, or processes described.

Examples of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Examples of the disclosure may also relate to a product that is produced by a computing process described herein. Such a product may comprise information resulting from a computing process, where the information is stored on a non-transitory, tangible computer readable storage medium and may include any example of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the examples is intended to be illustrative, but not limiting, of the scope of the disclosure, which is set forth in the following claims.

What is claimed is:

1. An apparatus comprising:
a first photodiode;
a second photodiode;
a charge sensing unit;
a first charge draining transistor coupled between the first photodiode and a first charge sink;
a second charge draining transistor coupled between the second photodiode and a second charge sink;
a first charge transfer transistor coupled between the first photodiode and the charge sensing unit;
a second charge transfer transistor coupled between the second photodiode and the charge sensing unit; and
a controller configured to:
determine whether to operate the first photodiode, the second photodiode, and the charge sensing unit in a first mode or in a second mode, wherein in the first mode, a first charge from the first photodiode is to flow to the charge sensing unit and a second charge from the second photodiode is to flow to the second charge draining transistor within an exposure period, and wherein in the second mode the first charge from the first photodiode and the second charge from the second photodiode are to flow to the charge sensing unit simultaneously within the exposure period;
determine, based on whether to operate the first photodiode, the second photodiode, and the charge sensing unit in the first mode or in the second mode, first bias signals for the first charge transfer transistor and the first charge draining transistor and second bias signals for the second charge transfer transistor and the second charge draining transistor; and
supply the first bias signals to the first charge transfer transistor and the first charge draining transistor, and the second bias signals to the second charge transfer transistor and the second charge draining transistor, to operate the first photodiode, the second photodiode, and the charge sensing unit in the first mode or in the second mode to control directions of flow of the first charge and the second charge with respect to the charge sensing unit within the exposure period.

2. The apparatus of claim 1, wherein the first charge comprises a first overflow charge output by the first photodiode in response to light within the exposure period after the first photodiode is saturated by a first residual charge; and
wherein the second charge comprises a second overflow charge output by the second photodiode in response to light within the exposure period after the second photodiode is saturated by a second residual charge.

3. The apparatus of claim 2, wherein the first overflow charge is not to be combined with the second overflow charge;
wherein the controller is configured to, within the exposure period, supply the first bias signals to the first charge draining transistor and the first charge transfer transistor, and supply the second bias signals to the second charge draining transistor and the second charge transfer transistor, to enable the first overflow charge to flow to the charge sensing unit and to enable the second overflow charge to flow to the second charge sink.

4. The apparatus of claim 3, wherein the charge sensing unit comprises a charge storage device to convert a charge to a voltage;
wherein the apparatus further comprises a quantizer;
wherein the controller is configured to, after the exposure period:
obtain, from the charge sensing unit, a first voltage related to a quantity of the first overflow charge;
control the quantizer to quantize a magnitude of the first voltage to generate a first quantization output;
supply third bias signals to the first charge draining transistor and the first charge transfer transistor to transfer the first residual charge to the charge sensing unit;
obtain, from the charge sensing unit, a second voltage related to a quantity of the first residual charge;
control the quantizer to quantize a magnitude of the second voltage to generate a second quantization output;
supply fourth bias signals to the second charge draining transistor and the second charge transfer transistor to transfer the second residual charge to the charge sensing unit;
obtain, from the charge sensing unit, a third voltage related to a quantity of the second residual charge; and
control the quantizer to quantize a magnitude of the third voltage to generate third quantization output,
wherein one of the first quantization output or the second quantization output is selected to represent an intensity of incident light sensed by the first photodiode; and
wherein the third quantization output is output to represent an intensity of the incident light sensed by the second photodiode.

5. The apparatus of claim 4, wherein the controller is configured to control the quantizer to, within the exposure period, measure a time when the first voltage reaches a saturation threshold of the charge storage device of the charge sensing unit to generate a fourth quantization output; and
wherein one of the first quantization output, the second quantization output, or the fourth quantization output is selected to represent an intensity of the incident light sensed by the first photodiode.

6. The apparatus of claim 3, wherein the first overflow charge is to be combined with the second overflow charge;
wherein the controller is configured to, within the exposure period, supply the first bias signals to the first charge draining transistor and the first charge transfer transistor, and supply the second bias signals to the second charge draining transistor and the second charge transfer transistor, to enable both the first overflow charge and the second charge to flow to the charge sensing unit.

7. The apparatus of claim 6, wherein the charge sensing unit comprises a charge storage unit to convert a charge to a voltage;
wherein the apparatus further comprises a quantizer;
wherein the controller is configured to, after the exposure period:

obtain, from the charge sensing unit, a first voltage related to a combined quantity the first overflow charge and the second overflow charge;
control the quantizer to quantize a magnitude of the first voltage to generate a first quantization output;
supply third bias signals to the first charge draining transistor and the first charge transfer transistor, and to the second charge draining transistor and the second charge transfer transistor, to transfer the first residual charge and the second residual charge to the charge sensing unit;
obtain, from the charge sensing unit, a second voltage related to a combined quantity of the first residual charge and the second residual charge; and
control the quantizer to quantize a magnitude of the second voltage to generate a second quantization output,
wherein one of the first quantization output or the second quantization output is output to represent an intensity of incident light received by both the first photodiode and the second photodiode.

8. The apparatus of claim 7, wherein the first photodiode is configured to sense a visible component and an infra-red component of the incident light; and
wherein the second photodiode is configured to sense the infra-red component of the incident light.

9. The apparatus of claim 1, wherein the first bias signals are configured to set a first potential difference between a channel region of the first charge draining transistor and a channel region of the first charge transfer transistor to control a direction of flow of the first charge; and
wherein the second bias signals are configured to set a second potential difference between a channel region of the second charge draining transistor and a channel region of the second charge transfer transistor to control a direction of flow of the second charge.

10. The apparatus of claim 9, wherein the channel region of the first charge draining transistor includes a different doping profile from the channel region of the first charge transfer transistor to create the first potential difference; and
wherein the channel region of the second charge draining transistor includes a different doping profile from the channel region of the second charge transfer transistor to create the second potential difference.

11. The apparatus of claim 9, wherein the first bias signals include a first bias voltage for the first charge draining transistor and a second bias voltage different from the first bias voltage for the first charge transfer transistor; and
wherein the second bias signals include a third bias voltage for the second charge draining transistor and a fourth bias voltage different from the third bias voltage for the second charge transfer transistor.

12. The apparatus of claim 1, wherein the charge sensing unit is a first charge sensing unit;
wherein the apparatus further comprises:
a second charge sensing unit;
a third photodiode;
a third charge draining transistor coupled between the third photodiode and a third charge sink; and
a third charge transfer transistor coupled between the third photodiode and the second charge sensing unit;
wherein the first charge sensing unit includes one or more first charge storage devices having a first capacitance; and
wherein the second charge sensing unit includes one or more second charge storage devices having a second capacitance.

13. The apparatus of claim 12, wherein the first charge sensing unit includes a first floating drain, a capacitor, and a capacitor switch controllable to connect the first floating drain in parallel with the capacitor or to disconnect the capacitor from the first floating drain to set the first capacitance; and
wherein the second charge sensing unit includes a second floating drain having the second capacitance.

14. The apparatus of claim 1, wherein the charge sensing unit is a first charge sensing unit;
wherein the apparatus further comprises:
a second charge sensing unit;
a third photodiode;
a quantizer coupled with the first charge sensing unit and the second charge sensing unit; and
a memory;
wherein the controller is configured to:
control the quantizer to quantize an output of the first charge sensing unit to generate a first quantization output;
store the first quantization output at the memory;
after the first quantization output is read from the memory by a host device, control the quantizer to quantize an output of the second charge sensing unit to generate a second quantization output; and
store the second quantization output at the memory in place of the first quantization output.

15. The apparatus of claim 14, further comprising a sampling switch and a sampling capacitor;
wherein the controller is configured to:
enable the sampling switch to enable the sampling capacitor to track the output of the first charge sensing unit;
control the quantizer to quantize an output of the sampling capacitor to generate the first quantization output;
reset the sampling capacitor;
enable the sampling switch to enable the sampling capacitor to sample the output of the second charge sensing unit;
disable the sampling switch to enable the sample capacitor to hold the sampled output of the second charge sensing unit; and
control the quantizer to quantize the sampled output of the second charge sensing unit at the sampling capacitor to generate the second quantization output.

16. The apparatus of claim 1, wherein the first photodiode and the second photodiode form a stack along a first axis perpendicular to a light incident surface of the apparatus via which the first photodiode and the second photodiode receives the incident light.

17. The apparatus of claim 1, wherein the first photodiode and the second photodiode are arranged sideway along a second axis parallel with a light incident surface of the apparatus via which the first photodiode and the second photodiode receives the incident light;
wherein the apparatus further includes:
a first optical element over the first photodiode to set a first frequency range of the incident light to be sensed by the first photodiode; and
a second optical element over the second photodiode to set a second frequency range of the incident light to be sensed by the second photodiode.

18. A method, comprising:
determining whether to operate a first photodiode, a second photodiode, a charge sensing unit in a first mode or a second mode, wherein in the first mode, a first charge from the first photodiode is to flow to the charge sensing unit and a second charge from the second photodiode is to flow to the second charge draining transistor within an exposure period, and wherein in the second mode the first charge from the first photodiode and the second charge from the second photodiode are to flow to the charge sensing unit simultaneously within the exposure period;
determining, based on whether to operate the first photodiode, the second photodiode, and the charge sensing unit in the first mode or in the second mode, first bias signals for a first charge transfer transistor and a first charge draining transistor, and second bias signals for a second charge transfer transistor and a second charge draining transistor; and
supplying the first bias signals to the first charge transfer transistor and the first charge draining transistor, and the second bias signals to the second charge transfer transistor and the second charge draining transistor, to operate the first photodiode, the second photodiode, and the charge sensing unit in the first mode or in the second mode to control directions of flow of the first charge and the second charge with respect to the charge sensing unit within the exposure period.

19. The method of claim 18, wherein the first photodiode senses a visible component and an infra-red component of incident light;
wherein the second photodiode senses the infra-red component of the incident light; and
wherein the method comprises supplying the first bias signals to the first charge transfer transistor and the first charge draining transistor, and the second bias signals to the second charge transfer transistor and the second charge draining transistor, to enable the first charge and the second charge to flow to the charge sensing unit simultaneously within the exposure period.

20. The method of claim 18, wherein the charge sensing unit is a first charge sensing unit;
wherein the method further comprises:
controlling a quantizer to quantize an output of the first charge sensing unit to generate a first quantization output;
storing the first quantization output at a memory;
controlling a sampling capacitor to sample and hold an output of a second charge sensing unit;
after the first quantization output is read from the memory by a host device, controlling the quantizer to quantize the sampled output of the second charge sensing unit at the sampling capacitor to generate a second quantization output; and
storing the second quantization output at the memory in place of the first quantization output.

* * * * *